(12) United States Patent
Johnston et al.

(10) Patent No.: US 11,715,980 B2
(45) Date of Patent: Aug. 1, 2023

(54) CLASSIFYING AND DETECTING FOREIGN OBJECTS USING A POWER AMPLIFIER CONTROLLER INTEGRATED CIRCUIT IN WIRELESS POWER TRANSMISSION SYSTEMS

(71) Applicant: Energous Corporation, San Jose, CA (US)

(72) Inventors: Cesar Johnston, Sunnyvale, CA (US); Sean Nicolson, Irvine, CA (US); Aras Pirbadian, Mission Viejo, CA (US); Deepak Jain, San Ramon, CA (US); Howard Chan, San Jose, CA (US); Erik Heinke, San Jose, CA (US); Mehdi Khanpour, Irvine, CA (US)

(73) Assignee: Energous Corporation, San Jose, CA (US)

( * ) Notice: Subject to any disclaimer, the term of this patent is extended or adjusted under 35 U.S.C. 154(b) by 0 days.

(21) Appl. No.: 17/493,690

(22) Filed: Oct. 4, 2021

(65) Prior Publication Data

US 2022/0271572 A1  Aug. 25, 2022

Related U.S. Application Data

(63) Continuation of application No. 17/026,191, filed on Sep. 19, 2020, now Pat. No. 11,139,699.
(Continued)

(51) Int. Cl.
*H02J 50/60* (2016.01)
*G01K 7/22* (2006.01)
*H02J 50/20* (2016.01)

(52) U.S. Cl.
CPC ............... *H02J 50/60* (2016.02); *G01K 7/22* (2013.01); *H02J 50/20* (2016.02); *H02J 2310/62* (2020.01)

(58) Field of Classification Search
CPC ..................................................... H02J 50/60
See application file for complete search history.

(56) References Cited

U.S. PATENT DOCUMENTS

| 787,412 A | 4/1905 | Tesla |
| 2,811,624 A | 10/1957 | Haagensen |

(Continued)

FOREIGN PATENT DOCUMENTS

| CN | 201278367 Y | 7/2009 |
| CN | 102227884 A | 10/2011 |

(Continued)

OTHER PUBLICATIONS

Energous Corp., IPRP, PCT/US2014/040697, Dec. 8, 2015, 9 pgs.
(Continued)

*Primary Examiner* — Daniel Cavallari
(74) *Attorney, Agent, or Firm* — Morgan, Lewis & Bockius LLP

(57) ABSTRACT

A wireless power transmitting system includes a power amplifier comprising a plurality of measurement points and a power amplifier controller integrated circuit (IC). In some embodiments, the power amplifier controller IC performs synchronization of the various components of the power amplifier, conducts impedance and temperature measurements at the measurements points, determines if a foreign object is within the transmission range of the wireless power transmitter, and decides if a shutdown of the power amplifier is needed. In some embodiments, the power amplifier controller IC determines through a transmitter controller IC, the presence of a foreign object within the transmission range and adjusts the power transmission to one or more receivers.

26 Claims, 13 Drawing Sheets

Related U.S. Application Data

(60) Provisional application No. 62/903,677, filed on Sep. 20, 2019.

(56) References Cited

U.S. PATENT DOCUMENTS

| | | |
|---|---|---|
| 2,863,148 A | 12/1958 | Gammon et al. |
| 3,167,775 A | 1/1965 | Guertler |
| 3,434,678 A | 3/1969 | Brown et al. |
| 3,696,384 A | 10/1972 | Lester |
| 3,754,269 A | 8/1973 | Clavin |
| 4,101,895 A | 7/1978 | Jones, Jr. |
| 4,360,741 A | 11/1982 | Fitzsimmons et al. |
| 4,944,036 A | 7/1990 | Hyatt |
| 4,995,010 A | 2/1991 | Knight |
| 5,142,292 A | 8/1992 | Chang |
| 5,200,759 A | 4/1993 | McGinnis |
| 5,211,471 A | 5/1993 | Rohrs |
| 5,276,455 A | 1/1994 | Fitzsimmons et al. |
| 5,548,292 A | 8/1996 | Hirshfield et al. |
| 5,556,749 A | 9/1996 | Mitsuhashi et al. |
| 5,568,088 A | 10/1996 | Dent et al. |
| 5,631,572 A | 5/1997 | Sheen et al. |
| 5,646,633 A | 7/1997 | Dahlberg |
| 5,697,063 A | 12/1997 | Kishigami et al. |
| 5,712,642 A | 1/1998 | Hulderman |
| 5,936,527 A | 8/1999 | Isaacman et al. |
| 5,982,139 A | 11/1999 | Parise |
| 6,046,708 A | 4/2000 | MacDonald, Jr. et al. |
| 6,061,025 A | 5/2000 | Jackson et al. |
| 6,127,799 A | 10/2000 | Krishnan |
| 6,127,942 A | 10/2000 | Welle |
| 6,163,296 A | 12/2000 | Lier et al. |
| 6,176,433 B1 | 1/2001 | Uesaka et al. |
| 6,271,799 B1 | 8/2001 | Rief |
| 6,289,237 B1 | 9/2001 | Mickle et al. |
| 6,329,908 B1 | 12/2001 | Frecska |
| 6,400,586 B2 | 6/2002 | Raddi et al. |
| 6,421,235 B2 | 7/2002 | Ditzik |
| 6,437,685 B2 | 8/2002 | Hanaki |
| 6,456,253 B1 | 9/2002 | Rummeli et al. |
| 6,476,795 B1 | 11/2002 | Derocher et al. |
| 6,501,414 B2 | 12/2002 | Arndt et al. |
| 6,583,723 B2 | 6/2003 | Watanabe et al. |
| 6,597,897 B2 | 7/2003 | Tang |
| 6,615,074 B2 | 9/2003 | Mickle et al. |
| 6,650,376 B1 | 11/2003 | Obitsu |
| 6,664,920 B1 | 12/2003 | Mott et al. |
| 6,680,700 B2 | 1/2004 | Hilgers |
| 6,798,716 B1 | 9/2004 | Charych |
| 6,803,744 B1 | 10/2004 | Sabo |
| 6,853,197 B1 | 2/2005 | McFarland |
| 6,856,291 B2 | 2/2005 | Mickle et al. |
| 6,911,945 B2 | 6/2005 | Korva |
| 6,960,968 B2 | 11/2005 | Odendaal et al. |
| 6,967,462 B1 | 11/2005 | Landis |
| 6,988,026 B2 | 1/2006 | Breed et al. |
| 7,003,350 B2 | 2/2006 | Denker et al. |
| 7,012,572 B1 | 3/2006 | Schaffner et al. |
| 7,027,311 B2 | 4/2006 | Vanderelli et al. |
| 7,068,234 B2 | 6/2006 | Sievenpiper |
| 7,068,991 B2 | 6/2006 | Parise |
| 7,079,079 B2 | 7/2006 | Jo et al. |
| 7,183,748 B1 | 2/2007 | Unno et al. |
| 7,191,013 B1 | 3/2007 | Miranda et al. |
| 7,193,644 B2 | 3/2007 | Carter |
| 7,196,663 B2 | 3/2007 | Bolzer et al. |
| 7,205,749 B2 | 4/2007 | Hagen et al. |
| 7,215,296 B2 | 5/2007 | Abramov et al. |
| 7,222,356 B1 | 5/2007 | Yonezawa et al. |
| 7,274,334 B2 | 9/2007 | O'Riordan et al. |
| 7,274,336 B2 | 9/2007 | Carson |
| 7,351,975 B2 | 4/2008 | Brady et al. |
| 7,359,730 B2 | 4/2008 | Dennis et al. |
| 7,372,408 B2 | 5/2008 | Gaucher |
| 7,392,068 B2 | 6/2008 | Dayan |
| 7,403,803 B2 | 7/2008 | Mickle et al. |
| 7,443,057 B2 | 10/2008 | Nunally |
| 7,451,839 B2 | 11/2008 | Perlman |
| 7,463,201 B2 | 12/2008 | Chiang et al. |
| 7,471,247 B2 | 12/2008 | Saily |
| 7,535,195 B1 | 5/2009 | Horovitz et al. |
| 7,614,556 B2 | 11/2009 | Overhultz et al. |
| 7,639,994 B2 | 12/2009 | Greene et al. |
| 7,643,312 B2 | 1/2010 | Vanderelli et al. |
| 7,652,577 B1 | 1/2010 | Madhow et al. |
| 7,679,576 B2 | 3/2010 | Riedel et al. |
| 7,702,771 B2 | 4/2010 | Ewing et al. |
| 7,786,419 B2 | 8/2010 | Hyde et al. |
| 7,812,771 B2 | 10/2010 | Greene et al. |
| 7,830,312 B2 | 11/2010 | Choudhury et al. |
| 7,844,306 B2 | 11/2010 | Shearer et al. |
| 7,868,482 B2 | 1/2011 | Greene et al. |
| 7,898,105 B2 | 3/2011 | Greene et al. |
| 7,904,117 B2 | 3/2011 | Doan et al. |
| 7,911,386 B1 | 3/2011 | Ito et al. |
| 7,925,308 B2 | 4/2011 | Greene et al. |
| 7,948,208 B2 | 5/2011 | Partovi et al. |
| 8,049,676 B2 | 11/2011 | Yoon et al. |
| 8,055,003 B2 | 11/2011 | Mittleman et al. |
| 8,070,595 B2 | 12/2011 | Alderucci et al. |
| 8,072,380 B2 | 12/2011 | Crouch |
| 8,092,301 B2 | 1/2012 | Alderucci et al. |
| 8,099,140 B2 | 1/2012 | Arai |
| 8,115,448 B2 | 2/2012 | John |
| 8,159,090 B2 | 4/2012 | Greene et al. |
| 8,159,364 B2 | 4/2012 | Zeine |
| 8,180,286 B2 | 5/2012 | Yamasuge |
| 8,184,454 B2 | 5/2012 | Mao |
| 8,228,194 B2 | 7/2012 | Mickle |
| 8,234,509 B2 | 7/2012 | Gioscia et al. |
| 8,264,101 B2 | 9/2012 | Hyde et al. |
| 8,264,291 B2 | 9/2012 | Morita |
| 8,276,325 B2 | 10/2012 | Clifton et al. |
| 8,278,784 B2 | 10/2012 | Cook et al. |
| 8,284,101 B2 | 10/2012 | Fusco |
| 8,310,201 B1 | 11/2012 | Wright |
| 8,338,991 B2 | 12/2012 | Von Novak et al. |
| 8,362,745 B2 | 1/2013 | Tinaphong |
| 8,380,255 B2 | 2/2013 | Shearer et al. |
| 8,384,600 B2 | 2/2013 | Huang et al. |
| 8,410,953 B2 | 4/2013 | Zeine |
| 8,411,963 B2 | 4/2013 | Luff |
| 8,432,062 B2 | 4/2013 | Greene et al. |
| 8,432,071 B2 | 4/2013 | Huang et al. |
| 8,446,248 B2 | 5/2013 | Zeine |
| 8,447,234 B2 | 5/2013 | Cook et al. |
| 8,451,189 B1 | 5/2013 | Fluhler |
| 8,452,235 B2 | 5/2013 | Kirby et al. |
| 8,457,656 B2 | 6/2013 | Perkins et al. |
| 8,461,817 B2 | 6/2013 | Martin et al. |
| 8,467,733 B2 | 6/2013 | Leabman |
| 8,497,601 B2 | 7/2013 | Hall et al. |
| 8,497,658 B2 | 7/2013 | Von Novak et al. |
| 8,552,597 B2 | 8/2013 | Song et al. |
| 8,558,661 B2 | 10/2013 | Zeine |
| 8,560,026 B2 | 10/2013 | Chanterac |
| 8,564,485 B2 | 10/2013 | Milosavljevic et al. |
| 8,604,746 B2 | 12/2013 | Lee |
| 8,614,643 B2 | 12/2013 | Leabman |
| 8,621,245 B2 | 12/2013 | Shearer et al. |
| 8,626,249 B2 | 1/2014 | Kuusilinna et al. |
| 8,629,576 B2 | 1/2014 | Levine |
| 8,653,966 B2 | 2/2014 | Rao et al. |
| 8,655,272 B2 | 2/2014 | Saunamäki |
| 8,674,551 B2 | 3/2014 | Low et al. |
| 8,686,685 B2 | 4/2014 | Moshfeghi |
| 8,686,905 B2 | 4/2014 | Shtrom |
| 8,712,355 B2 | 4/2014 | Black et al. |
| 8,712,485 B2 | 4/2014 | Tam |
| 8,718,773 B2 | 5/2014 | Wills et al. |
| 8,729,737 B2 | 5/2014 | Schatz et al. |
| 8,736,228 B1 | 5/2014 | Freed et al. |
| 8,760,113 B2 | 6/2014 | Keating |
| 8,770,482 B2 | 7/2014 | Ackermann et al. |

(56) References Cited

U.S. PATENT DOCUMENTS

| | | |
|---|---|---|
| 8,772,960 B2 | 7/2014 | Yoshida |
| 8,823,319 B2 | 9/2014 | Von Novak, III et al. |
| 8,832,646 B1 | 9/2014 | Wendling |
| 8,854,176 B2 | 10/2014 | Zeine |
| 8,860,364 B2 | 10/2014 | Low et al. |
| 8,897,770 B1 | 11/2014 | Frolov et al. |
| 8,903,456 B2 | 12/2014 | Chu et al. |
| 8,917,057 B2 | 12/2014 | Hui |
| 8,923,189 B2 | 12/2014 | Leabman |
| 8,928,544 B2 | 1/2015 | Massie et al. |
| 8,937,408 B2 | 1/2015 | Ganem et al. |
| 8,946,940 B2 | 2/2015 | Kim et al. |
| 8,963,486 B2 | 2/2015 | Kirby et al. |
| 8,970,070 B2 | 3/2015 | Sada et al. |
| 8,989,053 B1 | 3/2015 | Skaaksrud et al. |
| 9,000,616 B2 | 4/2015 | Greene et al. |
| 9,001,622 B2 | 4/2015 | Perry |
| 9,006,934 B2 | 4/2015 | Kozakai et al. |
| 9,021,277 B2 | 4/2015 | Shearer et al. |
| 9,030,161 B2 | 5/2015 | Lu et al. |
| 9,059,598 B2 | 6/2015 | Kang et al. |
| 9,059,599 B2 | 6/2015 | Won et al. |
| 9,077,188 B2 | 7/2015 | Moshfeghi |
| 9,083,595 B2 | 7/2015 | Rakib et al. |
| 9,088,216 B2 | 7/2015 | Garrity et al. |
| 9,124,125 B2 | 9/2015 | Leabman et al. |
| 9,130,397 B2 | 9/2015 | Leabman et al. |
| 9,130,602 B2 | 9/2015 | Cook |
| 9,142,998 B2 | 9/2015 | Yu et al. |
| 9,143,000 B2 | 9/2015 | Leabman et al. |
| 9,143,010 B2 | 9/2015 | Urano |
| 9,153,074 B2 | 10/2015 | Zhou et al. |
| 9,178,389 B2 | 11/2015 | Hwang |
| 9,225,196 B2 | 12/2015 | Huang et al. |
| 9,240,469 B2 | 1/2016 | Sun et al. |
| 9,242,411 B2 | 1/2016 | Kritchman et al. |
| 9,244,500 B2 | 1/2016 | Cain et al. |
| 9,252,628 B2 | 2/2016 | Leabman et al. |
| 9,270,344 B2 | 2/2016 | Rosenberg |
| 9,276,329 B2 | 3/2016 | Jones et al. |
| 9,282,582 B1 | 3/2016 | Dunsbergen et al. |
| 9,294,840 B1 | 3/2016 | Anderson et al. |
| 9,297,896 B1 | 3/2016 | Andrews |
| 9,318,898 B2 | 4/2016 | John |
| 9,368,020 B1 | 6/2016 | Bell et al. |
| 9,401,977 B1 | 7/2016 | Gaw |
| 9,409,490 B2 | 8/2016 | Kawashima |
| 9,419,335 B2 | 8/2016 | Pintos |
| 9,438,045 B1 | 9/2016 | Leabman |
| 9,438,046 B1 | 9/2016 | Leabman |
| 9,444,283 B2 | 9/2016 | Son et al. |
| 9,450,449 B1 | 9/2016 | Leabman et al. |
| 9,461,502 B2 | 10/2016 | Lee et al. |
| 9,520,725 B2 | 12/2016 | Masaoka et al. |
| 9,520,748 B2 | 12/2016 | Hyde et al. |
| 9,522,270 B2 | 12/2016 | Perryman et al. |
| 9,532,748 B2 | 1/2017 | Denison et al. |
| 9,537,354 B2 | 1/2017 | Bell et al. |
| 9,537,357 B2 | 1/2017 | Leabman |
| 9,537,358 B2 | 1/2017 | Leabman |
| 9,538,382 B2 | 1/2017 | Bell et al. |
| 9,544,640 B2 | 1/2017 | Lau |
| 9,559,553 B2 | 1/2017 | Bae |
| 9,564,773 B2 | 2/2017 | Pogorelik et al. |
| 9,571,974 B2 | 2/2017 | Choi et al. |
| 9,590,317 B2 | 3/2017 | Zimmerman et al. |
| 9,590,444 B2 | 3/2017 | Walley |
| 9,620,996 B2 | 4/2017 | Zeine |
| 9,647,328 B2 | 5/2017 | Dobric |
| 9,706,137 B2 | 7/2017 | Scanlon et al. |
| 9,711,999 B2 | 7/2017 | Hietala et al. |
| 9,723,635 B2 | 8/2017 | Nambord et al. |
| 9,793,758 B2 | 10/2017 | Leabman |
| 9,793,764 B2 | 10/2017 | Perry |
| 9,800,172 B1 | 10/2017 | Leabman |
| 9,806,564 B2 | 10/2017 | Leabman |
| 9,819,230 B2 | 11/2017 | Petras et al. |
| 9,825,674 B1 | 11/2017 | Leabman |
| 9,838,083 B2 | 12/2017 | Bell et al. |
| 9,843,229 B2 | 12/2017 | Leabman |
| 9,847,669 B2 | 12/2017 | Leabman |
| 9,847,677 B1 | 12/2017 | Leabman |
| 9,847,679 B2 | 12/2017 | Bell et al. |
| 9,853,361 B2 | 12/2017 | Chen et al. |
| 9,853,692 B1 | 12/2017 | Bell et al. |
| 9,859,756 B2 | 1/2018 | Leabman et al. |
| 9,859,758 B1 | 1/2018 | Leabman |
| 9,859,797 B1 | 1/2018 | Leabman |
| 9,866,279 B2 | 1/2018 | Bell et al. |
| 9,867,032 B2 | 1/2018 | Verma et al. |
| 9,871,301 B2 | 1/2018 | Contopanagos |
| 9,876,380 B1 | 1/2018 | Leabman et al. |
| 9,876,394 B1 | 1/2018 | Leabman |
| 9,876,536 B1 | 1/2018 | Bell et al. |
| 9,876,648 B2 | 1/2018 | Bell |
| 9,882,394 B1 | 1/2018 | Bell et al. |
| 9,887,584 B1 | 2/2018 | Bell et al. |
| 9,893,554 B2 | 2/2018 | Bell et al. |
| 9,893,555 B1 | 2/2018 | Leabman et al. |
| 9,893,564 B2 | 2/2018 | de Rochemont |
| 9,899,744 B1 | 2/2018 | Contopanagos et al. |
| 9,899,844 B1 | 2/2018 | Bell et al. |
| 9,899,861 B1 | 2/2018 | Leabman et al. |
| 9,906,065 B2 | 2/2018 | Leabman et al. |
| 9,906,275 B2 | 2/2018 | Leabman |
| 9,912,199 B2 | 3/2018 | Leabman et al. |
| 9,916,485 B1 | 3/2018 | Lilly et al. |
| 9,917,477 B1 | 3/2018 | Bell et al. |
| 9,923,386 B1 | 3/2018 | Leabman et al. |
| 9,939,864 B1 | 4/2018 | Bell et al. |
| 9,941,754 B2 | 4/2018 | Leabman et al. |
| 9,948,135 B2 | 4/2018 | Leabman et al. |
| 9,965,009 B1 | 5/2018 | Bell et al. |
| 9,966,765 B1 | 5/2018 | Leabman |
| 9,966,784 B2 | 5/2018 | Leabman |
| 9,967,743 B1 | 5/2018 | Bell et al. |
| 9,973,008 B1 | 5/2018 | Leabman |
| 10,003,211 B1 | 6/2018 | Leabman et al. |
| 10,008,777 B1 | 6/2018 | Broyde et al. |
| 10,008,889 B2 | 6/2018 | Bell et al. |
| 10,014,728 B1 | 7/2018 | Leabman |
| 10,027,159 B2 | 7/2018 | Hosseini |
| 10,027,180 B1 | 7/2018 | Hosseini |
| 10,038,337 B1 | 7/2018 | Leabman et al. |
| 10,050,462 B1 | 8/2018 | Leabman et al. |
| 10,056,782 B1 | 8/2018 | Leabman |
| 10,063,064 B1 | 8/2018 | Bell et al. |
| 10,063,105 B2 | 8/2018 | Leabman |
| 10,068,703 B1 | 9/2018 | Contopanagos |
| 10,075,008 B1 | 9/2018 | Bell et al. |
| 10,090,699 B1 | 10/2018 | Leabman |
| 10,090,714 B2 | 10/2018 | Bohn et al. |
| 10,090,886 B1 | 10/2018 | Bell et al. |
| 10,103,552 B1 | 10/2018 | Leabman et al. |
| 10,103,582 B2 | 10/2018 | Leabman et al. |
| 10,110,046 B1 | 10/2018 | Esquibel et al. |
| 10,116,143 B1 | 10/2018 | Leabman et al. |
| 10,122,219 B1 | 11/2018 | Hosseini et al. |
| 10,124,754 B1 | 11/2018 | Leabman |
| 10,128,686 B1 | 11/2018 | Leabman et al. |
| 10,128,693 B2 | 11/2018 | Bell et al. |
| 10,128,695 B2 | 11/2018 | Leabman et al. |
| 10,134,260 B1 | 11/2018 | Bell et al. |
| 10,135,112 B1 | 11/2018 | Hosseini |
| 10,141,768 B2 | 11/2018 | Leabman et al. |
| 10,141,771 B1 | 11/2018 | Hosseini et al. |
| 10,148,097 B1 | 12/2018 | Leabman et al. |
| 10,148,133 B2 | 12/2018 | Leabman et al. |
| 10,153,645 B1 | 12/2018 | Bell et al. |
| 10,153,653 B1 | 12/2018 | Bell et al. |
| 10,153,660 B1 | 12/2018 | Leabman et al. |
| 10,158,257 B2 | 12/2018 | Leabman |
| 10,158,259 B1 | 12/2018 | Leabman |
| 10,164,478 B2 | 12/2018 | Leabman |

(56) References Cited

U.S. PATENT DOCUMENTS

| | | |
|---|---|---|
| 10,170,917 B1 | 1/2019 | Bell et al. |
| 10,181,756 B2 | 1/2019 | Bae et al. |
| 10,186,892 B2 | 1/2019 | Hosseini et al. |
| 10,186,913 B2 | 1/2019 | Leabman et al. |
| 10,193,396 B1 | 1/2019 | Bell et al. |
| 10,199,835 B2 | 2/2019 | Bell |
| 10,199,849 B1 | 2/2019 | Bell |
| 10,205,239 B1 | 2/2019 | Contopanagos et al. |
| 10,206,185 B2 | 2/2019 | Leabman et al. |
| 10,211,674 B1 | 2/2019 | Leabman et al. |
| 10,211,680 B2 | 2/2019 | Leabman et al. |
| 10,211,682 B2 | 2/2019 | Bell et al. |
| 10,223,717 B1 | 3/2019 | Bell |
| 10,224,758 B2 | 3/2019 | Leabman et al. |
| 10,224,982 B1 | 3/2019 | Leabman |
| 10,230,266 B1 | 3/2019 | Leabman et al. |
| 10,243,414 B1 | 3/2019 | Leabman et al. |
| 10,256,657 B2 | 4/2019 | Hosseini et al. |
| 10,256,677 B2 | 4/2019 | Hosseini et al. |
| 10,263,432 B1 | 4/2019 | Leabman et al. |
| 10,263,476 B2 | 4/2019 | Leabman |
| 10,270,261 B2 | 4/2019 | Bell et al. |
| 10,277,054 B2 | 4/2019 | Hosseini |
| 10,291,055 B1 | 5/2019 | Bell et al. |
| 10,291,056 B2 | 5/2019 | Bell et al. |
| 10,291,066 B1 | 5/2019 | Leabman |
| 10,291,294 B2 | 5/2019 | Leabman |
| 10,298,024 B2 | 5/2019 | Leabman |
| 10,298,133 B2 | 5/2019 | Leabman |
| 10,305,315 B2 | 5/2019 | Leabman et al. |
| 10,312,715 B2 | 6/2019 | Leabman |
| 10,320,446 B2 | 6/2019 | Hosseini |
| 10,333,332 B1 | 6/2019 | Hosseini |
| 10,355,534 B2 | 7/2019 | Johnston et al. |
| 10,381,880 B2 | 8/2019 | Leabman et al. |
| 10,389,161 B2 | 8/2019 | Hosseini et al. |
| 10,396,588 B2 | 8/2019 | Leabman |
| 10,396,604 B2 | 8/2019 | Bell et al. |
| 10,439,442 B2 | 10/2019 | Hosseini et al. |
| 10,439,448 B2 | 10/2019 | Bell et al. |
| 10,447,093 B2 | 10/2019 | Hosseini |
| 10,476,312 B2 | 11/2019 | Johnston et al. |
| 10,483,768 B2 | 11/2019 | Bell et al. |
| 10,490,346 B2 | 11/2019 | Contopanagos |
| 10,491,029 B2 | 11/2019 | Hosseini |
| 10,498,144 B2 | 12/2019 | Leabman et al. |
| 10,511,097 B2 | 12/2019 | Kornaros et al. |
| 10,511,196 B2 | 12/2019 | Hosseini |
| 10,516,289 B2 | 12/2019 | Leabman et al. |
| 10,516,301 B2 | 12/2019 | Leabman |
| 10,523,033 B2 | 12/2019 | Leabman |
| 10,523,058 B2 | 12/2019 | Leabman |
| 10,554,052 B2 | 2/2020 | Bell et al. |
| 10,594,165 B2 | 3/2020 | Hosseini |
| 10,615,647 B2 | 4/2020 | Johnston et al. |
| 10,680,319 B2 | 6/2020 | Hosseini et al. |
| 10,714,984 B2 | 7/2020 | Hosseini et al. |
| 10,734,717 B2 | 8/2020 | Hosseini |
| 10,778,041 B2 | 9/2020 | Leabman |
| 10,790,674 B2 | 9/2020 | Bell et al. |
| 10,840,743 B2 | 11/2020 | Johnston et al. |
| 10,848,853 B2 | 11/2020 | Leabman et al. |
| 10,879,740 B2 | 12/2020 | Hosseini |
| 10,923,954 B2 | 2/2021 | Leabman |
| 10,958,095 B2 | 3/2021 | Leabman et al. |
| 10,965,164 B2 | 3/2021 | Leabman et al. |
| 10,985,617 B1 | 4/2021 | Johnston et al. |
| 10,992,185 B2 | 4/2021 | Leabman |
| 10,992,187 B2 | 4/2021 | Leabman |
| 11,011,942 B2 | 5/2021 | Liu |
| 11,018,779 B2 | 5/2021 | Sarajedini |
| 11,056,929 B2 | 7/2021 | Bell et al. |
| 11,114,885 B2 | 9/2021 | Hosseini et al. |
| 11,139,699 B2 | 10/2021 | Johnston et al. |
| 11,159,057 B2 | 10/2021 | Kabiri et al. |
| 11,233,425 B2 | 1/2022 | Leabman |
| 11,245,191 B2 | 2/2022 | Kornaros et al. |
| 2002/0065052 A1 | 5/2002 | Pande et al. |
| 2002/0103447 A1 | 8/2002 | Terry |
| 2002/0171594 A1 | 11/2002 | Fang |
| 2003/0038750 A1 | 2/2003 | Chen |
| 2003/0058187 A1 | 3/2003 | Billiet et al. |
| 2004/0020100 A1 | 2/2004 | O'Brian et al. |
| 2004/0130425 A1 | 7/2004 | Dayan et al. |
| 2004/0130442 A1 | 7/2004 | Breed |
| 2004/0145342 A1 | 7/2004 | Lyon |
| 2004/0155832 A1 | 8/2004 | Yuanzhu |
| 2004/0207559 A1 | 10/2004 | Milosavljevic |
| 2004/0259604 A1 | 12/2004 | Mickle et al. |
| 2005/0007276 A1 | 1/2005 | Barrick et al. |
| 2005/0116683 A1 | 6/2005 | Cheng |
| 2005/0117660 A1 | 6/2005 | Vialle et al. |
| 2005/0134517 A1 | 6/2005 | Gottl |
| 2005/0227619 A1 | 10/2005 | Lee et al. |
| 2005/0237258 A1 | 10/2005 | Abramov et al. |
| 2006/0013335 A1 | 1/2006 | Leabman |
| 2006/0019712 A1 | 1/2006 | Choi |
| 2006/0030279 A1 | 2/2006 | Leabman et al. |
| 2006/0092079 A1 | 5/2006 | de Rochemont |
| 2006/0094425 A1 | 5/2006 | Mickle et al. |
| 2006/0113955 A1 | 6/2006 | Nunally |
| 2006/0119532 A1 | 6/2006 | Yun et al. |
| 2006/0160517 A1 | 7/2006 | Yoon |
| 2006/0199620 A1 | 9/2006 | Greene et al. |
| 2006/0238365 A1 | 10/2006 | Vecchione et al. |
| 2006/0266564 A1 | 11/2006 | Perlman et al. |
| 2006/0266917 A1 | 11/2006 | Baldis et al. |
| 2006/0284593 A1 | 12/2006 | Nagy et al. |
| 2007/0007821 A1 | 1/2007 | Rossetti |
| 2007/0019693 A1 | 1/2007 | Graham |
| 2007/0021140 A1 | 1/2007 | Keyes |
| 2007/0060185 A1 | 3/2007 | Simon et al. |
| 2007/0090997 A1 | 4/2007 | Brown et al. |
| 2007/0093269 A1 | 4/2007 | Leabman et al. |
| 2007/0097653 A1 | 5/2007 | Gilliland et al. |
| 2007/0103110 A1 | 5/2007 | Sagoo |
| 2007/0106894 A1 | 5/2007 | Zhang |
| 2007/0109121 A1 | 5/2007 | Cohen |
| 2007/0139000 A1 | 6/2007 | Kozuma |
| 2007/0149162 A1 | 6/2007 | Greene et al. |
| 2007/0164868 A1 | 7/2007 | Deavours et al. |
| 2007/0173214 A1 | 7/2007 | Mickle et al. |
| 2007/0178857 A1 | 8/2007 | Greene et al. |
| 2007/0178945 A1 | 8/2007 | Cook et al. |
| 2007/0182367 A1 | 8/2007 | Partovi |
| 2007/0191074 A1 | 8/2007 | Harrist et al. |
| 2007/0191075 A1 | 8/2007 | Greene et al. |
| 2007/0210960 A1 | 9/2007 | Rofougaran et al. |
| 2007/0222681 A1 | 9/2007 | Greene et al. |
| 2007/0228833 A1 | 10/2007 | Stevens et al. |
| 2007/0229261 A1 | 10/2007 | Zimmerman et al. |
| 2007/0240297 A1 | 10/2007 | Yang et al. |
| 2007/0273486 A1 | 11/2007 | Shiotsu |
| 2007/0296639 A1 | 12/2007 | Hook et al. |
| 2007/0298846 A1 | 12/2007 | Greene et al. |
| 2008/0014897 A1 | 1/2008 | Cook et al. |
| 2008/0024376 A1 | 1/2008 | Norris et al. |
| 2008/0048917 A1 | 2/2008 | Achour et al. |
| 2008/0067874 A1 | 3/2008 | Tseng |
| 2008/0074324 A1 | 3/2008 | Puzella et al. |
| 2008/0089277 A1 | 4/2008 | Alexander et al. |
| 2008/0110263 A1 | 5/2008 | Klessel et al. |
| 2008/0122297 A1 | 5/2008 | Arai |
| 2008/0123383 A1 | 5/2008 | Shionoiri |
| 2008/0169910 A1 | 7/2008 | Greene et al. |
| 2008/0197802 A1 | 8/2008 | Onishi |
| 2008/0204350 A1 | 8/2008 | Tam et al. |
| 2008/0210762 A1 | 9/2008 | Osada et al. |
| 2008/0211458 A1 | 9/2008 | Lawther et al. |
| 2008/0233890 A1 | 9/2008 | Baker |
| 2008/0258993 A1 | 10/2008 | Gummalla et al. |
| 2008/0266191 A1 | 10/2008 | Hilgers |
| 2008/0278378 A1 | 11/2008 | Chang et al. |
| 2008/0309452 A1 | 12/2008 | Zeine |

(56) References Cited

U.S. PATENT DOCUMENTS

| | | |
|---|---|---|
| 2009/0002493 A1 | 1/2009 | Kates |
| 2009/0010316 A1 | 1/2009 | Rofougaran et al. |
| 2009/0019183 A1 | 1/2009 | Wu et al. |
| 2009/0036065 A1 | 2/2009 | Siu |
| 2009/0039828 A1 | 2/2009 | Jakubowski |
| 2009/0047998 A1 | 2/2009 | Alberth, Jr. |
| 2009/0058361 A1 | 3/2009 | John |
| 2009/0058731 A1 | 3/2009 | Geary et al. |
| 2009/0060012 A1 | 3/2009 | Gresset et al. |
| 2009/0067198 A1 | 3/2009 | Graham et al. |
| 2009/0067208 A1 | 3/2009 | Martin et al. |
| 2009/0073066 A1 | 3/2009 | Jordon et al. |
| 2009/0096412 A1 | 4/2009 | Huang |
| 2009/0096413 A1 | 4/2009 | Partovi |
| 2009/0102292 A1 | 4/2009 | Cook et al. |
| 2009/0102296 A1 | 4/2009 | Greene et al. |
| 2009/0108679 A1 | 4/2009 | Porwal |
| 2009/0122847 A1 | 5/2009 | Nysen et al. |
| 2009/0128262 A1 | 5/2009 | Lee et al. |
| 2009/0174604 A1 | 7/2009 | Keskitalo |
| 2009/0200985 A1 | 8/2009 | Zane et al. |
| 2009/0206791 A1 | 8/2009 | Jung |
| 2009/0207092 A1 | 8/2009 | Nysen et al. |
| 2009/0218884 A1 | 9/2009 | Soar |
| 2009/0218891 A1 | 9/2009 | McCollough |
| 2009/0243397 A1 | 10/2009 | Cook et al. |
| 2009/0256752 A1 | 10/2009 | Akkermans et al. |
| 2009/0264069 A1 | 10/2009 | Yamasuge |
| 2009/0271048 A1 | 10/2009 | Wakamatsu |
| 2009/0281678 A1 | 11/2009 | Wakamatsu |
| 2009/0284082 A1 | 11/2009 | Mohammadian |
| 2009/0284220 A1 | 11/2009 | Toncich et al. |
| 2009/0284227 A1 | 11/2009 | Mohammadian et al. |
| 2009/0286475 A1 | 11/2009 | Toncich et al. |
| 2009/0286476 A1 | 11/2009 | Toncich et al. |
| 2009/0291634 A1 | 11/2009 | Saarisalo |
| 2009/0312046 A1 | 12/2009 | Clevenger et al. |
| 2009/0322281 A1 | 12/2009 | Kamijo et al. |
| 2010/0001683 A1 | 1/2010 | Huang et al. |
| 2010/0007307 A1 | 1/2010 | Baarman et al. |
| 2010/0007569 A1 | 1/2010 | Sim et al. |
| 2010/0019908 A1 | 1/2010 | Cho et al. |
| 2010/0033021 A1 | 2/2010 | Bennett |
| 2010/0034238 A1 | 2/2010 | Bennett |
| 2010/0044123 A1 | 2/2010 | Perlman et al. |
| 2010/0060534 A1 | 3/2010 | Oodachi |
| 2010/0066631 A1 | 3/2010 | Puzella et al. |
| 2010/0075607 A1 | 3/2010 | Hosoya |
| 2010/0079005 A1 | 4/2010 | Hyde et al. |
| 2010/0079011 A1 | 4/2010 | Hyde et al. |
| 2010/0087227 A1 | 4/2010 | Francos et al. |
| 2010/0090656 A1 | 4/2010 | Shearer et al. |
| 2010/0109443 A1 | 5/2010 | Cook et al. |
| 2010/0117926 A1 | 5/2010 | DeJean, II |
| 2010/0123618 A1 | 5/2010 | Martin et al. |
| 2010/0123624 A1 | 5/2010 | Minear et al. |
| 2010/0127660 A1 | 5/2010 | Cook et al. |
| 2010/0142418 A1 | 6/2010 | Nishioka et al. |
| 2010/0142509 A1 | 6/2010 | Zhu et al. |
| 2010/0148723 A1 | 6/2010 | Cook et al. |
| 2010/0151808 A1 | 6/2010 | Toncich et al. |
| 2010/0156741 A1 | 6/2010 | Vazquez et al. |
| 2010/0164296 A1 | 7/2010 | Kurs et al. |
| 2010/0164433 A1 | 7/2010 | Janefalker et al. |
| 2010/0167664 A1 | 7/2010 | Szini |
| 2010/0171461 A1 | 7/2010 | Baarman et al. |
| 2010/0171676 A1 | 7/2010 | Tani et al. |
| 2010/0174629 A1 | 7/2010 | Taylor et al. |
| 2010/0176934 A1 | 7/2010 | Chou et al. |
| 2010/0181961 A1 | 7/2010 | Novak et al. |
| 2010/0181964 A1 | 7/2010 | Huggins et al. |
| 2010/0194206 A1 | 8/2010 | Burdo et al. |
| 2010/0201189 A1 | 8/2010 | Kirby et al. |
| 2010/0201201 A1 | 8/2010 | Mobarhan et al. |
| 2010/0201314 A1 | 8/2010 | Toncich et al. |
| 2010/0207572 A1 | 8/2010 | Kirby et al. |
| 2010/0210233 A1 | 8/2010 | Cook et al. |
| 2010/0213895 A1 | 8/2010 | Keating et al. |
| 2010/0214177 A1 | 8/2010 | Parsche |
| 2010/0222010 A1 | 9/2010 | Ozaki et al. |
| 2010/0225270 A1 | 9/2010 | Jacobs et al. |
| 2010/0227570 A1 | 9/2010 | Hendin |
| 2010/0244576 A1 | 9/2010 | Hillan et al. |
| 2010/0253281 A1 | 10/2010 | Li |
| 2010/0256831 A1 | 10/2010 | Abramo et al. |
| 2010/0259447 A1 | 10/2010 | Crouch |
| 2010/0264747 A1 | 10/2010 | Hall et al. |
| 2010/0277003 A1 | 11/2010 | Von Novak et al. |
| 2010/0279606 A1 | 11/2010 | Hillan et al. |
| 2010/0289341 A1 | 11/2010 | Ozaki et al. |
| 2010/0295372 A1 | 11/2010 | Hyde et al. |
| 2010/0309088 A1 | 12/2010 | Hyvonen et al. |
| 2010/0315045 A1 | 12/2010 | Zeine |
| 2010/0328044 A1 | 12/2010 | Waffenschmidt et al. |
| 2011/0009057 A1 | 1/2011 | Saunamäki |
| 2011/0013198 A1 | 1/2011 | Shirley |
| 2011/0018360 A1 | 1/2011 | Baarman et al. |
| 2011/0028114 A1 | 2/2011 | Kerselaers |
| 2011/0032149 A1 | 2/2011 | Leabman |
| 2011/0032866 A1 | 2/2011 | Leabman |
| 2011/0034190 A1 | 2/2011 | Leabman |
| 2011/0034191 A1 | 2/2011 | Leabman |
| 2011/0043047 A1 | 2/2011 | Karalis et al. |
| 2011/0043163 A1 | 2/2011 | Baarman et al. |
| 2011/0043327 A1 | 2/2011 | Baarman et al. |
| 2011/0050166 A1 | 3/2011 | Cook et al. |
| 2011/0057607 A1 | 3/2011 | Carobolante |
| 2011/0057853 A1 | 3/2011 | Kim et al. |
| 2011/0062788 A1 | 3/2011 | Chen et al. |
| 2011/0074342 A1 | 3/2011 | MacLaughlin |
| 2011/0074349 A1 | 3/2011 | Ghovanloo |
| 2011/0109167 A1 | 5/2011 | Park et al. |
| 2011/0115303 A1 | 5/2011 | Baarman et al. |
| 2011/0115432 A1 | 5/2011 | El-Maleh |
| 2011/0115605 A1 | 5/2011 | Dimig et al. |
| 2011/0121660 A1 | 5/2011 | Azancot et al. |
| 2011/0122018 A1 | 5/2011 | Tarng et al. |
| 2011/0122026 A1 | 5/2011 | DeLaquil et al. |
| 2011/0127845 A1 | 6/2011 | Walley et al. |
| 2011/0127952 A1 | 6/2011 | Walley et al. |
| 2011/0133691 A1 | 6/2011 | Hautanen |
| 2011/0151789 A1 | 6/2011 | Viglione et al. |
| 2011/0154429 A1 | 6/2011 | Stantchev |
| 2011/0156493 A1 | 6/2011 | Bennett |
| 2011/0156494 A1 | 6/2011 | Mashinsky |
| 2011/0156640 A1 | 6/2011 | Moshfeghi |
| 2011/0175455 A1 | 7/2011 | Hashiguchi |
| 2011/0175461 A1 | 7/2011 | Tinaphong |
| 2011/0181120 A1 | 7/2011 | Liu et al. |
| 2011/0182245 A1 | 7/2011 | Malkamaki et al. |
| 2011/0184842 A1 | 7/2011 | Melen |
| 2011/0194543 A1 | 8/2011 | Zhao et al. |
| 2011/0195722 A1 | 8/2011 | Walter et al. |
| 2011/0199046 A1 | 8/2011 | Tsai et al. |
| 2011/0215086 A1 | 9/2011 | Yeh |
| 2011/0217923 A1 | 9/2011 | Ma |
| 2011/0220634 A1 | 9/2011 | Yeh |
| 2011/0221389 A1 | 9/2011 | Won et al. |
| 2011/0222272 A1 | 9/2011 | Yeh |
| 2011/0227725 A1 | 9/2011 | Muirhead |
| 2011/0243040 A1 | 10/2011 | Khan et al. |
| 2011/0243050 A1 | 10/2011 | Yanover |
| 2011/0244913 A1 | 10/2011 | Kim et al. |
| 2011/0248573 A1 | 10/2011 | Kanno et al. |
| 2011/0248575 A1 | 10/2011 | Kim et al. |
| 2011/0249678 A1 | 10/2011 | Bonicatto |
| 2011/0254377 A1 | 10/2011 | Widmer et al. |
| 2011/0254503 A1 | 10/2011 | Widmer et al. |
| 2011/0259953 A1 | 10/2011 | Baarman et al. |
| 2011/0273977 A1 | 11/2011 | Shapira et al. |
| 2011/0278941 A1 | 11/2011 | Krishna et al. |
| 2011/0279226 A1 | 11/2011 | Chen et al. |
| 2011/0281535 A1 | 11/2011 | Low et al. |
| 2011/0282415 A1 | 11/2011 | Eckhoff et al. |

(56) References Cited

U.S. PATENT DOCUMENTS

| | | |
|---|---|---|
| 2011/0285213 A1 | 11/2011 | Kowalewski |
| 2011/0286374 A1 | 11/2011 | Shin et al. |
| 2011/0291489 A1 | 12/2011 | Tsai et al. |
| 2011/0302078 A1 | 12/2011 | Failing |
| 2011/0304216 A1 | 12/2011 | Baarman |
| 2011/0304437 A1 | 12/2011 | Beeler |
| 2011/0304521 A1 | 12/2011 | Ando et al. |
| 2012/0007441 A1 | 1/2012 | John |
| 2012/0013196 A1 | 1/2012 | Kim et al. |
| 2012/0013198 A1 | 1/2012 | Uramoto et al. |
| 2012/0013296 A1 | 1/2012 | Heydari et al. |
| 2012/0019419 A1 | 1/2012 | Prat et al. |
| 2012/0043887 A1 | 2/2012 | Mesibov |
| 2012/0051109 A1 | 3/2012 | Kim et al. |
| 2012/0051294 A1 | 3/2012 | Guillouard |
| 2012/0056486 A1 | 3/2012 | Endo et al. |
| 2012/0056741 A1 | 3/2012 | Zhu et al. |
| 2012/0068906 A1 | 3/2012 | Asher et al. |
| 2012/0074891 A1 | 3/2012 | Anderson et al. |
| 2012/0075072 A1 | 3/2012 | Pappu |
| 2012/0080944 A1 | 4/2012 | Recker et al. |
| 2012/0080957 A1 | 4/2012 | Cooper et al. |
| 2012/0086284 A1 | 4/2012 | Capanella et al. |
| 2012/0086615 A1 | 4/2012 | Norair |
| 2012/0095617 A1 | 4/2012 | Martin et al. |
| 2012/0098350 A1 | 4/2012 | Campanella et al. |
| 2012/0098485 A1 | 4/2012 | Kang et al. |
| 2012/0099675 A1 | 4/2012 | Kitamura et al. |
| 2012/0103562 A1 | 5/2012 | Clayton |
| 2012/0104849 A1 | 5/2012 | Jackson |
| 2012/0105252 A1 | 5/2012 | Wang |
| 2012/0112532 A1 | 5/2012 | Kesler et al. |
| 2012/0119914 A1 | 5/2012 | Uchida |
| 2012/0126743 A1 | 5/2012 | Rivers, Jr. |
| 2012/0132647 A1 | 5/2012 | Beverly et al. |
| 2012/0133214 A1 | 5/2012 | Yun et al. |
| 2012/0142291 A1 | 6/2012 | Rath et al. |
| 2012/0146426 A1 | 6/2012 | Sabo |
| 2012/0146576 A1 | 6/2012 | Partovi |
| 2012/0146577 A1 | 6/2012 | Tanabe |
| 2012/0147802 A1 | 6/2012 | Ukita et al. |
| 2012/0149307 A1 | 6/2012 | Terada et al. |
| 2012/0150670 A1 | 6/2012 | Taylor et al. |
| 2012/0153894 A1 | 6/2012 | Widmer et al. |
| 2012/0157019 A1 | 6/2012 | Li |
| 2012/0161531 A1 | 6/2012 | Kim et al. |
| 2012/0161544 A1 | 6/2012 | Kashiwagi et al. |
| 2012/0169276 A1 | 7/2012 | Wang |
| 2012/0169278 A1 | 7/2012 | Choi |
| 2012/0173418 A1 | 7/2012 | Beardsmore et al. |
| 2012/0179004 A1 | 7/2012 | Roesicke et al. |
| 2012/0181973 A1 | 7/2012 | Lyden |
| 2012/0182427 A1 | 7/2012 | Marshall |
| 2012/0188142 A1 | 7/2012 | Shashi et al. |
| 2012/0187851 A1 | 8/2012 | Huggins et al. |
| 2012/0193999 A1 | 8/2012 | Zeine |
| 2012/0200399 A1 | 8/2012 | Chae |
| 2012/0201153 A1 | 8/2012 | Bharadia et al. |
| 2012/0201173 A1 | 8/2012 | Jian et al. |
| 2012/0206299 A1 | 8/2012 | Valdes-Garcia |
| 2012/0211214 A1 | 8/2012 | Phan |
| 2012/0212071 A1 | 8/2012 | Miyabayashi et al. |
| 2012/0212072 A1 | 8/2012 | Miyabayashi et al. |
| 2012/0214462 A1 | 8/2012 | Chu et al. |
| 2012/0214536 A1 | 8/2012 | Kim et al. |
| 2012/0228392 A1 | 9/2012 | Cameron et al. |
| 2012/0228956 A1 | 9/2012 | Kamata |
| 2012/0231856 A1 | 9/2012 | Lee et al. |
| 2012/0235636 A1 | 9/2012 | Partovi |
| 2012/0242283 A1 | 9/2012 | Kim et al. |
| 2012/0248886 A1 | 10/2012 | Kesler et al. |
| 2012/0248888 A1 | 10/2012 | Kesler et al. |
| 2012/0248891 A1 | 10/2012 | Drennen |
| 2012/0249051 A1 | 10/2012 | Son et al. |
| 2012/0262002 A1 | 10/2012 | Widmer et al. |
| 2012/0265272 A1 | 10/2012 | Judkins |
| 2012/0267900 A1 | 10/2012 | Huffman et al. |
| 2012/0268238 A1 | 10/2012 | Park et al. |
| 2012/0270592 A1 | 10/2012 | Ngai |
| 2012/0274154 A1 | 11/2012 | DeLuca |
| 2012/0280650 A1 | 11/2012 | Kim et al. |
| 2012/0286582 A1 | 11/2012 | Kim et al. |
| 2012/0292993 A1 | 11/2012 | Mettler et al. |
| 2012/0293021 A1 | 11/2012 | Teggatz et al. |
| 2012/0293119 A1 | 11/2012 | Park et al. |
| 2012/0299389 A1 | 11/2012 | Lee et al. |
| 2012/0299540 A1 | 11/2012 | Perry |
| 2012/0299541 A1 | 11/2012 | Perry |
| 2012/0299542 A1 | 11/2012 | Perry |
| 2012/0300588 A1 | 11/2012 | Perry |
| 2012/0300592 A1 | 11/2012 | Perry |
| 2012/0300593 A1 | 11/2012 | Perry |
| 2012/0306284 A1 | 12/2012 | Lee et al. |
| 2012/0306433 A1 | 12/2012 | Kim et al. |
| 2012/0306705 A1 | 12/2012 | Sakurai et al. |
| 2012/0306707 A1 | 12/2012 | Yang et al. |
| 2012/0306720 A1 | 12/2012 | Tanmi et al. |
| 2012/0307873 A1 | 12/2012 | Kim et al. |
| 2012/0309295 A1 | 12/2012 | Maguire |
| 2012/0309308 A1 | 12/2012 | Kim et al. |
| 2012/0309332 A1 | 12/2012 | Liao |
| 2012/0313446 A1 | 12/2012 | Park et al. |
| 2012/0313449 A1 | 12/2012 | Kurs |
| 2012/0313835 A1 | 12/2012 | Gebretnsae |
| 2012/0326660 A1 | 12/2012 | Lu et al. |
| 2013/0002550 A1 | 1/2013 | Zalewski |
| 2013/0005252 A1 | 1/2013 | Lee et al. |
| 2013/0018439 A1 | 1/2013 | Chow et al. |
| 2013/0024059 A1 | 1/2013 | Miller et al. |
| 2013/0026981 A1 | 1/2013 | Van Der Lee |
| 2013/0026982 A1 | 1/2013 | Rothenbaum |
| 2013/0032589 A1 | 2/2013 | Chung |
| 2013/0033571 A1 | 2/2013 | Steen |
| 2013/0038124 A1 | 2/2013 | Newdoll et al. |
| 2013/0038402 A1 | 2/2013 | Karalis et al. |
| 2013/0043738 A1 | 2/2013 | Park et al. |
| 2013/0044035 A1 | 2/2013 | Zhuang |
| 2013/0049471 A1 | 2/2013 | Oleynik |
| 2013/0049475 A1 | 2/2013 | Kim et al. |
| 2013/0049484 A1 | 2/2013 | Weissentern et al. |
| 2013/0057078 A1 | 3/2013 | Lee |
| 2013/0057205 A1 | 3/2013 | Lee et al. |
| 2013/0057210 A1 | 3/2013 | Negaard et al. |
| 2013/0057364 A1 | 3/2013 | Kesler et al. |
| 2013/0058379 A1 | 3/2013 | Kim et al. |
| 2013/0062959 A1 | 3/2013 | Lee et al. |
| 2013/0063082 A1 | 3/2013 | Lee et al. |
| 2013/0063143 A1 | 3/2013 | Adalsteinsson et al. |
| 2013/0063266 A1 | 3/2013 | Yunker et al. |
| 2013/0069444 A1 | 3/2013 | Waffenschmidt et al. |
| 2013/0076308 A1 | 3/2013 | Niskala et al. |
| 2013/0077650 A1 | 3/2013 | Traxler et al. |
| 2013/0078918 A1 | 3/2013 | Crowley et al. |
| 2013/0082651 A1 | 4/2013 | Park et al. |
| 2013/0082653 A1 | 4/2013 | Lee et al. |
| 2013/0083774 A1 | 4/2013 | Son et al. |
| 2013/0088082 A1 | 4/2013 | Kang et al. |
| 2013/0088090 A1 | 4/2013 | Wu |
| 2013/0088192 A1 | 4/2013 | Eaton |
| 2013/0088331 A1 | 4/2013 | Cho |
| 2013/0093388 A1 | 4/2013 | Partovi |
| 2013/0099389 A1 | 4/2013 | Hong et al. |
| 2013/0099586 A1 | 4/2013 | Kato |
| 2013/0106197 A1 | 5/2013 | Bae et al. |
| 2013/0107023 A1 | 5/2013 | Tanaka et al. |
| 2013/0119777 A1 | 5/2013 | Rees |
| 2013/0119778 A1 | 5/2013 | Jung |
| 2013/0119929 A1 | 5/2013 | Partovi |
| 2013/0120052 A1 | 5/2013 | Siska |
| 2013/0120205 A1 | 5/2013 | Thomson et al. |
| 2013/0120206 A1 | 5/2013 | Biancotto et al. |
| 2013/0120217 A1 | 5/2013 | Ueda et al. |
| 2013/0130621 A1 | 5/2013 | Kim et al. |
| 2013/0132010 A1 | 5/2013 | Winger et al. |

(56) References Cited

U.S. PATENT DOCUMENTS

| | | |
|---|---|---|
| 2013/0134923 A1 | 5/2013 | Smith |
| 2013/0137455 A1 | 5/2013 | Xia |
| 2013/0141037 A1 | 6/2013 | Jenwatanavet et al. |
| 2013/0148341 A1 | 6/2013 | Williams |
| 2013/0149975 A1 | 6/2013 | Yu et al. |
| 2013/0154387 A1 | 6/2013 | Lee et al. |
| 2013/0155748 A1 | 6/2013 | Sundstrom |
| 2013/0157729 A1 | 6/2013 | Tabe |
| 2013/0162335 A1 | 6/2013 | Kim et al. |
| 2013/0169061 A1 | 7/2013 | Microshnichenko et al. |
| 2013/0169219 A1 | 7/2013 | Gray |
| 2013/0169348 A1 | 7/2013 | Shi |
| 2013/0171939 A1 | 7/2013 | Tian et al. |
| 2013/0175877 A1 | 7/2013 | Abe et al. |
| 2013/0178253 A1 | 7/2013 | Karaoguz |
| 2013/0181881 A1 | 7/2013 | Christie et al. |
| 2013/0187475 A1 | 7/2013 | Vendik |
| 2013/0190031 A1 | 7/2013 | Persson et al. |
| 2013/0193769 A1 | 8/2013 | Mehta et al. |
| 2013/0197320 A1 | 8/2013 | Albert et al. |
| 2013/0200064 A1 | 8/2013 | Alexander |
| 2013/0207477 A1 | 8/2013 | Nam et al. |
| 2013/0207604 A1 | 8/2013 | Zeine |
| 2013/0207879 A1 | 8/2013 | Rada et al. |
| 2013/0210357 A1 | 8/2013 | Qin et al. |
| 2013/0221757 A1 | 8/2013 | Cho et al. |
| 2013/0222201 A1 | 8/2013 | Ma et al. |
| 2013/0234530 A1 | 9/2013 | Miyauchi |
| 2013/0234536 A1 | 9/2013 | Chemishkian et al. |
| 2013/0234658 A1 | 9/2013 | Endo et al. |
| 2013/0241306 A1 | 9/2013 | Aber et al. |
| 2013/0241468 A1 | 9/2013 | Moshfeghi |
| 2013/0241474 A1 | 9/2013 | Moshfeghi |
| 2013/0249478 A1 | 9/2013 | Hirano |
| 2013/0249479 A1 | 9/2013 | Partovi |
| 2013/0249682 A1 | 9/2013 | Van Wiemeersch et al. |
| 2013/0250102 A1 | 9/2013 | Scanlon et al. |
| 2013/0254578 A1 | 9/2013 | Huang et al. |
| 2013/0264997 A1 | 10/2013 | Lee et al. |
| 2013/0268782 A1 | 10/2013 | Tam et al. |
| 2013/0270923 A1 | 10/2013 | Cook et al. |
| 2013/0278076 A1 | 10/2013 | Proud |
| 2013/0278209 A1 | 10/2013 | Von Novak |
| 2013/0285464 A1 | 10/2013 | Miwa |
| 2013/0285477 A1 | 10/2013 | Lo et al. |
| 2013/0285606 A1 | 10/2013 | Ben-Shalom et al. |
| 2013/0288600 A1 | 10/2013 | Kuusilinna et al. |
| 2013/0288617 A1 | 10/2013 | Kim et al. |
| 2013/0293423 A1 | 11/2013 | Moshfeghi |
| 2013/0300356 A1 | 11/2013 | Yang |
| 2013/0307751 A1 | 11/2013 | Yu-Juin et al. |
| 2013/0310020 A1 | 11/2013 | Kazuhiro |
| 2013/0311798 A1 | 11/2013 | Sultenfuss |
| 2013/0328417 A1 | 12/2013 | Takeuchi |
| 2013/0334883 A1 | 12/2013 | Kim et al. |
| 2013/0339108 A1 | 12/2013 | Ryder et al. |
| 2013/0343208 A1 | 12/2013 | Sexton et al. |
| 2013/0343251 A1 | 12/2013 | Zhang |
| 2013/0343585 A1 | 12/2013 | Bennett et al. |
| 2014/0001846 A1 | 1/2014 | Mosebrook |
| 2014/0001875 A1 | 1/2014 | Nahidipour |
| 2014/0001876 A1 | 1/2014 | Fujiwara et al. |
| 2014/0006017 A1 | 1/2014 | Sen |
| 2014/0008993 A1 | 1/2014 | Leabman |
| 2014/0009110 A1 | 1/2014 | Lee |
| 2014/0011531 A1 | 1/2014 | Burstrom et al. |
| 2014/0015336 A1 | 1/2014 | Weber et al. |
| 2014/0015344 A1 | 1/2014 | Mohamadi |
| 2014/0021907 A1 | 1/2014 | Yun et al. |
| 2014/0021908 A1 | 1/2014 | McCool |
| 2014/0035524 A1 | 2/2014 | Zeine |
| 2014/0035526 A1 | 2/2014 | Tripathi et al. |
| 2014/0035786 A1 | 2/2014 | Ley |
| 2014/0043248 A1 | 2/2014 | Yeh |
| 2014/0049422 A1 | 2/2014 | Von Novak et al. |
| 2014/0054971 A1 | 2/2014 | Kissin |
| 2014/0055098 A1 | 2/2014 | Lee et al. |
| 2014/0057618 A1 | 2/2014 | Zirwas et al. |
| 2014/0062395 A1 | 3/2014 | Kwon et al. |
| 2014/0082435 A1 | 3/2014 | Kitgawa |
| 2014/0086125 A1 | 3/2014 | Polo et al. |
| 2014/0086592 A1 | 3/2014 | Nakahara et al. |
| 2014/0091756 A1 | 4/2014 | Ofstein et al. |
| 2014/0091968 A1 | 4/2014 | Harel et al. |
| 2014/0091974 A1 | 4/2014 | Desclos et al. |
| 2014/0103869 A1 | 4/2014 | Radovic |
| 2014/0104157 A1 | 4/2014 | Burns |
| 2014/0111147 A1 | 4/2014 | Soar |
| 2014/0111153 A1 | 4/2014 | Kwon et al. |
| 2014/0111156 A1 | 4/2014 | Lee et al. |
| 2014/0113689 A1 | 4/2014 | Lee |
| 2014/0117946 A1 | 5/2014 | Muller et al. |
| 2014/0118140 A1 | 5/2014 | Amis |
| 2014/0128107 A1 | 5/2014 | An |
| 2014/0132210 A1 | 5/2014 | Partovi |
| 2014/0133279 A1 | 5/2014 | Khuri-Yakub |
| 2014/0139034 A1 | 5/2014 | Sankar et al. |
| 2014/0139039 A1 | 5/2014 | Cook et al. |
| 2014/0139180 A1 | 5/2014 | Kim et al. |
| 2014/0141838 A1 | 5/2014 | Cai et al. |
| 2014/0142876 A1 | 5/2014 | John et al. |
| 2014/0143933 A1 | 5/2014 | Low et al. |
| 2014/0145879 A1 | 5/2014 | Pan |
| 2014/0145884 A1 | 5/2014 | Dang et al. |
| 2014/0152117 A1 | 6/2014 | Sanker |
| 2014/0152251 A1 | 6/2014 | Kim et al. |
| 2014/0159651 A1 | 6/2014 | Von Novak et al. |
| 2014/0159652 A1 | 6/2014 | Hall et al. |
| 2014/0159662 A1 | 6/2014 | Furui |
| 2014/0159667 A1 | 6/2014 | Kim et al. |
| 2014/0169385 A1 | 6/2014 | Hadani et al. |
| 2014/0175893 A1 | 6/2014 | Sengupta et al. |
| 2014/0176054 A1 | 6/2014 | Porat et al. |
| 2014/0176061 A1 | 6/2014 | Cheatham, III et al. |
| 2014/0176082 A1 | 6/2014 | Visser |
| 2014/0177399 A1 | 6/2014 | Teng et al. |
| 2014/0183964 A1 | 7/2014 | Walley |
| 2014/0184148 A1 | 7/2014 | Van Der Lee et al. |
| 2014/0184155 A1 | 7/2014 | Cha |
| 2014/0184163 A1 | 7/2014 | Das et al. |
| 2014/0184170 A1 | 7/2014 | Jeong |
| 2014/0191568 A1 | 7/2014 | Partovi |
| 2014/0191818 A1 | 7/2014 | Waffenschmidt et al. |
| 2014/0194092 A1 | 7/2014 | Wanstedt et al. |
| 2014/0194095 A1 | 7/2014 | Wanstedt et al. |
| 2014/0197691 A1 | 7/2014 | Wang |
| 2014/0203629 A1 | 7/2014 | Hoffman et al. |
| 2014/0206384 A1 | 7/2014 | Kim et al. |
| 2014/0210281 A1 | 7/2014 | Ito et al. |
| 2014/0217955 A1 | 8/2014 | Lin |
| 2014/0217967 A1 | 8/2014 | Zeine et al. |
| 2014/0225805 A1 | 8/2014 | Pan et al. |
| 2014/0232320 A1 | 8/2014 | Ento July et al. |
| 2014/0232610 A1 | 8/2014 | Shigemoto et al. |
| 2014/0239733 A1 | 8/2014 | Mach et al. |
| 2014/0241231 A1 | 8/2014 | Zeine |
| 2014/0245036 A1 | 8/2014 | Oishi |
| 2014/0246416 A1 | 9/2014 | White |
| 2014/0247152 A1 | 9/2014 | Proud |
| 2014/0252813 A1 | 9/2014 | Lee et al. |
| 2014/0252866 A1 | 9/2014 | Walsh et al. |
| 2014/0265725 A1 | 9/2014 | Angle et al. |
| 2014/0265727 A1 | 9/2014 | Berte |
| 2014/0265943 A1 | 9/2014 | Angle et al. |
| 2014/0266025 A1 | 9/2014 | Jakubowski |
| 2014/0266946 A1 | 9/2014 | Bily et al. |
| 2014/0273819 A1 | 9/2014 | Nadakuduti et al. |
| 2014/0273892 A1 | 9/2014 | Nourbakhsh |
| 2014/0281655 A1 | 9/2014 | Angle et al. |
| 2014/0292090 A1 | 10/2014 | Cordeiro et al. |
| 2014/0292451 A1 | 10/2014 | Zimmerman |
| 2014/0300452 A1 | 10/2014 | Rofe et al. |
| 2014/0312706 A1 | 10/2014 | Fiorello et al. |
| 2014/0325218 A1 | 10/2014 | Shimizu et al. |

(56) References Cited

U.S. PATENT DOCUMENTS

| | | |
|---|---|---|
| 2014/0327320 A1 | 11/2014 | Muhs et al. |
| 2014/0327390 A1 | 11/2014 | Park et al. |
| 2014/0333142 A1 | 11/2014 | Desrosiers |
| 2014/0346860 A1 | 11/2014 | Aubry et al. |
| 2014/0354063 A1 | 12/2014 | Leabman et al. |
| 2014/0354221 A1 | 12/2014 | Leabman et al. |
| 2014/0355718 A1 | 12/2014 | Guan et al. |
| 2014/0368048 A1 | 12/2014 | Leabman et al. |
| 2014/0368161 A1 | 12/2014 | Leabman et al. |
| 2014/0368405 A1 | 12/2014 | Ek et al. |
| 2014/0370929 A1 | 12/2014 | Khawand et al. |
| 2014/0375139 A1 | 12/2014 | Tsukamoto |
| 2014/0375253 A1 | 12/2014 | Leabman et al. |
| 2014/0375258 A1 | 12/2014 | Arkhipenkov |
| 2014/0375261 A1 | 12/2014 | Manova-Elssibony et al. |
| 2015/0001949 A1 | 1/2015 | Leabman et al. |
| 2015/0002086 A1 | 1/2015 | Matos et al. |
| 2015/0003207 A1 | 1/2015 | Lee et al. |
| 2015/0008980 A1 | 1/2015 | Kim et al. |
| 2015/0011160 A1 | 1/2015 | Uurgovan et al. |
| 2015/0015180 A1 | 1/2015 | Miller et al. |
| 2015/0015182 A1 | 1/2015 | Brandtman et al. |
| 2015/0015192 A1 | 1/2015 | Leabman et al. |
| 2015/0015195 A1 | 1/2015 | Leabman et al. |
| 2015/0021990 A1 | 1/2015 | Myer et al. |
| 2015/0022008 A1 | 1/2015 | Leabman et al. |
| 2015/0022010 A1 | 1/2015 | Leabman et al. |
| 2015/0022194 A1 | 1/2015 | Almalki et al. |
| 2015/0023204 A1 | 1/2015 | Wil et al. |
| 2015/0028688 A1 | 1/2015 | Masaoka |
| 2015/0028694 A1 | 1/2015 | Leabman et al. |
| 2015/0028697 A1 | 1/2015 | Leabman et al. |
| 2015/0028875 A1 | 1/2015 | Irie et al. |
| 2015/0035378 A1 | 2/2015 | Calhoun et al. |
| 2015/0035709 A1 | 2/2015 | Lim |
| 2015/0035715 A1 | 2/2015 | Kim et al. |
| 2015/0039482 A1 | 2/2015 | Fuinaga |
| 2015/0041459 A1 | 2/2015 | Leabman et al. |
| 2015/0042265 A1 | 2/2015 | Leabman et al. |
| 2015/0044977 A1 | 2/2015 | Ramasamy et al. |
| 2015/0046526 A1 | 2/2015 | Bush et al. |
| 2015/0051750 A1* | 2/2015 | Kurs .................. G05F 1/625 700/298 |
| 2015/0061404 A1 | 3/2015 | Lamenza et al. |
| 2015/0076917 A1 | 3/2015 | Leabman et al. |
| 2015/0076927 A1 | 3/2015 | Leabman et al. |
| 2015/0077036 A1 | 3/2015 | Leabman et al. |
| 2015/0077037 A1 | 3/2015 | Leabman et al. |
| 2015/0091520 A1 | 4/2015 | Blum et al. |
| 2015/0091706 A1 | 4/2015 | Chemishkian et al. |
| 2015/0097442 A1 | 4/2015 | Muurinen |
| 2015/0097663 A1 | 4/2015 | Sloo et al. |
| 2015/0102764 A1 | 4/2015 | Leabman et al. |
| 2015/0102769 A1 | 4/2015 | Leabman et al. |
| 2015/0102942 A1 | 4/2015 | Houser et al. |
| 2015/0102973 A1 | 4/2015 | Hand et al. |
| 2015/0108848 A1 | 4/2015 | Joehren |
| 2015/0109181 A1 | 4/2015 | Hyde et al. |
| 2015/0115877 A1 | 4/2015 | Aria et al. |
| 2015/0115878 A1 | 4/2015 | Park |
| 2015/0116153 A1 | 4/2015 | Chen et al. |
| 2015/0128733 A1 | 5/2015 | Taylor et al. |
| 2015/0130293 A1 | 5/2015 | Hajimiri et al. |
| 2015/0137612 A1 | 5/2015 | Yamakawa et al. |
| 2015/0148664 A1 | 5/2015 | Stolka et al. |
| 2015/0155737 A1 | 6/2015 | Mayo |
| 2015/0155738 A1 | 6/2015 | Leabman et al. |
| 2015/0162662 A1 | 6/2015 | Chen et al. |
| 2015/0162751 A1 | 6/2015 | Leabman et al. |
| 2015/0162779 A1 | 6/2015 | Lee et al. |
| 2015/0171512 A1 | 6/2015 | Chen et al. |
| 2015/0171513 A1 | 6/2015 | Chen et al. |
| 2015/0171656 A1 | 6/2015 | Leabman et al. |
| 2015/0171658 A1 | 6/2015 | Manova-Elssibony et al. |
| 2015/0171931 A1 | 6/2015 | Won et al. |
| 2015/0177326 A1 | 6/2015 | Chakraborty et al. |
| 2015/0180133 A1 | 6/2015 | Hunt |
| 2015/0180249 A1 | 6/2015 | Jeon et al. |
| 2015/0180284 A1 | 6/2015 | Kang et al. |
| 2015/0181117 A1 | 6/2015 | Park et al. |
| 2015/0187491 A1 | 7/2015 | Yanagawa |
| 2015/0188352 A1 | 7/2015 | Peek et al. |
| 2015/0199665 A1 | 7/2015 | Chu |
| 2015/0201385 A1 | 7/2015 | Mercer et al. |
| 2015/0207333 A1 | 7/2015 | Baarman et al. |
| 2015/0207542 A1 | 7/2015 | Zeine |
| 2015/0222126 A1 | 8/2015 | Leabman et al. |
| 2015/0233987 A1 | 8/2015 | Von Novak, III et al. |
| 2015/0234144 A1 | 8/2015 | Cameron et al. |
| 2015/0236520 A1 | 8/2015 | Baarman |
| 2015/0244070 A1 | 8/2015 | Cheng et al. |
| 2015/0244080 A1 | 8/2015 | Gregoire |
| 2015/0244187 A1 | 8/2015 | Horie |
| 2015/0244201 A1 | 8/2015 | Chu |
| 2015/0244341 A1 | 8/2015 | Ritter et al. |
| 2015/0249484 A1 | 9/2015 | Mach et al. |
| 2015/0255989 A1 | 9/2015 | Walley et al. |
| 2015/0256097 A1 | 9/2015 | Gudan et al. |
| 2015/0260835 A1 | 9/2015 | Widmer et al. |
| 2015/0262465 A1 | 9/2015 | Pritchett |
| 2015/0263534 A1 | 9/2015 | Lee et al. |
| 2015/0263548 A1 | 9/2015 | Cooper |
| 2015/0270618 A1 | 9/2015 | Zhu et al. |
| 2015/0270622 A1 | 9/2015 | Takasaki et al. |
| 2015/0270741 A1 | 9/2015 | Leabman et al. |
| 2015/0278558 A1 | 10/2015 | Priev et al. |
| 2015/0280429 A1 | 10/2015 | Makita et al. |
| 2015/0280484 A1 | 10/2015 | Radziemski et al. |
| 2015/0288074 A1 | 10/2015 | Harper et al. |
| 2015/0288438 A1 | 10/2015 | Maltsev et al. |
| 2015/0311585 A1 | 10/2015 | Church et al. |
| 2015/0312721 A1 | 10/2015 | Singh |
| 2015/0318729 A1 | 11/2015 | Leabman |
| 2015/0326024 A1 | 11/2015 | Bell et al. |
| 2015/0326070 A1 | 11/2015 | Petras et al. |
| 2015/0326072 A1 | 11/2015 | Petras et al. |
| 2015/0326143 A1 | 11/2015 | Petras et al. |
| 2015/0327085 A1 | 11/2015 | Hadani |
| 2015/0333528 A1 | 11/2015 | Leabman |
| 2015/0333573 A1 | 11/2015 | Leabman |
| 2015/0333800 A1 | 11/2015 | Perry et al. |
| 2015/0339497 A1 | 11/2015 | Kurian |
| 2015/0340759 A1 | 11/2015 | Bridgelall et al. |
| 2015/0340903 A1 | 11/2015 | Bell et al. |
| 2015/0341087 A1 | 11/2015 | Moore et al. |
| 2015/0358222 A1 | 12/2015 | Berger et al. |
| 2015/0365137 A1 | 12/2015 | Miller et al. |
| 2015/0365138 A1 | 12/2015 | Miller et al. |
| 2016/0005068 A1 | 1/2016 | Im et al. |
| 2016/0012695 A1 | 1/2016 | Bell et al. |
| 2016/0013560 A1 | 1/2016 | Daniels |
| 2016/0013677 A1 | 1/2016 | Bell et al. |
| 2016/0013855 A1 | 1/2016 | Campos |
| 2016/0020636 A1 | 1/2016 | Khlat |
| 2016/0028403 A1 | 1/2016 | McCaughan et al. |
| 2016/0033254 A1 | 2/2016 | Zeine et al. |
| 2016/0042206 A1 | 2/2016 | Pesavento et al. |
| 2016/0043571 A1 | 2/2016 | Kesler et al. |
| 2016/0043572 A1 | 2/2016 | Cooper et al. |
| 2016/0054440 A1 | 2/2016 | Younis |
| 2016/0056635 A1 | 2/2016 | Bell |
| 2016/0056640 A1 | 2/2016 | Mao |
| 2016/0065005 A1 | 3/2016 | Won et al. |
| 2016/0079799 A1 | 3/2016 | Khlat |
| 2016/0087483 A1 | 3/2016 | Hietala et al. |
| 2016/0087486 A1 | 3/2016 | Pogorelik et al. |
| 2016/0094091 A1 | 3/2016 | Shin et al. |
| 2016/0094092 A1 | 3/2016 | Davlantes et al. |
| 2016/0099601 A1 | 4/2016 | Leabman et al. |
| 2016/0099755 A1 | 4/2016 | Leabman et al. |
| 2016/0099757 A1 | 4/2016 | Leabman et al. |
| 2016/0112787 A1 | 4/2016 | Rich |
| 2016/0126749 A1 | 5/2016 | Shichino et al. |
| 2016/0126752 A1 | 5/2016 | Vuori et al. |

(56) References Cited

U.S. PATENT DOCUMENTS

| | | |
|---|---|---|
| 2016/0126776 A1 | 5/2016 | Kim et al. |
| 2016/0141908 A1 | 5/2016 | Jakl et al. |
| 2016/0164563 A1 | 6/2016 | Khawand et al. |
| 2016/0174162 A1 | 6/2016 | Nadakuduti et al. |
| 2016/0181849 A1 | 6/2016 | Govindaraj |
| 2016/0181867 A1 | 6/2016 | Daniel et al. |
| 2016/0181873 A1 | 6/2016 | Mitcheson et al. |
| 2016/0197522 A1 | 7/2016 | Zeine et al. |
| 2016/0202343 A1 | 7/2016 | Okutsu |
| 2016/0204642 A1 | 7/2016 | Oh |
| 2016/0218545 A1 | 7/2016 | Schroeder et al. |
| 2016/0233582 A1 | 8/2016 | Piskun |
| 2016/0238365 A1 | 8/2016 | Wixey et al. |
| 2016/0240908 A1 | 8/2016 | Strong |
| 2016/0248276 A1 | 8/2016 | Hong et al. |
| 2016/0294225 A1 | 10/2016 | Blum et al. |
| 2016/0299210 A1 | 10/2016 | Zeine |
| 2016/0301240 A1 | 10/2016 | Zeine |
| 2016/0322868 A1 | 11/2016 | Akuzawa et al. |
| 2016/0323000 A1 | 11/2016 | Liu et al. |
| 2016/0336804 A1 | 11/2016 | Son et al. |
| 2016/0339258 A1 | 11/2016 | Perryman et al. |
| 2016/0344098 A1 | 11/2016 | Ming |
| 2016/0359367 A1 | 12/2016 | Rothschild |
| 2016/0380464 A1 | 12/2016 | Chin et al. |
| 2016/0380466 A1 | 12/2016 | Yang et al. |
| 2017/0005481 A1 | 1/2017 | Von Novak, III |
| 2017/0005516 A9 | 1/2017 | Leabman et al. |
| 2017/0005524 A1 | 1/2017 | Akuzawa et al. |
| 2017/0005530 A1 | 1/2017 | Zeine et al. |
| 2017/0012448 A1 | 1/2017 | Miller et al. |
| 2017/0025887 A1 | 1/2017 | Hyun et al. |
| 2017/0025903 A1 | 1/2017 | Song et al. |
| 2017/0026087 A1 | 1/2017 | Tanabe |
| 2017/0033611 A1 | 2/2017 | Shin et al. |
| 2017/0040700 A1 | 2/2017 | Leung |
| 2017/0043675 A1 | 2/2017 | Jones et al. |
| 2017/0047784 A1 | 2/2017 | Jung et al. |
| 2017/0063168 A1 | 3/2017 | Uchida |
| 2017/0077733 A1 | 3/2017 | Jeong et al. |
| 2017/0077765 A1 | 3/2017 | Bell et al. |
| 2017/0077979 A1 | 3/2017 | Papa et al. |
| 2017/0085437 A1 | 3/2017 | Condeixa et al. |
| 2017/0092115 A1 | 3/2017 | Sloo et al. |
| 2017/0110886 A1 | 4/2017 | Reynolds et al. |
| 2017/0127196 A1 | 5/2017 | Blum et al. |
| 2017/0134686 A9 | 5/2017 | Leabman |
| 2017/0141582 A1 | 5/2017 | Adolf et al. |
| 2017/0141583 A1 | 5/2017 | Adolf et al. |
| 2017/0163076 A1 | 6/2017 | Park et al. |
| 2017/0168595 A1 | 6/2017 | Sakaguchi et al. |
| 2017/0179763 A9 | 6/2017 | Leabman |
| 2017/0187228 A1 | 6/2017 | Hosseini |
| 2017/0214422 A1 | 7/2017 | Na et al. |
| 2017/0274787 A1 | 9/2017 | Salter et al. |
| 2017/0285207 A1 | 10/2017 | Shao et al. |
| 2017/0338695 A1 | 11/2017 | Port |
| 2018/0040929 A1 | 2/2018 | Chappelle |
| 2018/0048178 A1 | 2/2018 | Leabman |
| 2018/0090992 A1 | 3/2018 | Shrivastava et al. |
| 2018/0248409 A1 | 8/2018 | Johnston |
| 2018/0262050 A1 | 9/2018 | Yankowitz |
| 2018/0309314 A1 | 10/2018 | White et al. |
| 2018/0343040 A1 | 11/2018 | Luzinski et al. |
| 2019/0052979 A1 | 2/2019 | Chen et al. |
| 2019/0207570 A1 | 7/2019 | Govindaraj |
| 2019/0296586 A1 | 9/2019 | Moshfeghi |
| 2019/0393729 A1 | 12/2019 | Contopanagos et al. |
| 2019/0393928 A1 | 12/2019 | Leabman |
| 2020/0112204 A1 | 4/2020 | Hosseini et al. |
| 2020/0153117 A1 | 5/2020 | Papio-Toda et al. |
| 2020/0244104 A1 | 7/2020 | Katajamaki et al. |
| 2020/0244111 A1 | 7/2020 | Johnston et al. |

FOREIGN PATENT DOCUMENTS

| | | |
|---|---|---|
| CN | 102292896 A | 12/2011 |
| CN | 102860037 A | 1/2013 |
| CN | 103151848 A | 6/2013 |
| CN | 103348563 A | 10/2013 |
| CN | 203826555 U | 9/2014 |
| CN | 104090265 A | 10/2014 |
| CN | 104167773 A | 11/2014 |
| CN | 104347915 A | 2/2015 |
| CN | 105765821 A | 7/2016 |
| CN | 106329116 A | 1/2017 |
| CN | 103380561 B | 9/2017 |
| DE | 20016655 U1 | 2/2002 |
| DE | 102013216953 A1 | 2/2015 |
| EP | 1028482 A2 | 8/2000 |
| EP | 1081506 A1 | 3/2001 |
| EP | 2346136 A1 | 7/2011 |
| EP | 2397973 A1 | 2/2012 |
| EP | 2545635 A2 | 1/2013 |
| EP | 2747195 A1 | 6/2014 |
| EP | 3067983 A1 | 9/2016 |
| EP | 3118970 A1 | 1/2017 |
| EP | 3145052 A1 | 3/2017 |
| GB | 2404497 A | 2/2005 |
| GB | 2556620 A | 6/2018 |
| JP | 2000323916 A | 11/2000 |
| JP | 2002319816 A | 10/2002 |
| JP | 2006157586 A | 6/2006 |
| JP | 2007043432 A | 2/2007 |
| JP | 2008167017 A | 7/2008 |
| JP | 2009525715 A | 7/2009 |
| JP | 2009201328 A | 9/2009 |
| JP | 2012016171 A | 1/2012 |
| JP | 2012095226 A | 5/2012 |
| JP | 2012157167 A | 8/2012 |
| JP | 2013099249 A | 5/2013 |
| JP | 2013162624 A | 8/2013 |
| JP | 2014075927 A | 4/2014 |
| JP | 2014112063 A | 6/2014 |
| JP | 2014176131 A | 9/2014 |
| JP | 2015027345 A | 2/2015 |
| JP | 2015128349 A | 7/2015 |
| JP | 2015128370 A | 7/2015 |
| JP | WO2015177859 A1 | 4/2017 |
| KR | 20060061776 A | 6/2006 |
| KR | 20070044302 A | 4/2007 |
| KR | 100755144 B1 | 9/2007 |
| KR | 20110132059 A | 12/2011 |
| KR | 20110135540 A1 | 12/2011 |
| KR | 20120009843 A | 2/2012 |
| KR | 20120108759 A | 10/2012 |
| KR | 20130026977 A | 3/2013 |
| KR | 20140023409 A | 2/2014 |
| KR | 20140023410 A | 3/2014 |
| KR | 20140085200 A | 7/2014 |
| KR | 20150077678 A | 7/2015 |
| RU | 2658332 C1 | 6/2018 |
| WO | WO 199508125 A1 | 3/1995 |
| WO | WO 199831070 A1 | 7/1998 |
| WO | WO 199952173 A1 | 10/1999 |
| WO | WO 2000111716 A1 | 2/2001 |
| WO | WO 2003091943 A1 | 11/2003 |
| WO | WO 2004077550 A1 | 9/2004 |
| WO | WO 2006122783 A2 | 11/2006 |
| WO | WO 2007070571 A2 | 6/2007 |
| WO | WO 2008024993 A2 | 2/2008 |
| WO | WO 2008156571 A2 | 12/2008 |
| WO | WO 2010022181 A1 | 2/2010 |
| WO | WO 2010039246 A1 | 4/2010 |
| WO | WO 2010138994 A1 | 12/2010 |
| WO | WO 2011112022 A2 | 9/2011 |
| WO | WO 2012177283 A1 | 12/2012 |
| WO | WO 2013031988 A1 | 3/2013 |
| WO | WO 2013035190 A1 | 3/2013 |
| WO | WO 2013038074 A2 | 3/2013 |
| WO | WO 2013042399 A1 | 3/2013 |
| WO | WO 2013052950 A1 | 4/2013 |
| WO | WO 2013105920 A2 | 7/2013 |

(56) References Cited

FOREIGN PATENT DOCUMENTS

| | | |
|---|---|---|
| WO | WO 2013175596 A1 | 11/2013 |
| WO | WO 2014068992 A1 | 5/2014 |
| WO | WO 2014075103 A1 | 5/2014 |
| WO | WO 2014113093 A1 | 7/2014 |
| WO | WO 2014132258 A1 | 9/2014 |
| WO | WO 2014134996 A1 | 9/2014 |
| WO | WO 2014171348 A1 | 10/2014 |
| WO | WO 2014182788 A2 | 11/2014 |
| WO | WO 2014182788 A3 | 11/2014 |
| WO | WO 2014197472 A1 | 12/2014 |
| WO | WO 2014209587 A1 | 12/2014 |
| WO | WO 2015038773 A1 | 3/2015 |
| WO | WO 2015097809 A1 | 7/2015 |
| WO | WO 2015130902 A1 | 9/2015 |
| WO | WO 2015161323 A1 | 10/2015 |
| WO | WO 2016024869 A1 | 2/2016 |
| WO | WO 2016048512 A1 | 3/2016 |
| WO | WO 2016088261 A1 | 6/2016 |
| WO | WO 2016187357 A1 | 11/2016 |

OTHER PUBLICATIONS

Energous Corp., IPRP, PCT/US2014/040705, Dec. 8, 2015, 6 pgs.
Energous Corp., IPRP, PCT/US2014/045119, Jan. 12, 2016, 9 pgs.
Energous Corp., IPRP, PCT/US2014/048002, Feb. 12, 2015 8 pgs.
Energous Corp., IPRP, PCT/US2014/049669, Feb. 9, 2016, 8 pgs.
Energous Corp., IPRP, PCT/US2014/059317, Apr. 12, 2016, 10 pgs.
Energous Corp., IPRP, PCT/US2014/059340, Apr. 12, 2016, 11 pgs.
Energous Corp., IPRP, PCT/US2014/059871, Apr. 12, 2016, 9 pgs.
Energous Corp., IPRP, PCT/US2014/062661, May 3, 2016, 10 pgs.
Energous Corp., IPRP, PCT/US2014/068282, Jun. 7, 2016, 10 pgs.
Energous Corp., IPRP, PCT/US2014/068586, Jun. 14, 2016, 8 pgs.
Energous Corp., IPRP, PCT/US2015/067242, Jun. 27, 2017, 7 pgs.
Energous Corp., IPRP, PCT/US2015/067243, Jun. 27, 2017, 7 pgs.
Energous Corp., IPRP, PCT/US2015/067245, Jun. 27, 2017, 7 pgs.
Energous Corp., IPRP, PCT/US2015/067246, Jun. 27, 2017, 9 pgs.
Energous Corp., IPRP, PCT/US2015/067249, Jun. 27, 2017, 7 pgs.
Energous Corp., IPRP, PCT/US2015/067250, Mar. 30, 2016, 10 pgs.
Energous Corp., IPRP, PCT/US2015/067271, Jul. 4, 2017, 5 pgs.
Energous Corp., IPRP, PCT/US2015/067275, Jul. 4, 2017, 7 pgs.
Energous Corp., IPRP, PCT/US2015/067279, Jul. 4, 2017, 7 pgs.
Energous Corp., IPRP, PCT/US2015/067282, Jul. 4, 2017, 6 pgs.
Energous Corp., IPRP, PCT/US2015/067287, Jul. 4, 2017, 6 pgs.
Energous Corp., IPRP, PCT/US2015/067291, Jul. 4, 2017, 4 pgs.
Energous Corp., IPRP, PCT/US2015/067294, Jul. 4, 2017, 6 pgs.
Energous Corp., IPRP, PCT/US2015/067325, Jul. 4, 2017, 8 pgs.
Energous Corp., IPRP, PCT/US2015/067334, Jul. 4, 2017, 5 pgs.
Energous Corp., IPRP, PCT/US2016/068495, Jun. 26, 2018, 7 pgs.
Energous Corp., IPRP, PCT/US2016/068551, Jun. 26, 2018, 6 pgs.
Energous Corp., IPRP, PCT/US2016/068987, Jul. 3, 2018, 7 pgs.
Energous Corp., IPRP, PCT/US2016/068993, Jul. 3, 2018, 10 pgs.
Energous Corp., IPRP, PCT/US2017/046800, Feb. 12, 2019, 10 pgs.
Energous Corp., IPRP, PCT/US2017/065886, Jun. 18, 2019, 10 pgs.
Energous Corp., IPRP, PCT/US2018/012806, Jul. 9, 2019, 6 pgs.
Energous Corp., IPRP, PCT/US2018/025465, Oct. 1, 2019, 8 pgs.
Energous Corp., IPRP, PCT/US2018/031768, Nov. 12, 2019, 8 pgs.
Energous Corp., IPRP, PCT/US2018/031786, Apr. 14, 2020, 7 pgs.
Energous Corp., IPRP, PCT/US2018/039334, Dec. 24, 2019, 8 pgs.
Energous Corp., IPRP, PCT/US2018/051082, Mar. 17, 2020, 9 pgs.
Energous Corp., IPRP, PCT/US2018/058178, May 5, 2020, 7 pgs.
Energous Corp., IPRP, PCT/US2019/015820, Aug. 4, 2020, 7 pgs.
Energous Corp., IPRP, PCT/US2019/021817, Sep. 15, 2020, 7 pgs.
Energous Corp., IPRP, PCT/US2020/051694, Mar. 15, 2022, 7 pgs.
Energous Corp., ISRWO, PCT/US2014/037072, Sep. 12, 2014, 8 pgs.
Energous Corp., ISRWO, PCT/US2014/037109, Apr. 8, 2016, 12 pgs.
Energous Corp., ISRWO, PCT/US2014/037170, Sep. 15, 2014, 11 pgs.
Energous Corp., ISRWO, PCT/US2014/040648, Oct. 10, 2014, 11 pgs.
Energous Corp., ISRWO, PCT/US2014/040697, Oct. 1, 2014, 12 pgs.
Energous Corp., ISRWO, PCT/US2014/040705, Sep. 23, 2014, 8 pgs.
Energous Corp., ISRWO, PCT/US2014/041323, Oct. 1, 2014, 10 pgs.
Energous Corp., ISRWO, PCT/US2014/041342, Jan. 27, 2015, 10 pgs.
Energous Corp., ISRWO, PCT/US2014/041534, Oct. 13, 2014, 10 pgs.
Energous Corp., ISRWO, PCT/US2014/041546, Oct. 16, 2014, 12 pgs.
Energous Corp., ISRWO, PCT/US2014/041558, Oct. 10, 2014, 8 pgs.
Energous Corp., ISRWO, PCT/US2014/044810 Oct. 21, 2014, 12 pgs.
Energous Corp., ISRWO, PCT/US2014/045102, Oct. 28, 2014, 14 pgs.
Energous Corp., ISRWO, PCT/US2014/045119, Oct. 13, 2014, 11 pgs.
Energous Corp., ISRWO, PCT/US2014/045237, Oct. 13, 2014, 16 pgs.
Energous Corp., ISRWO, PCT/US2014/046941, Nov. 6, 2014, 11 pgs.
Energous Corp., ISRWO, PCT/US2014/046956, Nov. 12, 2014, 10 pgs.
Energous Corp., ISRWO, PCT/US2014/046961, Nov. 24, 2014, 16 pgs.
Energous Corp., ISRWO, PCT/US2014/047963, Nov. 7, 2014, 13 pgs.
Energous Corp., ISRWO, PCT/US2014/048002, Nov. 13, 2014, 11 pgs.
Energous Corp., ISRWO, PCT/US2014/049666, Nov. 10, 2014, 7 pgs.
Energous Corp., ISRWO, PCT/US2014/049669, Nov. 13, 2014, 10 pgs.
Energous Corp., ISRWO, PCT/US2014/049673, Nov. 18, 2014, 10 pgs.
Energous Corp., ISRWO, PCT/US2014/054891, Dec. 18, 2014, 12 pgs.
Energous Corp., ISRWO, PCT/US2014/054897, Feb. 17, 2015, 10 pgs.
Energous Corp., ISRWO, PCT/US2014/054953, Dec. 4, 2014, 7 pgs.
Energous Corp., ISRWO, PCT/US2014/055195, Dec. 22, 2014, 11 pgs.
Energous Corp., ISRWO, PCT/US2014/059317, Feb. 24, 2015, 13 pgs.
Energous Corp., ISRWO, PCT/US2014/059340, Jan. 15, 2015, 13 pgs.
Energous Corp., ISRWO, PCT/US2014/059871, Jan. 23, 2015, 12 pgs.
Energous Corp., ISRWO, PCT/US2014/062661, Jan. 27, 2015, 12 pgs.
Energous Corp., ISRWO, PCT/US2014/062672, Jan. 26, 2015, 11 pgs.
Energous Corp., ISRWO, PCT/US2014/062682, Feb. 12, 2015, 10 pgs.
Energous Corp., ISRWO, PCT/US2014/068282, Mar. 19, 2015, 13 pgs.
Energous Corp., ISRWO, PCT/US2014/068568, Mar. 20, 2015, 10 pgs.
Energous Corp., ISRWO, PCT/US2014/068586, Mar. 20, 2015, 11 pgs.
Energous Corp., ISRWO, PCT/US2015/067242, Mar. 16, 2016, 9 pgs.
Energous Corp., ISRWO, PCT/US2015/067243, Mar. 10, 2016, 11 pgs.
Energous Corp., ISRWO, PCT/US2015/067245, Mar. 17, 2016, 8 pgs.

(56) References Cited

OTHER PUBLICATIONS

Energous Corp., ISRWO, PCT/US2015/067246, May 11, 2016, 18 pgs.
Energous Corp., ISRWO, PCT/US2015/067249, Mar. 29, 2016, 8 pgs.
Energous Corp., ISRWO, PCT/US2015/067250, Mar. 30, 2016, 11 pgs.
Energous Corp., ISRWO, PCT/US2015/067271, Mar. 11, 2016, 6 pgs.
Energous Corp., ISRWO, PCT/US2015/067275, Mar. 3, 2016, 8 pgs.
Energous Corp., ISRWO, PCT/US2015/067279, Mar. 11, 2015, 13 pgs.
Energous Corp., ISRWO, PCT/US2015/067282, Jul. 5, 2016, 7 pgs.
Energous Corp., ISRWO, PCT/US2015/067287, Feb. 2, 2016, 8 pgs.
Energous Corp., ISRWO, PCT/US2015/067291, Mar. 4, 2016, 10 pgs.
Energous Corp., ISRWO, PCT/US2015/067294, Mar. 29, 2016, 7 pgs.
Energous Corp., ISRWO, PCT/US2015/067325, Mar. 10, 2016, 9 pgs.
Energous Corp., ISRWO, PCT/US2015/067334, Mar. 3, 2016, 6 pgs.
Energous Corp., ISRWO, PCT/US2016/068495, Mar. 30, 2017, 9 pgs.
Energous Corp., ISRWO, PCT/US2016/068498, May 17, 2017, 8 pgs.
Energous Corp., ISRWO, PCT/US2016/068504, Mar. 30, 2017, 8 pgs.
Energous Corp., ISRWO, PCT/US2016/068551, Mar. 17, 2017, 8 pgs.
Energous Corp., ISRWO, PCT/US2016/068565, Mar. 8, 2017, 11 pgs.
Energous Corp., ISRWO, PCT/US2016/068987, May 8, 2017, 10 pgs.
Energous Corp., ISRWO, PCT/US2016/068993, Mar. 13, 2017, 12 pgs.
Energous Corp., ISRWO, PCT/US2016/069313, Nov. 13, 2017, 10 pgs.
Energous Corp., ISRWO, PCT/US2016/069316, Mar. 16, 2017, 15 pgs.
Energous Corp., ISRWO, PCT/US2017/046800, Sep. 11, 2017, 13 pgs.
Energous Corp., ISRWO, PCT/US2017/065886, Apr. 6, 2018, 13 pgs.
Energous Corp., ISRWO, PCT/US2018/012806, Mar. 23, 2018, 9 pgs.
Energous Corp., ISRWO, PCT/US2018/025465, Jun. 22, 2018, 9 pgs.
Energous Corp., ISRWO, PCT/US2018/031768, Jul. 3, 2018, 9 pgs.
Energous Corp., ISRWO, PCT/US2018/031786, Aug. 8, 2018, 9 pgs.
Energous Corp., ISRWO, PCT/US2018/039334, Sep. 11, 2018, 9 pgs.
Energous Corp., ISRWO, PCT/US2018/051082, Dec. 12, 2018, 9 pgs.
Energous Corp., ISRWO, PCT/US2018/058178, Mar. 13, 2019, 10 pgs.
Energous Corp., ISRWO, PCT/US2018/064289, Apr. 25, 2019, 12 pgs.
Energous Corp., ISRWO, PCT/US2019/015820, May 14, 2019, 9 pgs.
Energous Corp., ISRWO, PCT/US2019/021817, Apr. 6, 2019, 11 pgs.
Energous Corp., ISRWO, PCT/US2019/039014, Oct. 4, 2019, 15 pgs.
Energous Corp., ISRWO, PCT/US2019/061445, Jan. 7, 2020, 19 pgs.
Energous Corp., ISRWO, PCT/US2020/051694, Jan. 6, 2021, 11 pgs.
Notice of Intent to Issue Reexam Certificate: 90/013,793 dated Feb. 2, 2017, 8 pgs.
Order Granting Reexamination Request, App No. 90/013,793 Aug. 31, 2016, 23 pgs.
Ossia Inc. vs Energous Corp., Declaration of Stephen B. Heppe in Support of Petition for Post-Grant Review of U.S. Pat. No. 9,124,125, PGR2016-00023, May 31, 2016, 144 pgs.
Ossia Inc. vs Energous Corp., Declaration of Stephen B. Heppe in Support of Petition for Post-Grant Review of U.S. Pat. No. 9,124,125, PGR2016-00024, May 31, 2016, 122 pgs.
Ossia Inc. vs Energous Corp., Patent Owner Preliminary Response, Sep. 8, 2016, 95 pgs.
Ossia Inc. vs Energous Corp., Petition for Post Grant Review of U.S. Pat. No. 9,124,125, May 31, 2016, 86 pgs.
Ossia Inc. vs Energous Corp., Petition for Post-Grant Review of U.S. Pat. No. 9,124,125, May 31, 2016, 92 pgs.
Ossia Inc. vs Energous Corp., PGR2016-00023-Institution Decision, Nov. 29, 2016, 29 pgs.
Ossia Inc. vs Energous Corp., PGR2016-00024-Institution Decision, Nov. 29, 2016, 50 pgs.
Ossia Inc. vs Energous Corp., PGR2016-00024-Judgement-Adverse, Jan. 20, 2017, 3 pgs.
Adamiuk et al., "Compact, Dual-Polarized UWB-Antanna, Embedded in a Dielectric," IEEE Transactions on Antenna and Propagation, IEEE Service Center, Piscataway, NJ, US vol. 56, No. 2, Feb. 1, 2010, 8 pgs.
Gill et al., "A System for Change Detection and Human Recognition in Voxel Space using the Microsoft Kinect Sensor," 2011 IEEE Applied Imagery Pattern Recognition Workshop. 8 pgs.
Han et al., Enhanced Computer Vision with Microsoft Kinect Sensor: A Review, IEEE Transactions on Cybernetics vol. 43, No. 5., pp. 1318-1334, Oct. 3, 2013.
Hsieh et al., "Development of a Retrodirective Wireless Microwave Power Transmission System", IEEE, 2003, pp. 393-396.
Leabman, "Adaptive Band-partitioning for Interference Cancellation in Communication System," Thesis Massachusetts Institute of Technology, Feb. 1997, pp. 1-70.
Li et al., "High-Efficiency Switching-Mode Charger System Design Considerations with Dynamic Power Path Management," Mar./Apr. 2012 Issue, 8 pgs.
Mao et al., "BeamStar: An Edge-Based Approach to Routing in Wireless Sensors Networks", IEEE Transactions on Mobile Computing, IEEE Service Center, Los Alamitos, CA, vol. 6, No. 11, Nov. 1, 2007, 13 pgs.
Mascarenas et al., "Experimental Studies of Using Wireless Energy Transmission for Powering Embedded Sensor Nodes," Nov. 28, 2009, Journal of Sound and Vibration, 13 pgs.
Mishra et al., "SIW-based Slot Array Antenna and Power Management Circuit for Wireless Energy Harvesting Applications", IEEE Apsursi, Jul. 2012, 2 pgs.
Nenzi et al., "U-Helix: On-Chip Short Conical Antenna", 7th European Conference on Antennas and Propagation (EUCAP), ISBN: 978-1-4673-2187-7, IEEE, Apr. 8, 2013, 5 pgs.
Qing et al., "UHF Near-Field Segmented Loop Antennas with Enlarged Interrogation Zone," 2012 IEEE International Workshop on Antenna Technology (iWAT), Mar. 1, 2012, pp. 132-135, XP055572059, ISBN: 978-1-4673-0035-3.
Singh, "Wireless Power Transfer Using Metamaterial Bonded Microstrip Antenna for Smart Grid WSN", 4th International Conference on Advances in Computing and Communications (ICACC), Aug. 27-29, 2014, 1 pg.
Smolders, "Broadband Microstrip Array Antennas", Institute of Electrical and Electronics Engineers, Digest of the Antennas and Propagation Society International Symposium, Seattle, WA, Jun. 19-24, 1994, 3 pgs.
Van Veen et al., "Beamforming: A Versatile Approach to Spatial Filtering", IEEE, ASSP Magazine, Apr. 1988, pp. 4-24.
Wei et al., "Design of a Wideband Horizontally Polarized Omnidirectional Printed Loop Antenna," IEEE Antennas and Wireless Propagation Letters, vol. 11, Jan. 3, 2012, 4 pgs.

(56) References Cited

OTHER PUBLICATIONS

Zeng et al., "A Compact Fractal Loop Rectenna for RF Energy Harvesting," IEEE Antennas And Wireless Propagation Letters, vol. 16, Jun. 26, 2017, 4 pgs.

Zhai et al., "A Practical Wireless Charging System Based on Ultra-Wideband Retro-Reflective Beamforming", 2010 IEEE Antennas and Propagation Society International Symposium, Toronto, ON, 2010, 4 pgs.

* cited by examiner

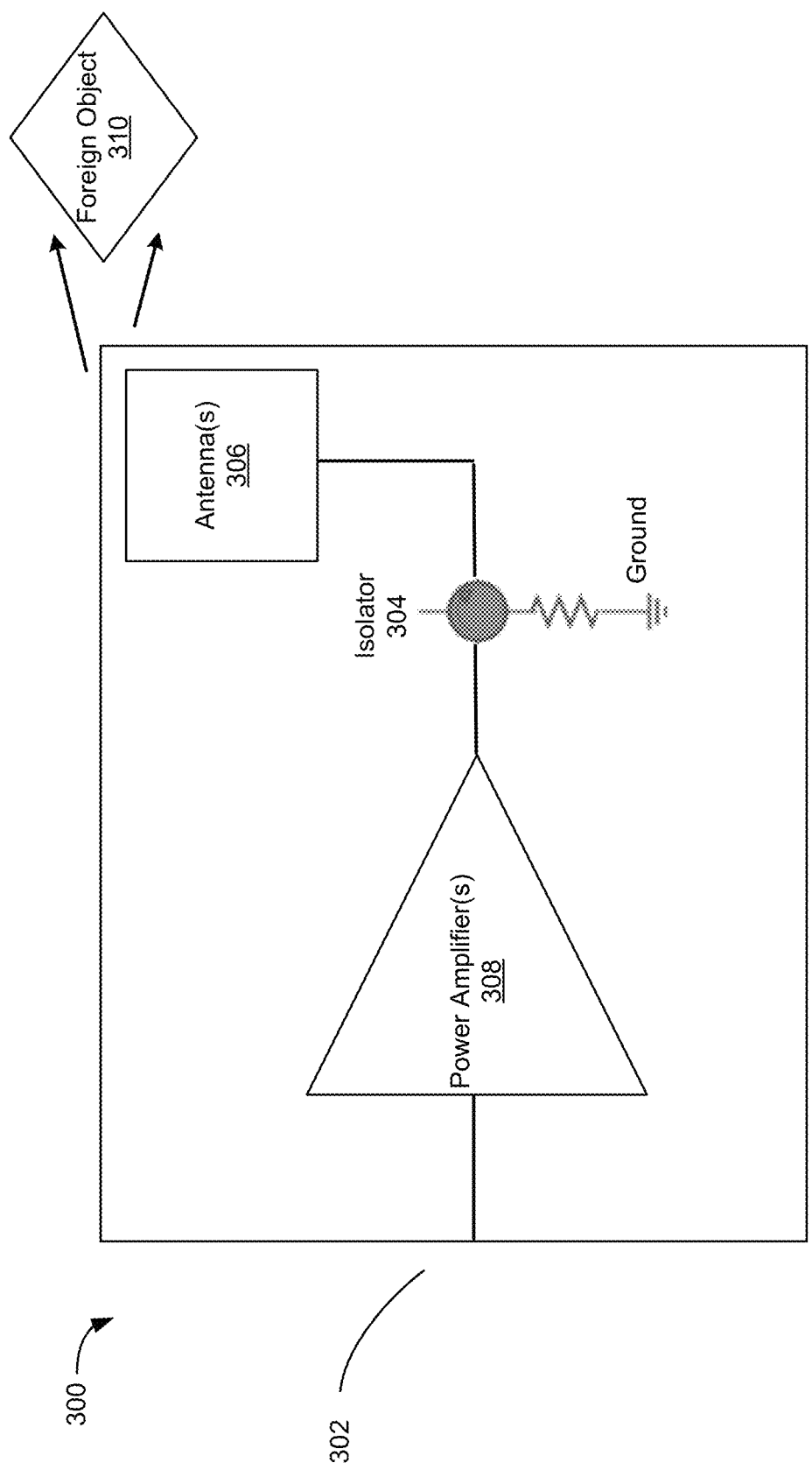

CLASSIFYING AND DETECTING FOREIGN OBJECTS USING A POWER AMPLIFIER CONTROLLER INTEGRATED CIRCUIT IN WIRELESS POWER TRANSMISSION SYSTEMS

CROSS-REFERENCE TO RELATED APPLICATIONS

This application is a continuation of U.S. patent application Ser. No. 17/026,191, filed on Sep. 19, 2020, entitled "Classifying And Detecting Foreign Objects Using A Power Amplifier Controller Integrated Circuit In Wireless Power Transmission Systems," which claims the benefit of U.S. Provisional Patent Application Ser. No. 62/903,677, entitled "Classifying and Detecting Foreign Objects Using a Power Amplifier Controller Integrated Circuit in Wireless Power Transmission Systems," filed Sep. 20, 2019, each of which is hereby incorporated by reference in its respective entirety

TECHNICAL FIELD

The present disclosure relates generally to object detection in wireless power transmission, and more particularly, to classifying and detecting foreign objects using a power amplifier controller integrated circuit in wireless power transmission systems.

BACKGROUND

Portable electronic devices, such as laptop computers, mobile phones, tablets, and other electronic devices, require frequent charging of a power-storing component (e.g., a battery) to operate. Many electronic devices require charging one or more times per day. Often, charging an electronic device requires manually connecting an electronic device to an outlet or other power source using a wired charging cable. In some cases, the power-storing component is removed from an electronic device and inserted into charging equipment. Such charging is time consuming, burdensome, and inefficient because it often requires users to carry around multiple charging cables and/or other charging devices, and frequently requires users to locate appropriate power sources, e.g. wall outlets, to charge their electronic devices. Additionally, conventional charging techniques potentially deprive a user of the ability to use the device while it is charging, and/or require the user to remain next to a wall outlet or other power source to which their electronic device or other charging equipment is connected. One way to address this issue is to wirelessly transmit power to an electronic device.

In addition, building a wireless charging system for consumer devices typically requires complicated, and often, expensive antenna components to transmit and receive wirelessly delivered power. Conventionally, it is hard for a wireless power transmitter to accurately distinguish a valid wireless power receiver that needs to be charged, versus a foreign object that does not need to be charged. Users have encountered numerous frustrating issues with some conventional charging devices, including having damages caused to objects that include magnetic strips and/or RFID chips (e.g., credits cards, security badges, passports, key fobs, and the like). Moreover, many of these conventional charging devices typically require placing the device to be charged at a specific position around the wireless power transmitter, and the device may not be moved to different positions, without interrupting or terminating the charging of the device. This results in a frustrating experience for many users as they may be unable to locate the device at the exact right position within the charging field of the wireless power transmitter in which to start charging their device, and may further end up with damages to important objects that they use on a daily basis.

Furthermore, conventional wireless charging systems do not utilize a dedicated power amplifier controller integrated circuit.

As such, it would be desirable to provide systems and methods for wirelessly transmitting and receiving power that address the above-mentioned drawbacks.

SUMMARY

As discussed above, there is a need for a wireless power transmission system that can accurately classify and detect foreign objects in the transmission field. The wireless power transmission systems described herein address these shortcomings with a variety of measurements points associated to an amplifier structure within the wireless power transmitter. Since the power amplifier is directly connected to an antenna of the transmitter, the impedance observed at the power amplifier can vary based on the objects present around the antenna. The measurement points at the power amplifier can prevent the power amplifier from damage caused in part by improper output impedances.

The wireless power transmission system described herein makes it possible to monitor the impedance presented at the power amplifier continuously during the charging operation. The presence of a foreign object can be detected instantly which can prevent damages to the system and the power amplifier when waiting for impedance detection to be stabilized.

Compared to conventional power amplifier protection and foreign object detection methods that rely on bulky isolators and couplers, the wireless power transmission system disclosed herein effectively increases the efficiency of the wireless charging system by reducing the total cost and loss in the power transmission process. The ability of transmitting wireless power waves without unnecessary lossy components also increases the overall amount of power received by the wireless power receiving system. In addition, the wireless power transmission system can distinguish a valid receiver from a foreign object without using handshake protocols between a transmitter and a receiver. Using handshake protocols requires including additional expensive (and potentially complex) components (e.g., a Bluetooth radio) on the receiver side to allow for implementing communications protocols.

The compact design of foreign object detection system in the wireless power transmission system disclosed herein includes a power amplifier controller integrated circuit to perform all the required measurements, to synchronize the turn on and shut-down of different components of the power amplifier, to adjust the conditions of the power amplifier, and to assess whether the impedance change would damage the power amplifier. In some embodiments, "synchronize" means substantially at the same time. In some embodiments, "synchronize" means within 1 millisecond of turning on or shutting down of each component.

Additional details regarding the machine learning algorithms utilized are provided in U.S. Provisional Application 62/903,674, which is incorporated by this reference herein in its entirety.

In addition, the wireless power transmission system described herein can be used in near field, mid field, and far field transmission applications. Near field usually refers to the region around the transmission antenna that is around one wavelength or less of the transmission wave. Far field usually refers to the region around the transmission antenna that is around two wavelengths or more of the transmission wave. Mid field usually refers to the region between near field and far field. For example, when the frequency of the transmission wave is 2.4 GHz, the near field range is equal or within around 0.125 m, the mid field range is from around 0.125 m to around 0.25 m, and the far field range is equal or greater than around 0.25 m. For example, when the frequency of the transmission wave is 5 GHz, the near field range is equal or within around 0.06 m, the mid field range is from around 0.06 m to around 0.12 m, and the far field range is equal or greater than around 0.12 m.

(A1) In some embodiments, a wireless power transmission system, includes a power amplifier that includes a plurality of measurement points to allow measurements of at least impedance values at each respective measurement point. The wireless power transmission system also includes a power amplifier controller integrated circuit (IC) that is configured to: receive impedance measurements at the plurality of measurement points; and provide the impedance measurements to a transmitter controller integrated circuit. In some embodiments, the transmitter controller integrated circuit is configured to: detect presence of a foreign object within a transmission range based on the provided impedance measurements, and adjust transmission of wireless power to an authorized receiving device while the presence of the foreign object is detected; and detect absence of the foreign object within the transmission range, and cause transmission of wireless power to the authorized receiving device upon determining that the foreign object is absent. In some embodiments or circumstances, the detecting presence and absence operations can be performed while the system is transmitting wireless power to an authorized receiving device (either the same receiving device referred to above or a different one), such that the system is able to monitor for the presence/absence of foreign objects during wireless-power transmission and is able to adjust power transmission upon detecting presence of a foreign object (such as lowering a power level of the wireless-power transmission or ceasing the wireless-power transmission entirely).

(A2) In some embodiments of the wireless power transmission system of A1, the power amplifier controller IC is further configured to: upon determining, based on the impedance measurements, that damage to the power amplifier is likely to occur, cause the power amplifier to shut down.

(A3) In some embodiments of the wireless power transmission system of any one of A1-A2, the power amplifier is a GaN (Gallium Nitride) power amplifier.

(A4) In some embodiments of the wireless power transmission system of any one of A1-A3, the plurality of measurement points include one or more of: voltage at an output of the power amplifier, voltages at points inside a matching network, voltage at a drain of the transistors of the power amplifier, the DC current and voltage consumed by each stage of the power amplifier, and thermistors at different stages of the power amplifier.

(A5) In some embodiments of the wireless power transmission system of any one of A1-A4, the plurality of measurement points are measured at the power amplifier during different output power levels.

(A6) In some embodiments of the wireless power transmission system of any one of A1-A5, the power amplifier includes a thermistor that measures temperature.

(A7) In some embodiments of the wireless power transmission system of any one of A1-A6, the thermistor is on a same chip as other components of the power amplifier.

(A8) In some embodiments of the wireless power transmission system of any one of A1-A7, the power amplifier controller IC manages operation of the power amplifier.

(A9) In some embodiments of the wireless power transmission system of any one of A1-A8, the power amplifier controller IC manages calibration of the power amplifier.

(A10) In some embodiments of the wireless power transmission system of any one of A1-A9, the power amplifier controller IC stores measurement information from the measurement points for subsequent analysis.

(A11) In some embodiments of the wireless power transmission system of any one of A1-A10, the power amplifier controller IC synchronizes turn-on of power amplifier bias circuits, and turn-on of power amplifier power supply network.

(A12) In some embodiments of the wireless power transmission system of any one of A1-A11, the power amplifier controller IC adjusts output power and bias conditions of the power amplifier to maintain optimum efficiency and output power.

(A13) In some embodiments of the wireless power transmission system of any one of A1-A12, the power amplifier controller IC synchronizes shut-down of various components of the power amplifier.

(A14) In some embodiments of the wireless power transmission system of any one of A1-A13, the transmission range is within a near field transmission range.

(A15) In some embodiments of the wireless power transmission system of any one of A1-A14, the transmission range extends between 0 to 6 inches away from a housing that houses the wireless power transmission system.

(A16) In some embodiments of the wireless power transmission system of any one of A1-A15, adjusting transmission of wireless power to the authorized receiving device includes ceasing the transmission of wireless power to the authorized receiving device.

(A17) In some embodiments of the wireless power transmission system of any one of A1-A16, the wireless power is transmitted as radio frequency (RF) waves.

(A18) In some embodiments, a method for detecting a foreign object in a wireless power transmission system, includes providing a power amplifier; providing a plurality of measurement points connected to the power amplifier. In some embodiments, the plurality of measurement points configured to measure at least impedance values at each respective measurement points. The method also includes performing at least impedance measurements at the plurality of measurement points; and detecting a foreign object within a transmission range of the wireless power transmission system. In some embodiments, the transmission range is in approximate to the wireless power transmission system.

(A19) In some embodiments of the method of A18, the method further includes providing a power amplifier controller integrated circuit (IC) that is configured to: perform at least the impedance measurements; and detect the foreign object within the transmission range of the wireless power transmission system.

(A20) In some embodiments of the method of A19, the power amplifier controller IC manages operation of the power amplifier.

(A21) In some embodiments of the method of any one of A18-A20, the method further includes determining whether an object within a transmission range of the wireless power transmission system is an authorized receiver or the foreign object.

(A22) In some embodiments of the method of any one of A18-A21, the plurality of measurement points include one or more of: voltage at an output of the power amplifier, voltages at points inside a matching network, voltage at a drain of the transistors of the power amplifier, the DC current and voltage consumed by each stage of the power amplifier, and thermistors at different stages of the power amplifier.

(A23) In some embodiments of the method of any one of A18-A22, the method further includes upon determining measurement results from the plurality of measurement points would damage the power amplifier, shutting down the power amplifier.

(A24) In some embodiments of the method of any one of A18-A23, the plurality of measurement points are measured at the power amplifier during different output power levels.

(A25) In some embodiments of the method of any one of A18-A24, the power amplifier includes a thermistor that measures temperature.

(A26) In some embodiments of the method of any one of A18-A25, the method further includes managing calibration of the power amplifier.

(A27) In some embodiments of the method of any one of A18-A26, the method further includes storing measurement information from the measurement points for subsequent analysis.

(A28) In some embodiments of the method of any one of A18-A27, the method further includes synchronizing turn-on of power amplifier bias circuits, and turn-on of power amplifier power supply network.

(A29) In some embodiments of the method of any one of A18-A28, the method further includes adjusting output power and bias conditions of the power amplifier to maintain optimum efficiency and output power.

(A30) In some embodiments of the method of any one of A18-A29, the method further includes comprising synchronizing shut-down of various components of the power amplifier.

(A31) In some embodiments, a power amplifier controller integrated circuit (IC) of a wireless power transmission system, includes circuit modules that are configured to: receive impedance measurements at the plurality of measurement points to allow measurements of at least impedance values at each respective measurement point connected to a power amplifier; and provide the impedance measurements to a transmitter controller integrated circuit. In some embodiments, the transmitter controller integrated circuit is configured to: detect presence of a foreign object within a transmission range based on the provided impedance measurements, and adjust transmission of wireless power to an authorized receiving device while the presence of the foreign object is detected; and detect absence of the foreign object within the transmission range, and cause transmission of wireless power to the authorized receiving device upon determining that the foreign object is absent.

(A32) In some embodiments of the power amplifier controller IC of A31, the power amplifier controller IC is further configured to: upon determining, based on the impedance measurements, that damage to the power amplifier is likely to occur, cause the power amplifier to shut down.

(A33) In some embodiments of the power amplifier controller IC of any one of A31-32, the transmission range is within a near field transmission range extending between 0 to 6 inches away from a housing that houses the wireless power transmission system.

The foreign object detection system in the wireless power transmission system disclosed herein utilizes a power amplifier controller to coordinate all the measurements and timing of the different measurement points of the power amplifier, thereby improving the transmission efficiency, gain, and overall performance of the wireless power transmission system. Furthermore, because the wireless power transmission system can detect a foreign object instantly without using bulky or lossy components, implementation of the wireless power transmission system can prevent damages to both the transmitter and the foreign object in the transmission field. Furthermore, a power amplifier controller integrated circuit is built into the power amplifier controller to support the various functionalities disclosed herein by the controller.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIG. 3 shows a diagram of a wireless transmitter including an isolator between the antenna and the power amplifier of the transmitter, according to some embodiments.

Figure 1A:
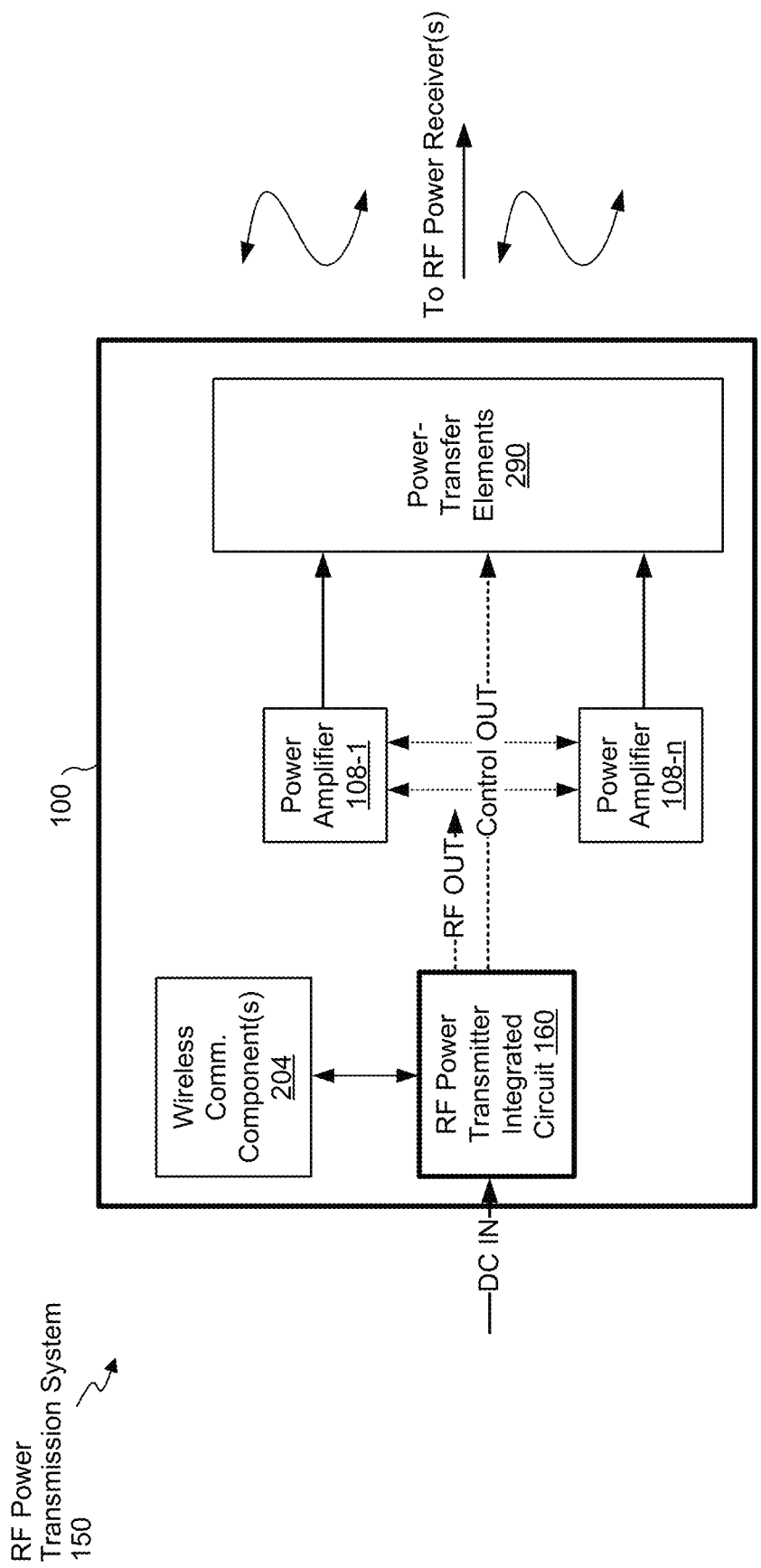
FIG. 1A is a block diagram of an RF wireless power transmission system, in accordance with some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

Various embodiments of systems and methods are described herein that address the shortcomings described above in conventional charging systems and with existing antenna designs.

FIG. 1A is a block diagram of an RF wireless power transmission system 150 in accordance with some embodiments. In some embodiments, the RF wireless power transmission system 150 includes a far-field transmitter (not shown). In some embodiments, the RF wireless power transmission system 150 includes a RF charging pad 100 (also referred to herein as a near-field (NF) charging pad 100 or RF charging pad 100). In some embodiments, the RF charging pad 100 includes an RF power transmitter integrated circuit 160 (described in more detail below). In some embodiments, the RF charging pad 100 includes one or more communications components 204 (e.g., wireless communication components, such as WI-FI or BLUETOOTH radios), discussed in more detail below with reference to FIG. 2A. In some embodiments, the RF charging pad 100 also connects to one or more power amplifier units 108-1, . . . 108-n to control operation of the one or more power amplifier units when they drive external power-transfer elements (e.g., power-transfer elements 290). In some embodiments, RF power is controlled and modulated at the RF charging pad 100 via switch circuitry as to enable the RF wireless power transmission system to send RF power to one or more wireless receiving devices via the TX antenna array 210.

In some embodiments, the communication component(s) 204 enable communication between the RF charging pad 100 and one or more communication networks. In some embodiments, the communication component(s) 204 are capable of data communications using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) custom or standard wired protocols (e.g., Ethernet, HomePlug, etc.), and/or any other suitable communication protocol, including communication protocols not yet developed as of the filing date of this document.

In some instances, the communication component(s) 204 are not able to communicate with wireless power receivers for various reasons, e.g., because there is no power available for the communication component(s) to use for the transmission of data signals or because the wireless power receiver itself does not actually include any communication component of its own. As such, it is important to design near-field charging pads that are still able to uniquely identify different types of devices and, when a wireless power receiver is detected, figure out if that wireless power receiver is authorized to receive wireless power.

Figure 1B:
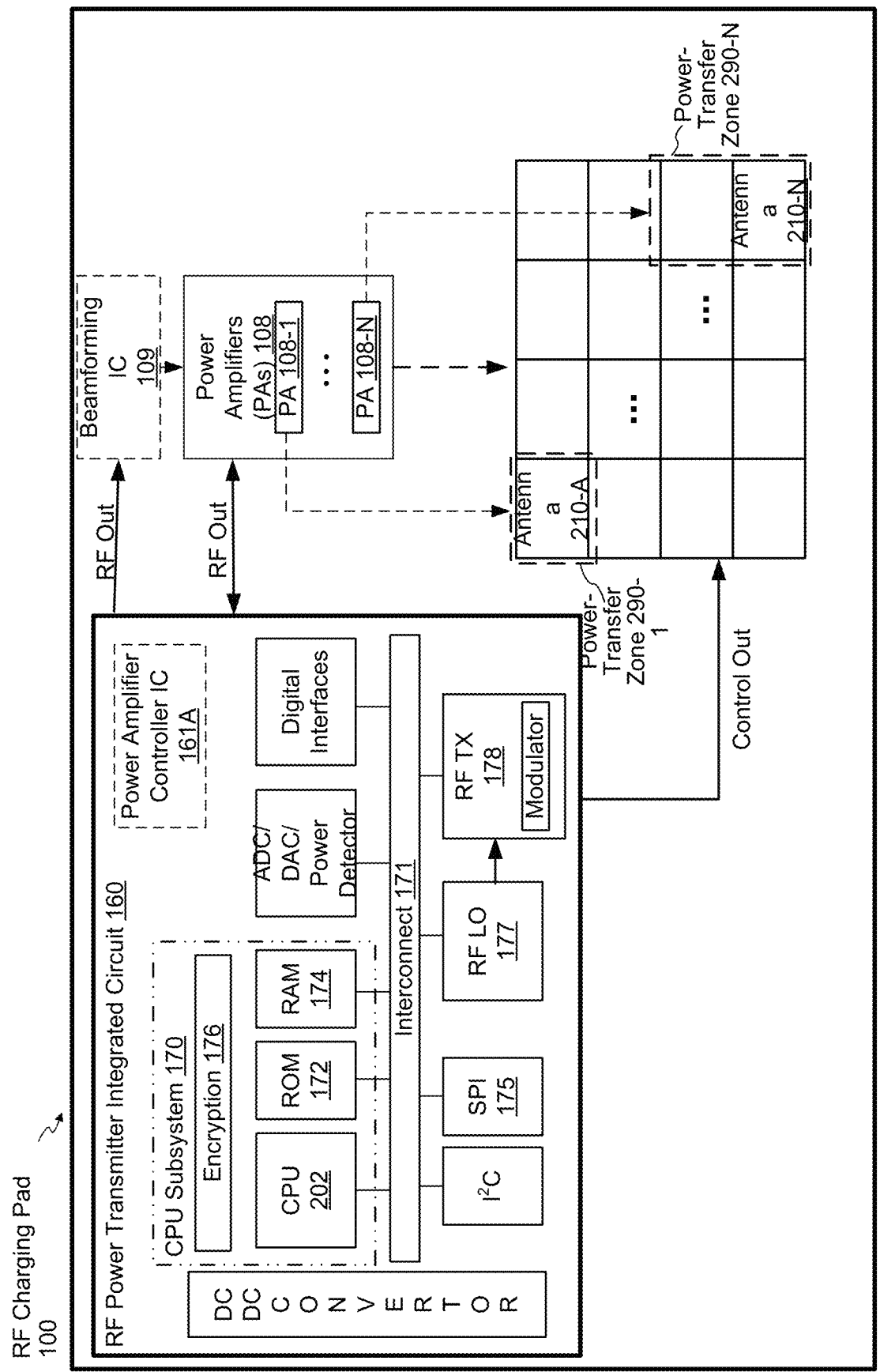
FIG. 1B is a block diagram showing components of an example RF charging pad that includes an RF power transmitter integrated circuit and antenna zones, in accordance with some embodiments.

FIG. 1B is a block diagram of the RF power transmitter integrated circuit 160 (the "integrated circuit") in accordance with some embodiments. In some embodiments, the integrated circuit 160 includes a CPU subsystem 170, an external device control interface, an RF subsection for DC to RF power conversion, and analog and digital control interfaces interconnected via an interconnection component, such as a bus or interconnection fabric block 171. In some embodiments, the CPU subsystem 170 includes a microprocessor unit (CPU) 202 with related Read-Only-Memory (ROM) 172 for device program booting via a digital control interface, e.g. an I2C port, to an external FLASH containing the CPU executable code to be loaded into the CPU Subsystem Random Access Memory (RAM) 174 (e.g., memory 206, FIG. 2A) or executed directly from FLASH. In some embodiments, the CPU subsystem 170 also includes an encryption module or block 176 to authenticate and secure communication exchanges with external devices, such as wireless power receivers that attempt to receive wirelessly delivered power from the RF charging pad 100.

In some embodiments, the RF IC 160 also includes (or is in communication with) a power amplifier controller IC 161A (PA IC) that is responsible for controlling and managing operations of a power amplifier, including, but not limited to, reading measurements of impedance at various measurement points within the power amplifier, instructing the power amplifier to amplify the RF signal, synchronizing the turn on and/or shutdown of the power amplifier, optimizing performance of the power amplifier, protecting the power amplifier, and other functions discussed. In some implementations, the measurements of impedance are used to allow the RF power transmitter device 100 (via the RF IC 160 and/or PAIC 161A) to detect foreign objects.

In some embodiments, the PAIC 161A may be on the same integrated circuit as the RF IC 160. Alternatively or additionally, the PAIC 161A may be on its own integrated circuit that is separate from (but still in communication with) the RF IC 160. In some embodiments, the PAIC 161A is on the same chip with one or more of the Power Amplifiers (PAs) 108. In some other embodiments, the PAIC 161A is on its own chip that is a separate chip from the PAs 108. In some embodiments, the PAIC 161A may be on its own integrated circuit that is separate from (but still in communication with) the RF IC 160 enables older systems to be retrofitted. In some embodiments, the PAIC 161A as a standalone chip communicatively coupled to the RF IC 160 can reduce the processing load and potential damage from over-heating. Alternatively or additionally, in some embodiments, it is more efficient to design and use two different ICs (e.g., the RF IC 160 and the PAIC 161A).

In some embodiments, executable instructions running on the CPU (such as those shown in the memory 206 in FIG. 2A and described below) are used to manage operation of the RF charging pad 100 and to control external devices through a control interface, e.g., SPI control interface 175, and the other analog and digital interfaces included in the RF power transmitter integrated circuit 160. In some embodiments, the CPU subsystem also manages operation of the RF subsection of the RF power transmitter integrated circuit 160, which includes an RF local oscillator (LO) 177 and an RF transmitter (TX) 178. In some embodiments, the RF LO 177 is adjusted based on instructions from the CPU subsystem 170 and is thereby set to different desired frequencies of operation, while the RF TX converts, amplifies, modulates the RF output as desired to generate a viable RF power level.

In the descriptions that follow, various references are made to antenna zones and power-transfer zones, which terms are used synonymously in this disclosure. In some embodiments the antenna/power-transfer zones may include antenna elements that transmit propagating radio frequency waves but, in other embodiments, the antenna/power transfer zones may instead include capacitive charging couplers that convey electrical signals but do not send propagating radio frequency waves.

In some embodiments, the RF power transmitter integrated circuit 160 provides the viable RF power level (e.g., via the RF TX 178) to an optional beamforming integrated circuit (IC) 109, which then provides phase-shifted signals to one or more power amplifiers 108. In some embodiments, the beamforming IC 109 is used to ensure that power transmission signals sent using two or more antennas 210 (e.g., each antenna 210 may be associated with a different antenna zone 290 or may each belong to a single antenna zone 290) to a particular wireless power receiver are transmitted with appropriate characteristics (e.g., phases) to ensure that power transmitted to the particular wireless power receiver is maximized (e.g., the power transmission signals arrive in phase at the particular wireless power receiver). In some embodiments, the beamforming IC 109 forms part of the RF power transmitter IC 160. In embodiments in which capacitive couplers (e.g., capacitive charging couplers 244) are used as the antennas 210, then optional beamforming IC 109 may not be included in the RF power transmitter integrated circuit 160.

In some embodiments, the RFIC 160 and/or PA IC 161A provides the viable RF power level (e.g., via the RF TX 178) directly to the one or more power amplifiers 108 and does not use the beamforming IC 109 (or bypasses the beamforming IC if phase-shifting is not required, such as when only a single antenna 210 is used to transmit power transmission signals to a wireless power receiver). In some embodiments, the PAIC 161A regulates the functionality of the PAs 108 including adjusting the viable RF power level to the PAs 108.

In some embodiments, the one or more power amplifiers 108 then provide RF signals to the antenna zones 290 (also referred to herein as "power-transfer zones") for transmission to wireless power receivers that are authorized to receive wirelessly delivered power from the RF charging pad 100. In some embodiments, each antenna zone 290 is coupled with a respective PA 108 (e.g., antenna zone 290-1 is coupled with PA 108-1 and antenna zone 290-N is coupled with PA 108-N). In some embodiments, multiple antenna zones are each coupled with a same set of PAs 108 (e.g., all PAs 108 are coupled with each antenna zone 290). Various arrangements and couplings of PAs 108 to antenna zones 290 allow the RF charging pad 100 to sequentially or selectively activate different antenna zones in order to determine the most efficient antenna zone 290 to use for transmitting wireless power to a wireless power receiver. In some embodiments, the one or more power amplifiers 108 are also in communication with the CPU subsystem 170 to allow the CPU 202 to measure output power provided by the PAs 108 to the antenna zones of the RF charging pad 100. In some embodiments, the PAs 108 may include various measurement points that allow for at least measuring impedance values that are used to enable the foreign object detection techniques described herein.

FIG. 1B also shows that, in some embodiments, the antenna zones 290 of the RF charging pad 100 may include one or more antennas 210A-N. In some embodiments, each antenna zones of the plurality of antenna zones includes one or more antennas 210 (e.g., antenna zone 290-1 includes one antenna 210-A and antenna zones 290-N includes multiple antennas 210). In some embodiments, a number of antennas included in each of the antenna zones is dynamically defined based on various parameters, such as a location of a wireless power receiver on the RF charging pad 100. In some embodiments, the antenna zones may include one or more of the meandering line antennas described in more detail below. In some embodiments, each antenna zone 290 may include antennas of different types (e.g., a meandering line antenna and a loop antenna), while in other embodiments each antenna zone 290 may include a single antenna of a same type (e.g., all antenna zones 290 include one meandering line antenna), while in still other embodiments, the antennas zones may include some antenna zones that include a single antenna of a same type and some antenna zones that include antennas of different types. In some embodiments the antenna/power-transfer zones may also or alternatively include capacitive charging couplers that convey electrical signals but do not send propagating radio frequency waves. Antenna zones are also described in further detail below.

In some embodiments, the RF charging pad 100 may also include a temperature monitoring circuit that is in communication with the CPU subsystem 170 to ensure that the RF charging pad 100 remains within an acceptable temperature range. For example, if a determination is made that the RF charging pad 100 has reached a threshold temperature, then operation of the RF charging pad 100 may be temporarily suspended until the RF charging pad 100 falls below the threshold temperature.

By including the components shown for RF power transmitter circuit 160 (FIG. 1B) on a single chip, such transmitter chips are able to manage operations at the transmitter chips more efficiently and quickly (and with lower latency), thereby helping to improve user satisfaction with the charging pads that are managed by these transmitter chips. For example, the RF power transmitter circuit 160 is cheaper to construct, has a smaller physical footprint, and is simpler to install. Furthermore, and as explained in more detail below in reference to FIG. 2A, the RF power transmitter circuit 160 may also include a secure element module 234 (e.g., included in the encryption block 176 shown in FIG. 1B) that is used in conjunction with a secure element module 282 (FIG. 2B) or a receiver 104 to ensure that only authorized receivers are able to receive wirelessly delivered power from the RF charging pad 100 (FIG. 1B).

Figure 1C:
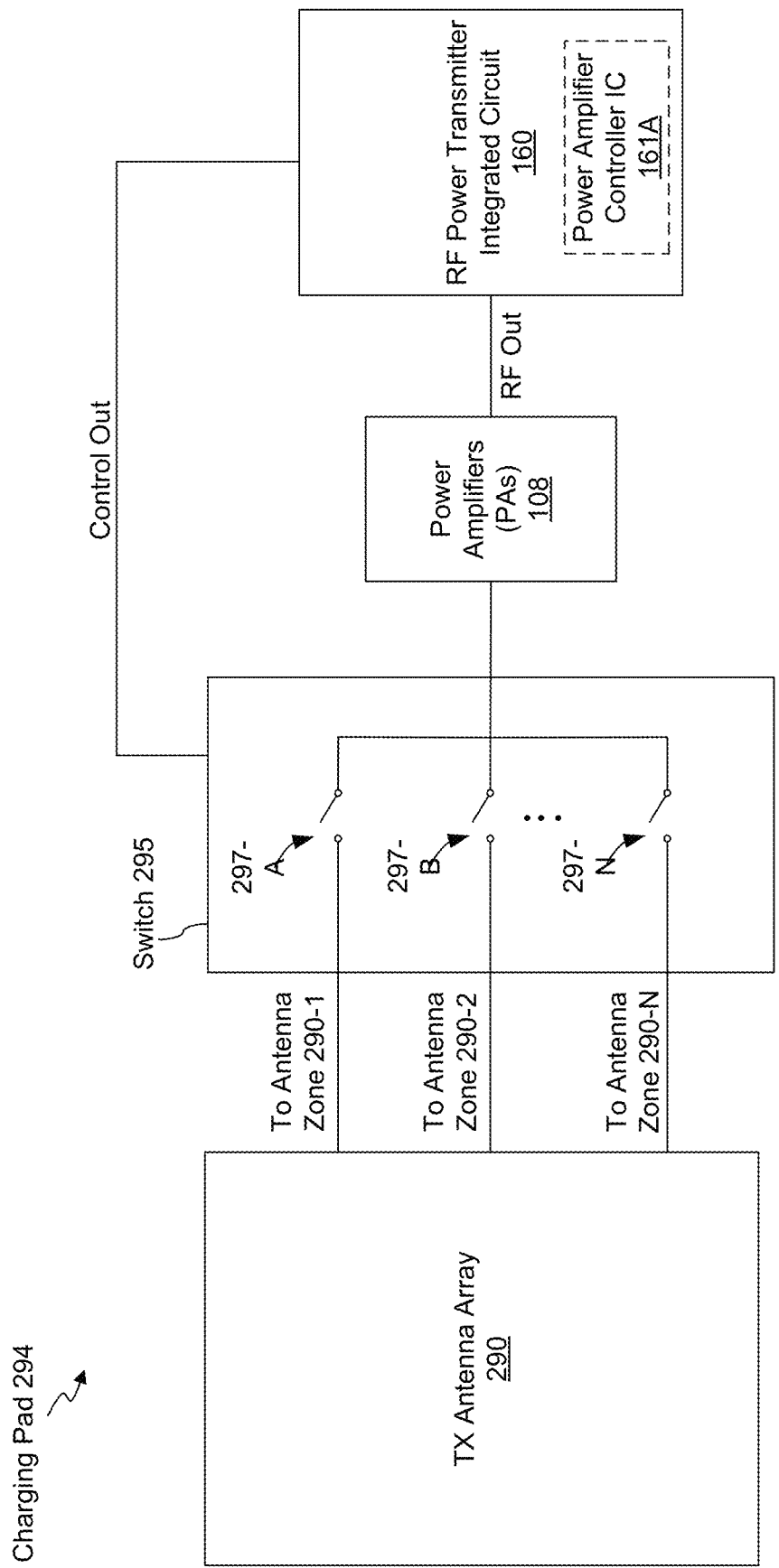
FIG. 1C is a block diagram showing components of an example RF charging pad that includes an RF power transmitter integrated circuit coupled to a switch, in accordance with some embodiments.

FIG. 1C is a block diagram of a charging pad 294 in accordance with some embodiments. The charging pad 294 is an example of the charging pad 100 (FIG. 1A), however, one or more components included in the charging pad 100 are not included in the charging pad 294 for ease of discussion and illustration.

The charging pad 294 includes an RF power transmitter integrated circuit 160, one or more power amplifiers 108, a PA IC 161A (which may be on the same or a separate IC from the RF power transmitter IC 160), and a transmitter antenna array 290 having multiple antenna zones. Each of these components is described in detail above with reference to FIGS. 1A and 1B. Additionally, the charging pad 294 includes a switch 295 (i.e., transmitter-side switch), positioned between the power amplifiers 108 and the antenna array 290, having a plurality of switches 297-A, 297-B, . . . 297-N. The switch 295 is configured to switchably connect one or more power amplifiers 108 with one or more antenna zones of the antenna array 290 in response to control signals provided by the RF power transmitter integrated circuit 160.

To accomplish the above, each switch 297 is coupled with (e.g., provides a signal pathway to) a different antenna zone of the antenna array 290. For example, switch 297-A may be coupled with a first antenna zone 290-1 (FIG. 1B) of the antenna array 290, switch 297-B may be coupled with a second antenna zone 290-2 of the antenna array 290, and so on. Each of the plurality of switches 297-A, 297-B, . . . 297-N, once closed, creates a unique pathway between a respective power amplifier 108 (or multiple power amplifiers 108) and a respective antenna zone of the antenna array 290. Each unique pathway through the switch 295 is used to selectively provide RF signals to specific antenna zones of the antenna array 290. It is noted that two or more of the plurality of switches 297-A, 297-B, . . . 297-N may be closed at the same time, thereby creating multiple unique pathways to the antenna array 290 that may be used simultaneously.

In some embodiments, the RF power transmitter integrated circuit 160 (or the PA IC 161A, or both) is (are) coupled to the switch 295 and is configured to control operation of the plurality of switches 297-A, 297-B, . . . 297-N (illustrated as a "control out" signal in FIGS. 1A and 1C). For example, the RF power transmitter integrated circuit 160 may close a first switch 297-A while keeping the other switches open. In another example, the RF power transmitter integrated circuit 160 may close a first switch 297-A and a second switch 297-B, and keep the other switches open (various other combinations and configuration are possible). Moreover, the RF power transmitter integrated circuit 160 is coupled to the one or more power amplifiers 108 and is configured to generate a suitable RF signal (e.g., the "RF Out" signal) and provide the RF signal to the one or more power amplifiers 108. The one or more power amplifiers 108, in turn, are configured to provide the RF signal to one or more antenna zones of the antenna array 290 via the switch 295, depending on which switches 297 in the switch 295 are closed by the RF power transmitter integrated circuit 160.

To further illustrate, as described in some embodiments below, the charging pad is configured to transmit test power transmission signals and/or regular power transmission signals using different antenna zones, e.g., depending on a location of a receiver on the charging pad. Accordingly, when a particular antenna zone is selected for transmitting test signals or regular power signals, a control signal is sent to the switch 295 from the RF power transmitter integrated circuit 160 to cause at least one switch 297 to close. In doing so, an RF signal from at least one power amplifier 108 can be provided to the particular antenna zone using a unique pathway created by the now-closed at least one switch 297.

In some embodiments, the switch 295 may be part of (e.g., internal to) the antenna array 290. Alternatively, in some embodiments, the switch 295 is separate from the antenna array 290 (e.g., the switch 295 may be a distinct component, or may be part of another component, such as the power amplifier(s) 108). It is noted that any switch design capable of accomplishing the above may be used, and the design of the switch 295 illustrated in FIG. 1C is merely one example.

Figure 2A:
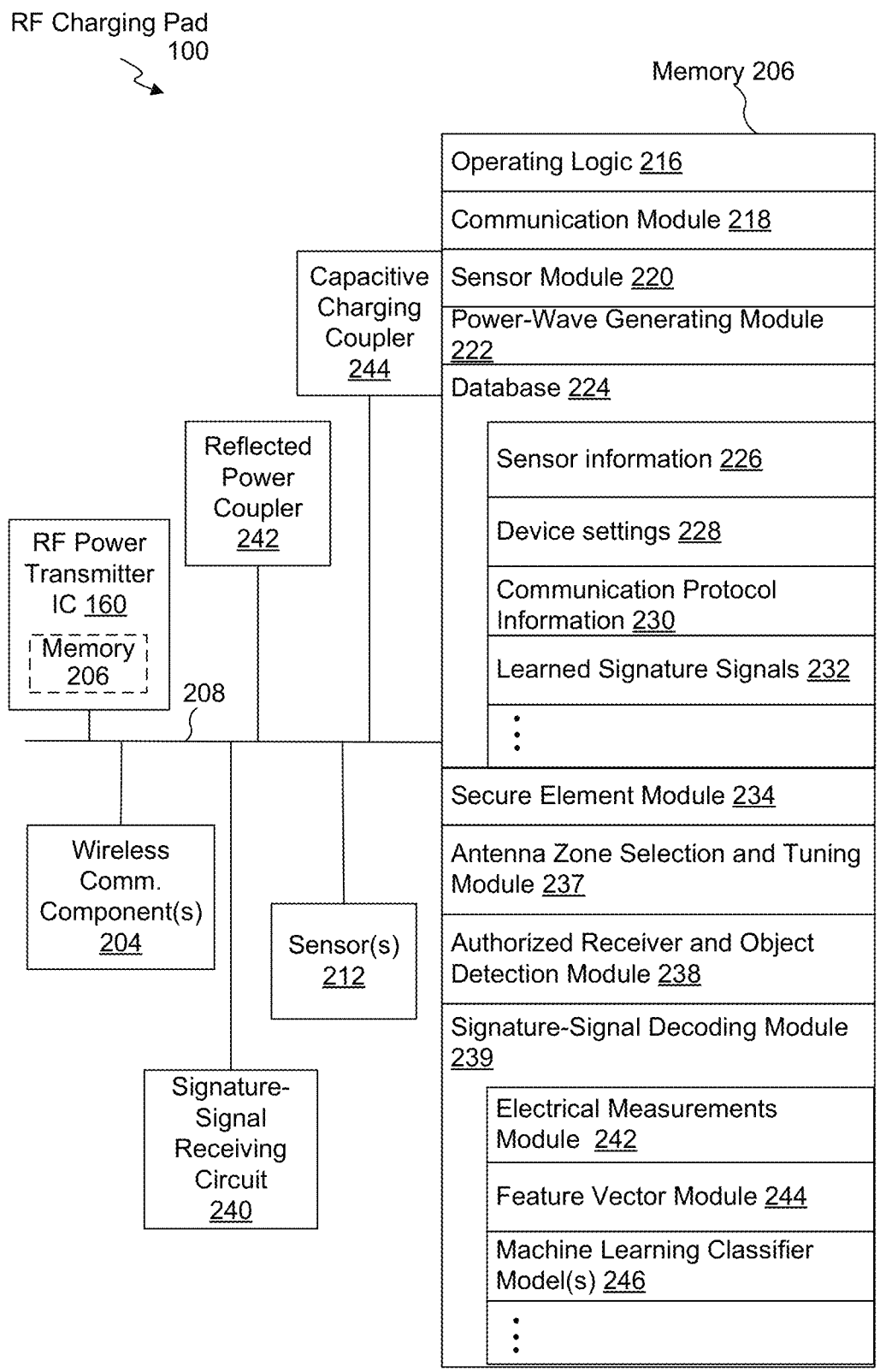
FIG. 2A is a block diagram illustrating an example RF charging pad, in accordance with some embodiments.

FIG. 2A is a block diagram illustrating certain components of an RF charging pad 100 (also sometimes called a transmitter, power transmitter, or wireless power transmitter) in accordance with some embodiments. In some embodiments, the RF charging pad 100 includes an RF power transmitter IC 160 (and the components included therein, such as those described above in reference to FIGS. 1A-1B), memory 206 (which may be included as part of the RF power transmitter IC 160, such as nonvolatile memory 206 that is part of the CPU subsystem 170), and one or more communication buses 208 for interconnecting these components (sometimes called a chipset). In some embodiments, the RF charging pad 100 includes one or more sensor(s) 212 (discussed below). In some embodiments, the RF charging pad 100 includes one or more output devices such as one or more indicator lights, a sound card, a speaker, a small display for displaying textual information and error codes, etc. In some embodiments, the RF charging pad 100 includes a location detection device, such as a GPS (global positioning satellite) or other geo-location receiver, for determining the location of the RF charging pad 100.

In some embodiments, the one or more sensor(s) 212 include one or more thermal radiation sensors, ambient temperature sensors, humidity sensors, IR sensors, occupancy sensors (e.g., RFID sensors), ambient light sensors, motion detectors, accelerometers, and/or gyroscopes.

In some embodiments, the RF charging pad 100 further includes a signature-signal receiving circuit 240, a reflected power coupler 242, and a capacitive charging coupler 244.

The memory 206 includes high-speed random access memory, such as DRAM, SRAM, DDR SRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 206, or alternatively the non-volatile memory within memory 206, includes a non-transitory computer-readable storage medium. In some embodiments, the memory 206, or the non-transitory computer-readable storage medium of the memory 206, stores the following programs, modules, and data structures, or a subset or superset thereof:

Operating logic 216 including procedures for handling various basic system services and for performing hardware dependent tasks;

Communication module 218 for coupling to and/or communicating with remote devices (e.g., remote sensors, transmitters, receivers, servers, mapping memories, etc.) in conjunction with wireless communication component(s) 204;

Sensor module 220 for obtaining and processing sensor data (e.g., in conjunction with sensor(s) 212) to, for example, determine the presence, velocity, and/or positioning of object in the vicinity of the RF charging pad 100;

Powerwave generating module 222 for generating and transmitting power transmission signals (e.g., in conjunction with antenna zones 290 and the antennas 210 respectively included therein), including but not limited to, forming pocket(s) of energy at given locations. Powerwave generating module 222 may also be used to modify values of transmission characteristics (e.g., power level (i.e., amplitude), phase, frequency, etc.) used to transmit power transmission signals by individual antenna zones;

Database 224, including but not limited to:

Sensor information 226 for storing and managing data received, detected, and/or transmitted by one or more sensors (e.g., sensors 212 and/or one or more remote sensors);

Device settings 228 for storing operational settings for the RF charging pad 100 and/or one or more remote devices;

Communication protocol information 230 for storing and managing protocol infor-mation for one or more protocols (e.g., custom or standard wireless protocols, such as ZigBee, Z-Wave, etc., and/or custom or standard wired protocols, such as Ethernet); and Learned signature signals 232 for a variety of different wireless power receivers and other objects (which are not wireless power receivers).

A secure element module 234 for determining whether a wireless power receiver is authorized to receive wirelessly delivered power from the RF charging pad 100;

An antenna zone selecting and tuning module 237 for coordinating a process of transmitting test power transmission signals with various antenna zones to determine which antenna zone or zones should be used to wirelessly deliver power to various wireless power receivers (as is explained in more detail below in reference to FIGS. 9A-9B of PCT Patent Application No. PCT/US17/65886 incorporated by reference);

An authorized receiver and object detection module 238 used for detecting various signature signals from wireless power receivers and from other objects, and then determining appropriate actions based on the detecting of the various signature signals (as is described in more detail below in reference to FIGS. 9A-9B of PCT Patent Application No. PCT/US17/65886); and A signature-signal decoding module 239 used to decode the detected signature signals and deter-mine message or data content. In some embodiments, the module 239 includes an electrical measurement module 242 to collect electrical measurements from one or more receivers (e.g., in response to power beacon signals), a feature vector module 244 to compute feature vectors based on the electrical measurements collected by the electrical measurement module 239, and/or machine learning classifier model(s) 246 that are trained to detect and/or classify foreign objects.

Each of the above-identified elements (e.g., modules stored in memory 206 of the RF charging pad 100) is optionally stored in one or more of the previously mentioned memory devices, and corresponds to a set of instructions for performing the function(s) described above. The above-identified modules or programs (e.g., sets of instructions) need not be implemented as separate software programs, procedures, or modules, and thus various subsets of these modules are optionally combined or otherwise rearranged in various embodiments. In some embodiments, the memory 206, optionally, stores a subset of the modules and data structures identified above.

Figure 2B:
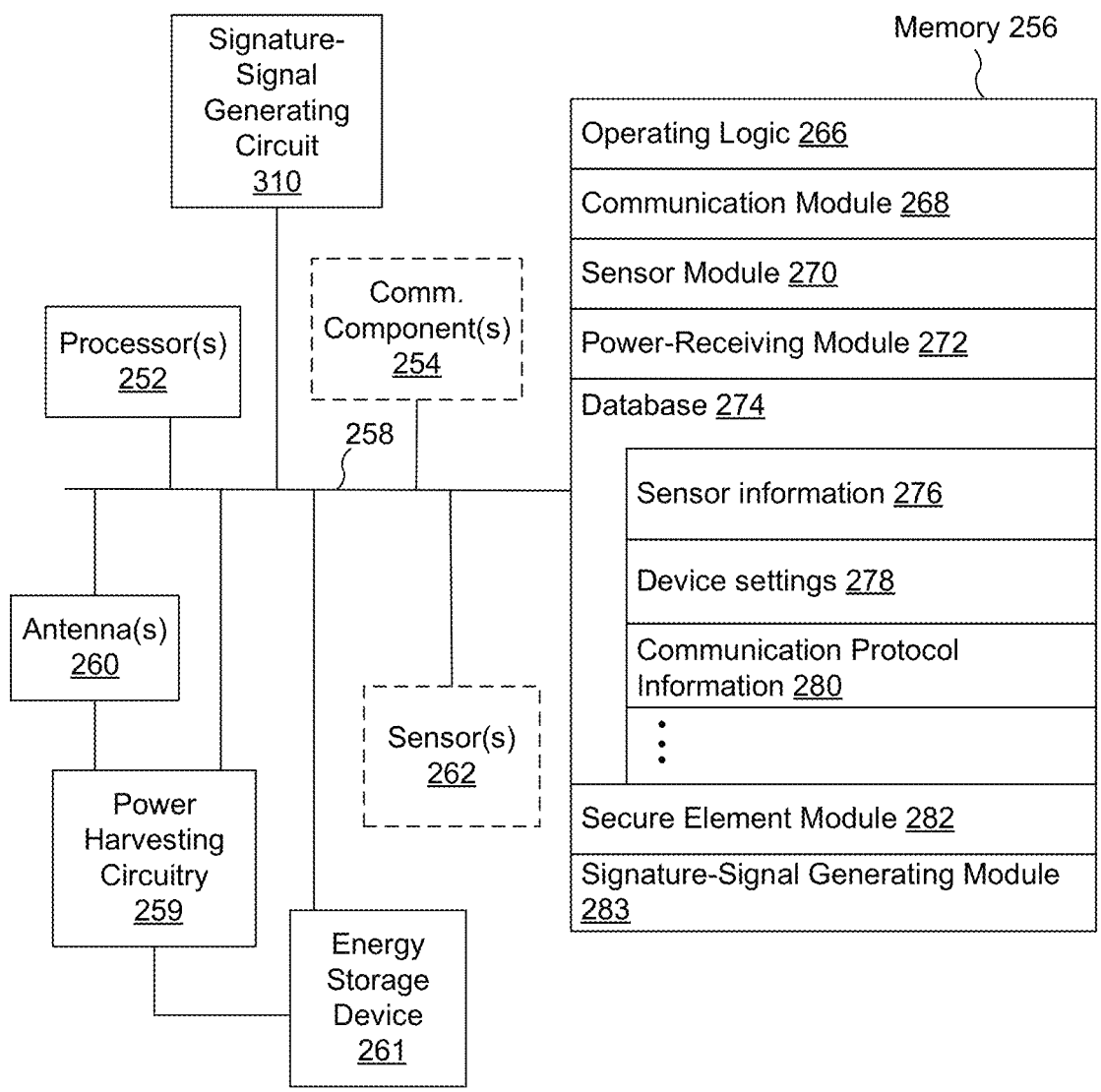
FIG. 2B is a block diagram illustrating an example receiver device, in accordance with some embodiments.

FIG. 2B is a block diagram illustrating a representative receiver device 104 (also sometimes called a receiver, power receiver, or wireless power receiver) in accordance with some embodiments. In some embodiments, the receiver device 104 includes one or more processing units (e.g., CPUs, ASICs, FPGAs, microprocessors, and the like) 252, one or more communication components 254, memory 256, antenna(s) 260, power harvesting circuitry 259, and one or more communication buses 258 for interconnecting these components (sometimes called a chipset). In some embodiments, the receiver device 104 includes one or more sensor(s) 262 such as the one or sensors 212 described above with reference to FIG. 2A. In some embodiments, the receiver device 104 includes an energy storage device 261 for storing energy harvested via the power harvesting circuitry 259. In various embodiments, the energy storage device 261 includes one or more batteries, one or more capacitors, one or more inductors, and the like.

In some embodiments, the power harvesting circuitry 259 includes one or more rectifying circuits and/or one or more power converters. In some embodiments, the power harvesting circuitry 259 includes one or more components (e.g., a power converter) configured to convert energy from power waves and/or energy pockets to electrical energy (e.g., electricity). In some embodiments, the power harvesting circuitry 259 is further configured to supply power to a coupled electronic device, such as a laptop or phone. In some embodiments, supplying power to a coupled electronic device include translating electrical energy from an AC form to a DC form (e.g., usable by the electronic device).

In some embodiments, the signature-signal generating circuit 310 includes one or more components as discussed with reference to FIGS. 3A-3D of U.S. patent application Ser. No. 16/045,637 incorporated by reference.

In some embodiments, the antenna(s) 260 include one or more of the meandering line antennas that are described in further detail in PCT Patent Application No. PCT/US17/65886 incorporated by reference (e.g., with reference to FIGS. 6A-7D, and elsewhere). In some embodiments, the antenna(s) 260 may also or alternatively include capacitive charging couplers (such as those described with reference to FIGS. 5A-5B of U.S. patent application Ser. No. 16/045,637 incorporated by reference) that correspond in structure to those that may be present in a near-field charging pad.

In some embodiments, the receiver device 104 includes one or more output devices such as one or more indicator lights, a sound card, a speaker, a small display for displaying textual information and error codes, etc. In some embodiments, the receiver device 104 includes a location detection device, such as a GPS (global positioning satellite) or other geo-location receiver, for determining the location of the receiver device 103.

In various embodiments, the one or more sensor(s) 262 include one or more thermal radiation sensors, ambient temperature sensors, humidity sensors, IR sensors, occupancy sensors (e.g., RFID sensors), ambient light sensors, motion detectors, accelerometers, and/or gyroscopes. It is noted that the foreign object detection techniques disclosed herein operate without relying on the one or more sensor(s) 262.

The communication component(s) 254 enable communication between the receiver 104 and one or more communication networks. In some embodiments, the communication component(s) 254 are capable of data communications using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) custom or standard wired protocols (e.g., Ethernet, HomePlug, etc.), and/or any other suitable communication protocol, including communication protocols not yet developed as of the filing date of this document.

It is noted that the foreign object detection techniques disclosed herein operate without relying on the communication component(s) 254.

The communication component(s) 254 include, for example, hardware capable of data communications using any of a variety of custom or standard wireless protocols (e.g., IEEE 802.15.4, Wi-Fi, ZigBee, 6LoWPAN, Thread, Z-Wave, Bluetooth Smart, ISA100.11a, WirelessHART, MiWi, etc.) and/or any of a variety of custom or standard wired protocols (e.g., Ethernet, HomePlug, etc.), or any other suitable communication protocol, including communication protocols not yet developed as of the filing date of this document.

The memory 256 includes high-speed random access memory, such as DRAM, SRAM, DDR SRAM, or other random access solid state memory devices; and, optionally, includes non-volatile memory, such as one or more magnetic disk storage devices, one or more optical disk storage devices, one or more flash memory devices, or one or more other non-volatile solid state storage devices. The memory 256, or alternatively the non-volatile memory within memory 256, includes a non-transitory computer-readable storage medium. In some embodiments, the memory 256, or the non-transitory computer-readable storage medium of the memory 256, stores the following programs, modules, and data structures, or a subset or superset thereof:

Operating logic 266 including procedures for handling various basic system services and for performing hardware dependent tasks;

Communication module 268 for coupling to and/or communicating with remote devices (e.g., remote sensors, transmitters, receivers, servers, mapping memories, etc.) in conjunction with communication component(s) 254;

Sensor module 270 for obtaining and processing sensor data (e.g., in conjunction with sensor(s) 262) to, for example, determine the presence, velocity, and/or positioning of the receiver 103, a RF charging pad 100, or an object in the vicinity of the receiver 103;

Wireless power-receiving module 272 for receiving (e.g., in conjunction with antenna(s) 260 and/or power harvesting circuitry 259) energy from, capacitively-conveyed electrical signals, power waves, and/or energy pockets; optionally converting (e.g., in conjunction with power harvesting circuitry 259) the energy (e.g., to direct current); transferring the energy to a coupled electronic device; and optionally storing the energy (e.g., in conjunction with energy storage device 261);

Database 274, including but not limited to:
Sensor information 276 for storing and managing data received, detected, and/or transmitted by one or more sensors (e.g., sensors 262 and/or one or more remote sensors);
Device settings 278 for storing operational settings for the receiver 103, a coupled electronic device, and/or one or more remote devices; and
Communication protocol information 280 for storing and managing protocol information for one or more protocols (e.g., custom or standard wireless protocols, such as ZigBee, Z-Wave, etc., and/or custom or standard wired protocols, such as Ethernet);

A secure element module 282 for providing identification information to the RF charging pad 100 (e.g., the RF charging pad 100 uses the identification information to determine if the wireless power receiver 104 is authorized to receive wirelessly delivered power); and A signature-signal generating module 283 used to control (in conjunction with the signature-signal generating circuit 310) various components to cause impedance changes at the antenna(s) 260 and/or power harvesting circuitry 259 to then cause changes in reflected power as received by a signature-signal receiving circuit 240.

Each of the above-identified elements (e.g., modules stored in memory 256 of the receiver 104) is optionally stored in one or more of the previously mentioned memory devices, and corresponds to a set of instructions for performing the function(s) described above. The above-identified modules or programs (e.g., sets of instructions) need not be implemented as separate software programs, procedures, or modules, and thus various subsets of these modules are optionally combined or otherwise rearranged in various embodiments. In some embodiments, the memory 256, optionally, stores a subset of the modules and data structures identified above. Furthermore, the memory 256, optionally, stores additional modules and data structures not described above, such as an identifying module for identifying a device type of a connected device (e.g., a device type for an electronic device that is coupled with the receiver 104).

In some embodiments, the near-field charging pads disclosed herein may use adaptive loading techniques to optimize power transfer. Such techniques are described in detail in commonly-owned and incorporated-by-reference PCT Application No. PCT/US17/65886 and, in particular, in reference to FIGS. 3A-8 and 12-15 of PCT Application No. PCT/US17/65886.

The performance of a power amplifier has a significant dependence on the load observed at their output. Since an antenna is a passive network, when the power amplifier is directly connected to the antenna, the impedance observed can significantly vary depending on the environment and/or the objects surrounding the antenna. However, improper impedances at the output of the power amplifier can potentially damage the power amplifier. Detection of the impedance can determine whether there is a valid receiver that needs to be charged by the transmitter or a foreign object that is not supposed to be charged by the transmitter. In addition, detection of the impedance can further inform the power transmitter system if it is necessary to prevent damages to the power amplifier by shutting down the wireless power transmitter or relocating the wireless power transmitter.

Figure 4:
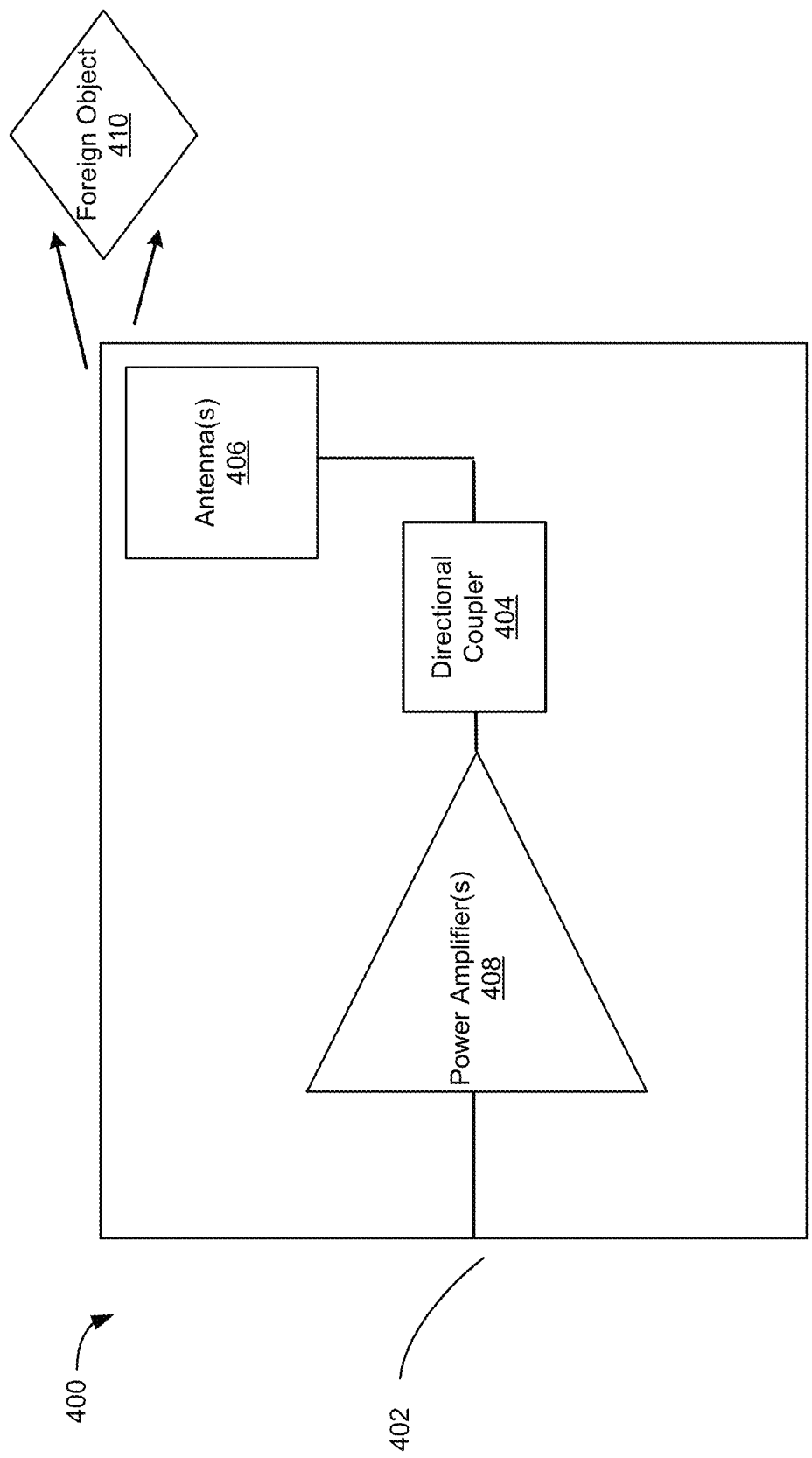
FIG. 4 shows a diagram of a wireless transmitter including a directional coupler between the antenna and the power amplifier of the transmitter, according to some embodiments.

Various ways of protecting power amplifiers are possible, examples of which are illustrated in FIG. 3 and FIG. 4.

FIG. 3 shows a diagram 300 of a wireless transmitter 302 including an isolator 304 between the antenna 306 and the power amplifier 308, according to some embodiments. FIG. 4 shows a diagram 400 of a wireless transmitter 402 including a directional coupler 404 between the antenna 406 and the power amplifier 408, according to some embodiments.

For example, as illustrated in FIG. 3, one way of protecting the power amplifier 308 of a wireless power transmitter 302 is to place an isolator 304 between the antenna 306 and the power amplifier 308. The isolator 304 can isolate the power amplifier 308 from the impedance change from the antenna 306 especially when a foreign object 310 approaches the antenna 306. However, this method cannot be used to find the impedance at the output of the power amplifier 308. The isolator 304 can be bulky and it adds to the total cost to the wireless power transmission system. The efficiency of the wireless power transmission also decreases because of the additional loss caused by the isolator 304.

In another example, as illustrated in FIG. 4, another way of protecting the power amplifier 408 of a wireless power transmitter 400 is to detect the forward and reflected powers using a directional coupler 404. The directional coupler 404 can detect a mismatch at the output of the power amplifier 408 and find the closeness of the impedance to the expected load, especially when a foreign object 410 approaches the antenna 406. However, this method cannot be used to find the impedance at the output of the power amplifier 408. The directional coupler 404 can be bulky and it adds to the total cost to the wireless power transmission system. The efficiency of the wireless power transmission also decreases because of the additional loss caused by the directional coupler 404.

In another example, Q detection method is implemented to protect the power amplifier of a wireless power transmitter. Q detection methods include time domain and frequency domain detections. In the time domain detection method, a plurality of analog "pings" are sent from the transmitter, and time domain decay of coil resonance is analyzed. In the frequency domain method, analyzing amplitude of transmitter waveform requires frequency sweep. However, Q detection methods can only be done in advance of charging. In addition, each receiver needs to store its own "expected values" for time domain decay or frequency response.

In another example, power balance method is used to protect the power amplifier of a wireless power transmitter. In the power balance method, losses are continuously monitored during charging. If the losses detected is greater than a predetermined threshold, a foreign object may be present in proximity to the antenna of the transmitter. However, the determination of the presence of the foreign object can be fooled by load transients and/or receiver motion. In addition, it takes time to calculate steady state losses, during that time foreign object and/or the power amplifier could be heated or damaged.

In another example, in band communications method is used to protect the power amplifier of a wireless power transmitter. In the in band communications method, a transmitter sends queries out. A receiver device sends back an acknowledgement signal once it receives the query from the transmitter. In that case, a transmitter only transmit wireless power waves to receivers which sends back the acknowledgement. This method requires more complex receiver device to implement the communications protocol. However, this method does not work if a valid receiver has little influence on the transmitter impedance (e.g. in the nearfield or midfield range).

Compared to the above several methods of protecting the power amplifiers, the present disclosure provides an impedance-based method for protecting power amplifiers that has many advantages. For example, in the impedance-based method, no handshaking protocol is required. Therefore, no complex receiver-side components are necessary to implement the communication protocol. In addition, the impedance-based method enables continuous operation during charging which prevents damages to the transmitter and/or to the foreign object when the system is waiting to calculate loss. The continuous operation also provides instant responds to the presence of the foreign objects especially when there is a change in the relative positions of the wireless power transmitter and wireless power receiver.

Figure 5:
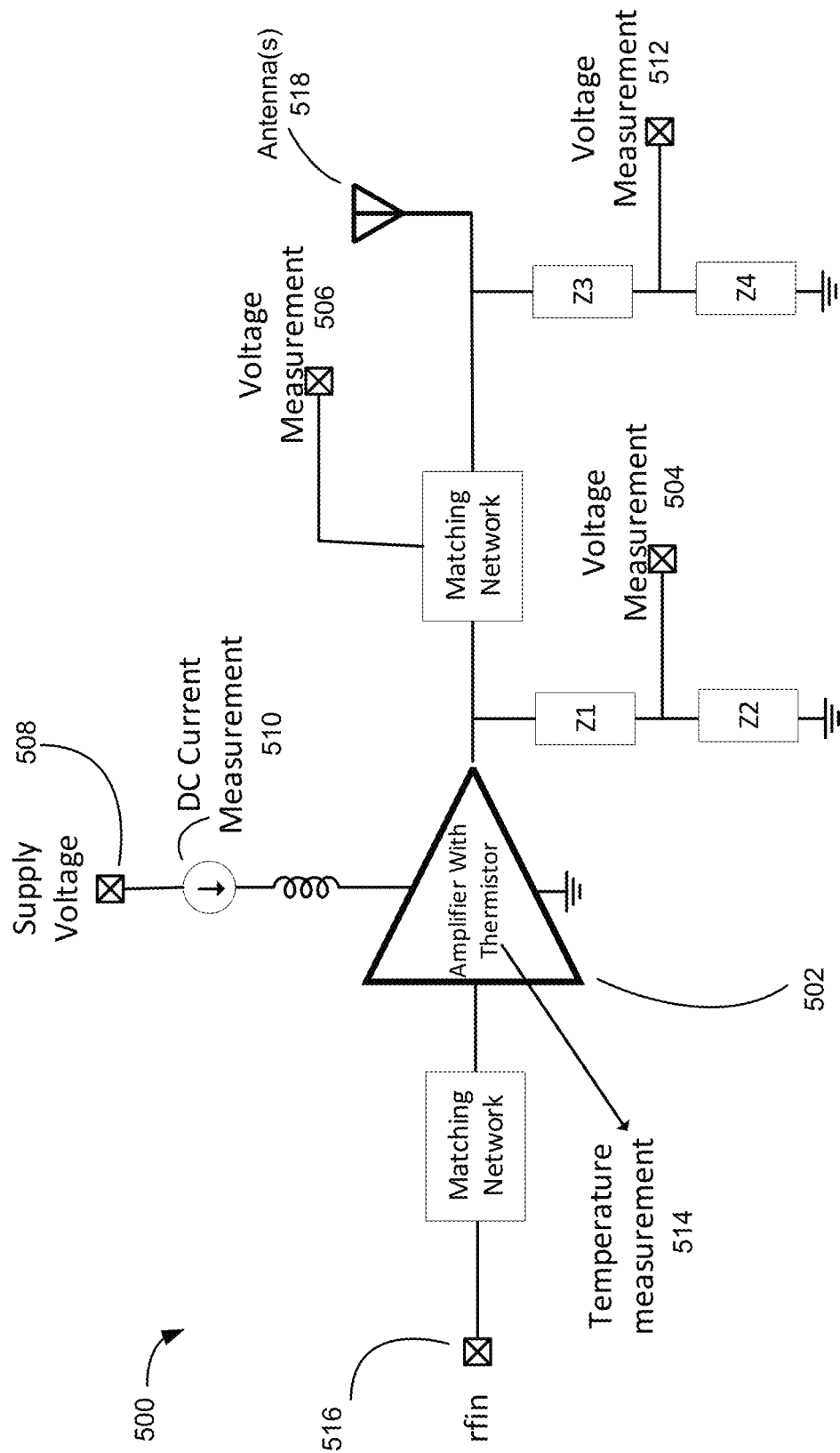
FIG. 5 illustrates arrangements of measurement points within the wireless power transmitter to detect impedances presented to the power amplifier, according to some embodiments.

FIG. 5 illustrates arrangements of measurement points within the wireless power transmitter 500 to detect impedances and/or temperatures presented to the power amplifier 502, according to some embodiments.

In some embodiments, to protect against known damaging impedances, a variety of measurement points are placed within and around the power amplifier 502. Examples of measurement points include the voltage at the output of the amplifier 504, voltages at points inside the matching network 506 and 516, the voltage at the drain of the transistors 508. In some embodiments, the DC current and voltage consumed by each stage of the amplifier, such as the DC current measurement 510, voltage measurement 512, and the thermistors for temperature measurement at different stages of the amplifier, such as 514.

In some embodiments, an impedance matching network 506 (e.g., a transmission line) may be integrally formed on the antenna structure 518 of the transmitter 500. The matching network 506 can provide inductive/capacitive impedance matching between the power amplifier, and the antenna structure 518.

In some embodiments, a high impedance network is used to reduce the impact on the performance of the impedance detection. In some embodiments, there is no need for an isolator or coupler in this system.

In some embodiments, the measurements must be timed precisely with the power amplifier turn-on so that: the power amplifier 502 does not remain on for too long if a foreign object or damaging conditions are detected; and the measurements are not reading temporary transient conditions associated with start-up or shut-down which may otherwise confound the impedance measurement.

In some embodiments, measurements can also be taken at multiple power amplifier output power levels. For example, a set of measurement results can be taken at a low power amplifier output power level, at a median power amplifier output level, and at a high power amplifier output level.

Figure 6:
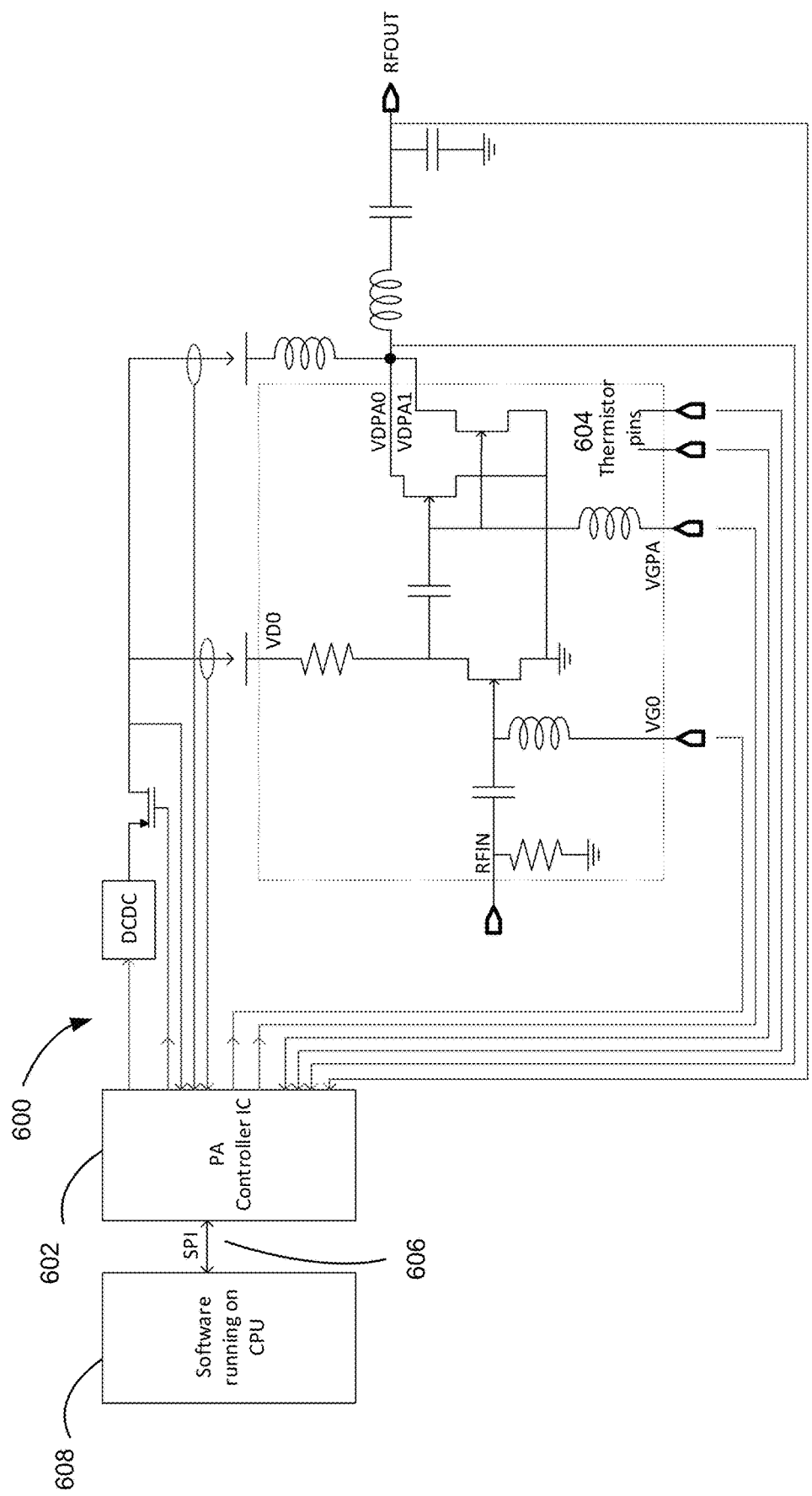
FIG. 6 schematically illustrates a system diagram of an impedance measurement system comprising a power amplifier controller Integrated Circuit (IC) and its related circuits and modules, according to some embodiments.

FIG. 6 schematically illustrates a system diagram of an impedance measurement system 600 within a wireless power transmitting system comprising a power amplifier controller Integrated Circuit (IC) 602 (analogous to the PA IC 161A) and its related circuits and modules, according to some embodiments.

In some embodiments, a power amplifier controller IC 602 can protect against impedances known to damage the power amplifier. In some embodiments, the power amplifier controller IC 602 can detect foreign object through the measurement points illustration in FIG. 5. In some embodiments, the power amplifier controller IC 602 is used to manage operation and calibration of a gallium nitride (GaN) power amplifier. In some embodiments, the power amplifier has an on-die or integrated thermistor. In some embodiments, the power amplifier has an integrated thermistor with the thermistor pins 604 connected to the power amplifier controller IC 602. In some embodiments, the on-die or integrated thermistor is used with the GaN power amplifier.

In some embodiments, the power amplifier controller IC 602 can synchronize the turn on of all the modules of the power amplifier, for example, the power amplifier bias circuits, and the power amplifier power supply network. In some embodiments, the power amplifier controller IC 602 can perform all of the required analog measurements. In some embodiments, the power amplifier controller IC 602 can adjust the output power and bias conditions of the power amplifier to maintain optimum efficiency and output power. In some embodiments, the power amplifier controller IC 602 can determine if the measurement results could damage the power amplifier and, if so, quickly shutdown the power amplifier. In some embodiments, the power amplifier controller IC 602 can synchronize the shut-down of various components of the power amplifier.

In some embodiments, the power amplifier controller IC 602 also stores all measurement information for subsequent access by Serial Peripheral Interface (SPI) 606. Software can then be used (with the stored measurement information) to implement more complex algorithms at the software running on the CPU module 608 to determine whether the device in close proximity or on top of the wireless power transmitter antenna is a valid receiver, or foreign object. Use of the stored measurement to perform the actions disclosed herein, such as synchronization; determination of whether the device in close proximity or on top of the wireless power transmitter antenna is a valid receiver, or foreign object, etc.; is referred to as subsequent analysis).

In some embodiments, the power amplifier controller IC 602 has configurable timing and measurement interfaces. Therefore, those configurable measurement points/interfaces and time settings make the impedance measurement process independent of the exact power amplifier implementation.

In some embodiments, the power amplifier controller IC 602 provides the impedance measurement to a transmitter controller IC as shown as 160 in FIGS. 1B, 1C, and 2A. In some embodiments, the transmitter controller IC determines if there is a foreign object within the transmission range of the wireless power transmitter, and adjust power level or shift where power is transmitted to avoid the detected foreign object when the foreign object is within the transmission range.

In some embodiments, the transmitter controller IC determines if there is a authorized receiver within the transmission range of the wireless power transmitter, and adjust power level or shift where power is transmitted to focus on the authorized receiver when a foreign object is not within the transmission range. In some embodiments, an authorized wireless power receiver is a receiver that has been authorized through a secure component such as an identification number to receive wireless power from a wireless power transmission system. In some embodiments, an authorized wireless power receiver is a receiver that has been configured to receive wireless power from a wireless power transmission system.

Figure 7:
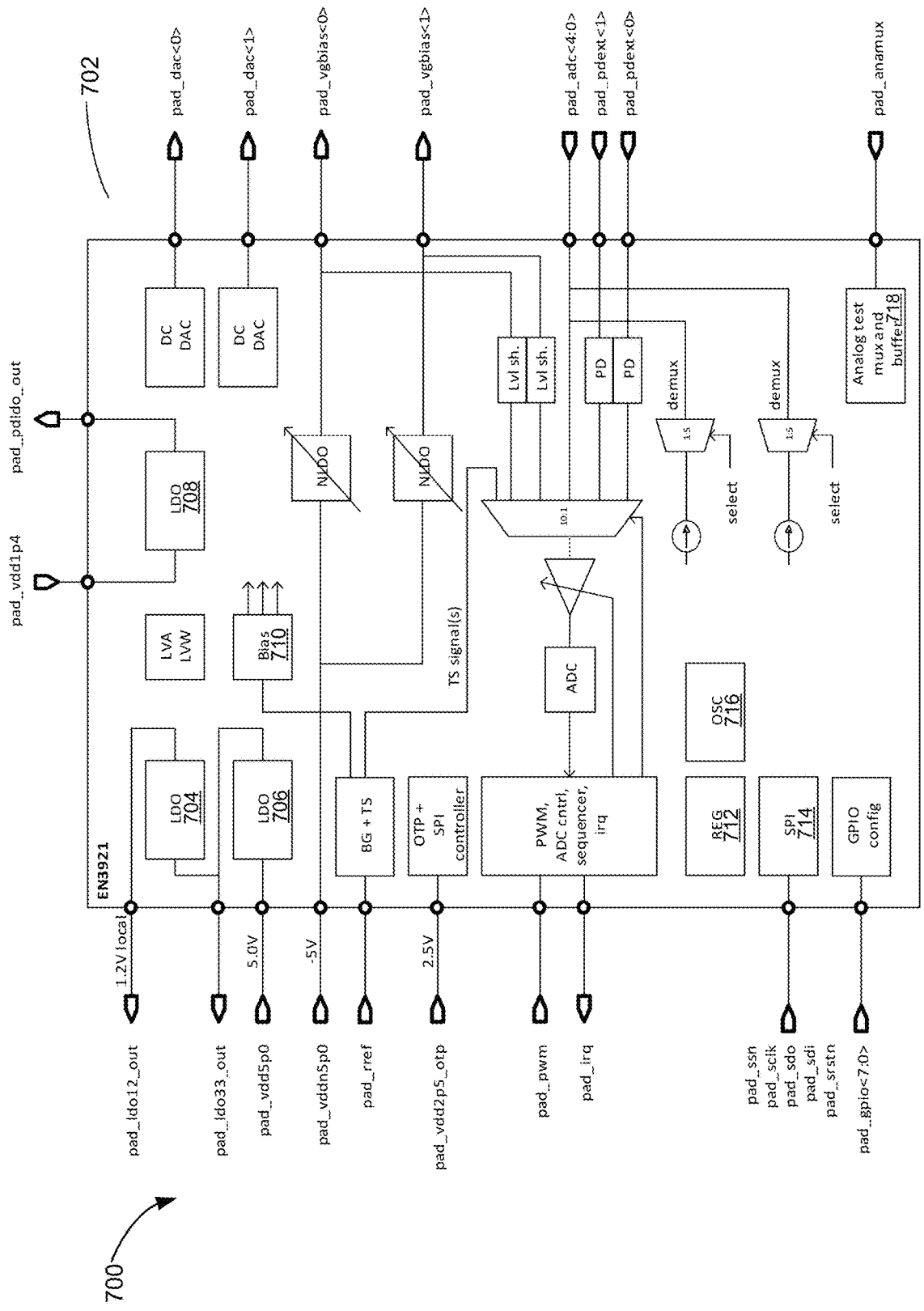
FIG. 7 shows a power amplifier engineering controller diagram, according to some embodiments.

FIG. 7 shows a power amplifier controller engineering diagram 700, according to some embodiments.

In some embodiments, some modules (also referred to as "various components") within the power amplifier engineering controller 702 (analogous to the PA IC 161A) are optional. In some embodiments, the LDO (Low Dropout) 704 can be eliminated or replaced by some other modules. In some embodiments, the LDO 706 can be eliminated or replaced by some other modules. In some embodiments, the LDO 708 can be eliminated or replaced by some other modules. In some embodiments, the Bias 710 can be eliminated or replaced by some other modules. In some embodiments, the REG (register) 712 can be eliminated or replaced by some other modules. In some embodiments, the SPI (serial peripheral interface) 714 can be eliminated or replaced by some other modules. In some embodiments, the OSC (oscillator) 716 can be eliminated or replaced by some other modules. In some embodiments, the Analog test mux and buffer 718 can be eliminated or replaced by some other modules. In some embodiments, the PAIC 161A includes flexible general-purpose input/output (GPIO) 620.

In some embodiments, the PAIC 161A includes a system status state machine with programmable alarm thresholds and/or an interruption request (IRQ) generator. In some embodiments, the PAIC's 161A includes multi-output negative bias control. In some embodiments, the PAIC's 161A includes at least one or more of: multi-channel ADCs and DACs, dual power detectors, and a temperature sensor. In some embodiments, one or more modules within the power amplifier controller 602 are optional. To perform impedance detection/sensing, the PAIC 161A utilizes the system status state machine with programmable alarm thresholds, the IRQ generator, the multi-channel ADC and DAC, dual power detectors, the temp sensor, the SPI high speed host interface, and the flexible GPIO. In some embodiments, the PAIC 161A can be split into two separate chipsets to control the power amplifier and perform impedance detection/sensing, respectively.

Figure 8:
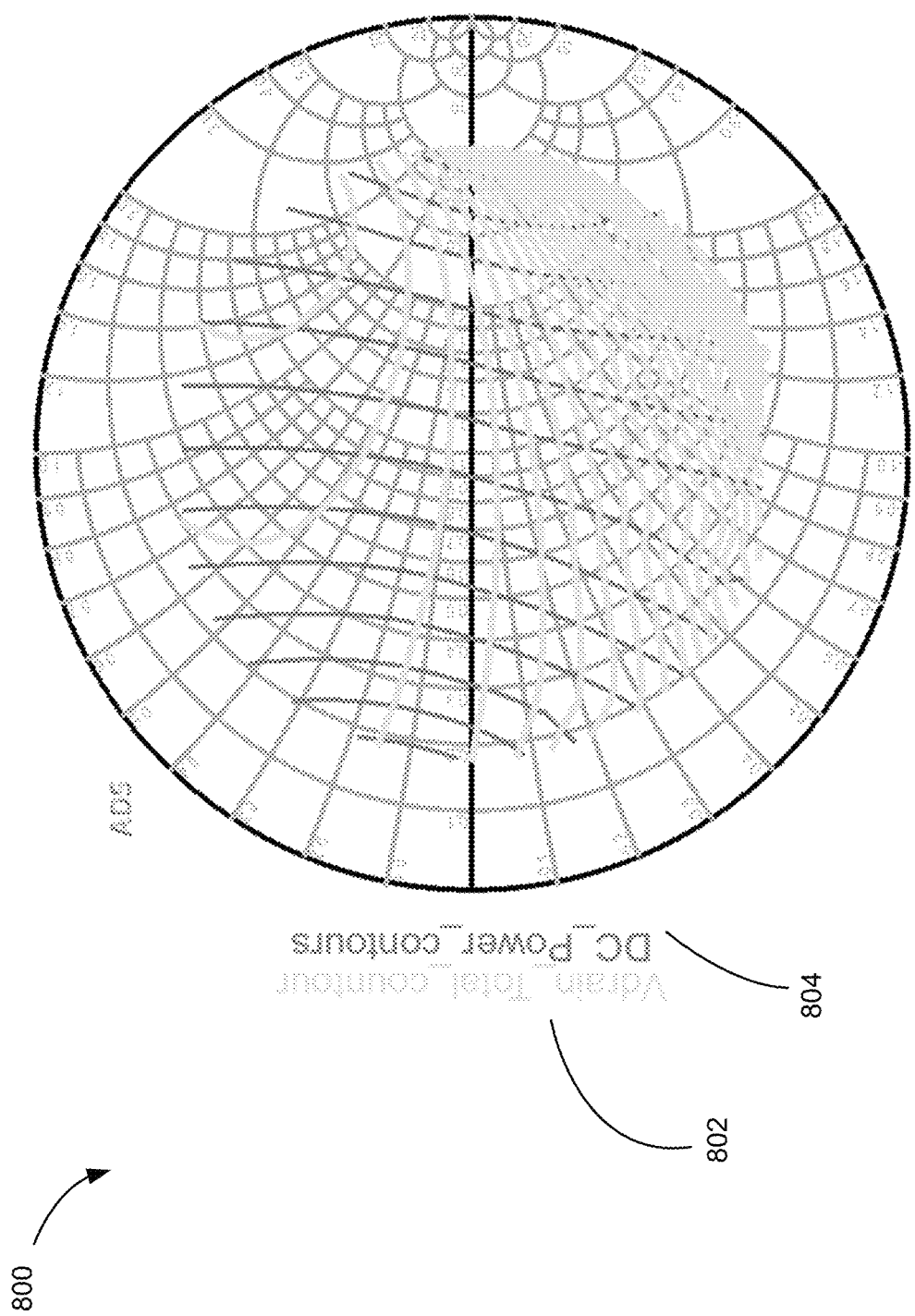
FIG. 8 shows a Smith chart representing all possible impedances measured from the various measurement points, in accordance with some embodiments.

FIG. 8 shows a Smith chart 800 representing all possible impedances measured from the various measurement points, in accordance with some embodiments. In some embodiments, the different measurement sets, such as the Total voltage at the drain of the power amplifier 802, and the DC power 804, allow the smith chart 800 representing all possible impedances under different scenarios. For example, the different scenarios include all possible objects, including foreign objects and valid wireless power receivers.

Figure 9:
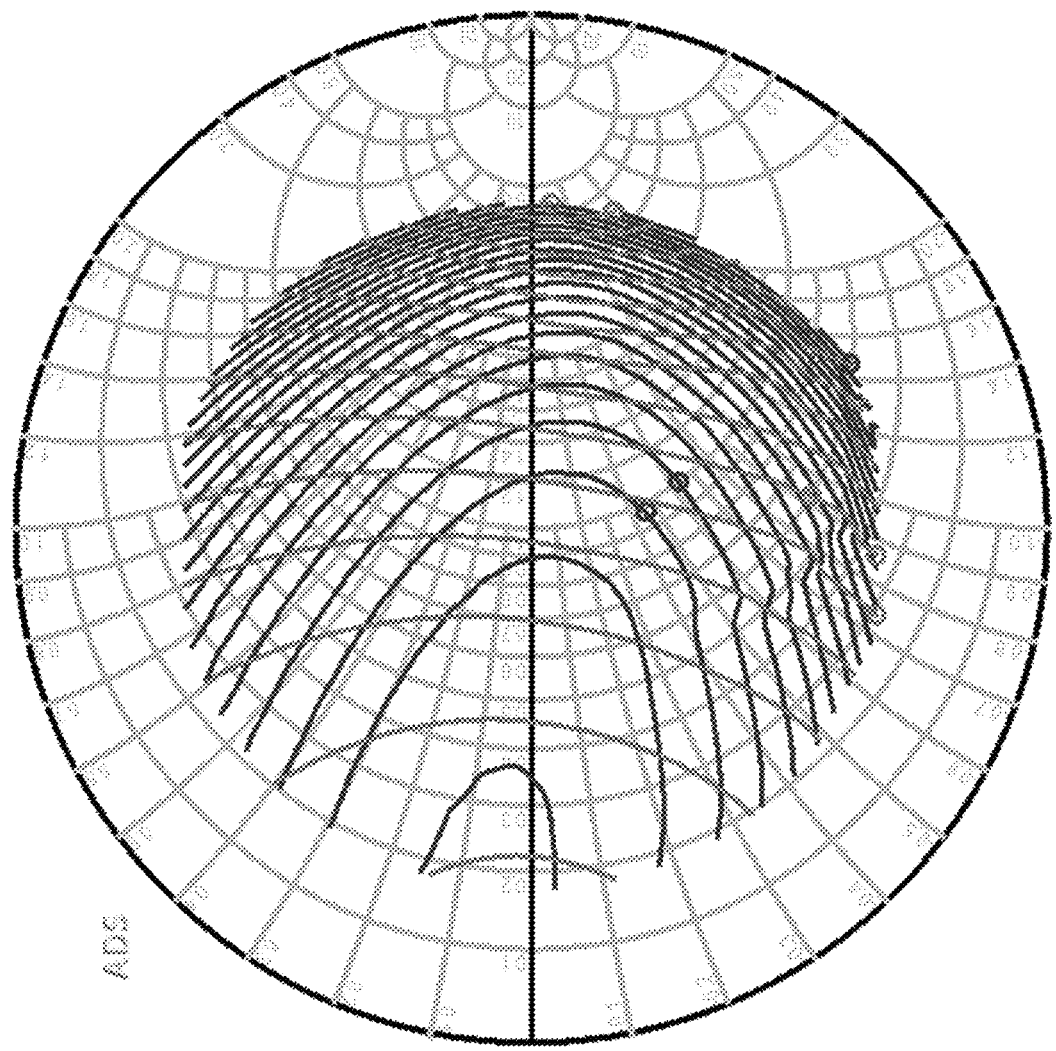
FIG. 9 shows a Smith chart representing all possible impedances measured from the various measurement points, in accordance with some embodiments.

FIG. 9 shows a Smith chart 900 representing all possible impedances measured from the various measurement points, in accordance with some embodiments. In some embodiments, the different measurement sets, such as the Output voltage of the power amplifier 902, and the Dissipated power 904, allow the smith chart 900 representing all possible impedances under different scenarios. For example, the different scenarios include all possible objects, including foreign objects and valid wireless power receivers.

In some embodiments, by detecting a combination of the metrics from the various measurements points as shown in FIG. 5 and FIG. 6, the impedance presented to the power amplifier can be detected. In some embodiments, when a condition to shut down the power amplifier is detected from the smith chart from the combination of the measurement metrics, the power amplifier can be shut down immediately to prevent damages to the transmitter and/or to the foreign object.

Various design aspects of the wireless power transmitting system including the foreign object detection system 500 or 600, such as the dimensions of the foreign object detection system, the dimension and configuration of the power amplifier controller 602 or 700, the dimension of the antenna ground plane, size, shape, spacing, and arrangement of the two or more antenna arms, impedance and operating frequency of the antenna arms, and the configuration between the antenna ground plane, and antenna arms, size and arrangement of the power amplifiers are selected (e.g., optimized using a cost or performance function) for transmitting desired wireless wave characteristics. Wireless wave transmitting characteristics that vary based on the above design aspects include, e.g., size, volume, materials, weight, cost, fabrication efficiency, radiation efficiency, impedance, and/or frequency range (for transmission and/or reception of electromagnetic waves and other wireless waves by the antenna).

In some embodiments, the wireless power transmission system can operate in the sub-Giga Hz frequency ranges for transmitting wireless transmission waves. In some embodiments, the wireless power transmission system mainly operate in the near field ranges for transmitting wireless transmission waves. In some embodiments, the wireless power transmission system can operate in the mid field and far field ranges for transmitting wireless transmission waves for a particular operating frequency or frequency range. In some embodiments, the wireless power transmission system can operate in the near field, mid field or far field ranges for transmitting wireless transmission waves for different frequency ranges. Depending on the frequencies of the transmitted wireless waves, generally, near field refers to the distance that is about less than one wavelength from the transmitting source, far field refers to the distance that is about equal or greater than two wavelengths from the transmitting source, and mid field refers to the distance that is between near field and far field.

Further embodiments also include various subsets of the above embodiments including embodiments in FIGS. 1A-1C, 2A-2B, and 5-9 combined or otherwise re-arranged in various embodiments.

Figure 10:
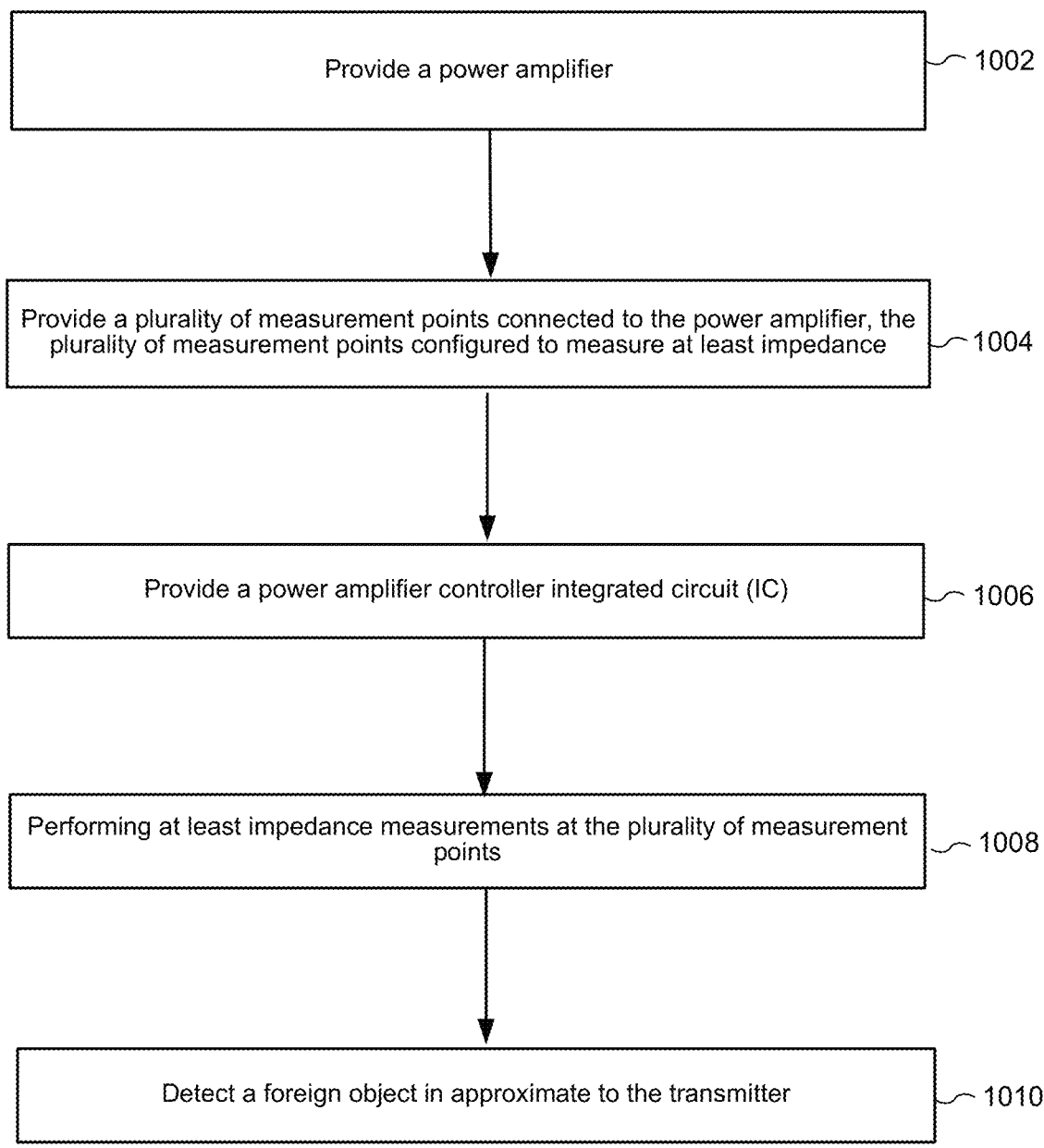
FIG. 10 is a flow diagram showing a method of detecting a foreign object using the measurements points connected to a power amplifier, in accordance with some embodiments.

FIG. 10 is a flow diagram 1000 showing a method of detecting a foreign object using the measurements points connected to a power amplifier, in accordance with some embodiments. Operations (e.g., steps) of the method 1000 may be performed by a wireless power transmitting system (e.g. RF charging pad 100, FIGS. 1A-1B, and 2A; charging pad 294, FIG. 1C; wireless power transmitter 500, FIG. 5) and/or by one or more components thereof (e.g. an impedance measurement system 600, FIG. 6; the power amplifier controller 702, FIG. 7). At least some of the operations shown in FIG. 10 correspond to instructions stored in a computer memory or computer-readable storage medium (e.g., memory 206 of the transmitter 100, FIG. 2A).

The method 1000 includes a step 1002 of providing a power amplifier (e.g., power amplifier 502, FIG. 5).

The method 1000 also includes a step 1004 of providing a plurality of measurement points connected to the power amplifier, the plurality of measurement points configured to measure at least impedance (e.g., see various measurement points in FIGS. 5-7). In some embodiments, measurement points include the voltage at the output of the amplifier 504, voltages at points inside the matching network 506 and 516, the voltage at the drain of the transistors 508. In some embodiments, the DC current and voltage consumed by each stage of the amplifier, such as the DC current measurement 510, voltage measurement 512, and the thermistors for temperature measurement at different stages of the amplifier, such as 514.

The method 1000 further includes a step 1006 of providing a power amplifier controller IC (e.g., power amplifier controller IC 602, FIG. 6; power amplifier controller 702, FIG. 7). In some embodiments, the power amplifier controller IC can synchronize the turn on of all the modules of the power amplifier, for example, the power amplifier bias circuits, and the power amplifier power supply network. In some embodiments, the power amplifier controller IC can perform all of the required analog measurements. In some embodiments, the power amplifier controller IC can adjust the output power and bias conditions of the power amplifier to maintain optimum efficiency and output power. In some embodiments, the power amplifier controller IC can synchronize the shut-down of various components of the power amplifier.

The method 1000 further includes a step 1008 of performing at least impedance measurements at the plurality of measurement points. In some embodiments, the measurements are performed by the power amplifier controller IC. In some embodiments, the measurements also including temperature measurements by thermistors integrated with a power amplifier.

The method 1000 further includes a step 1010 of detecting a foreign object in approximate to or within a transmission range of the transmitter. In some embodiments, the power amplifier controller IC can determine if the measurement results could damage the power amplifier and if so quickly shutdown the power amplifier. In some embodiments, the power amplifier controller IC determines if there is a foreign object or a valid receiver while the transmitter is charging.

Further embodiments also include various subsets of the above embodiments including embodiments in FIGS. 1-10 combined or otherwise re-arranged in various embodiments.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

Features of the present disclosure can be implemented in, using, or with the assistance of a computer program product, such as a storage medium (media) or computer readable storage medium (media) having instructions stored thereon/ in which can be used to program a processing system to perform any of the features presented herein. The storage medium (e.g., memory 206, 256) can include, but is not limited to, high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory optionally includes one or more storage devices remotely located from the CPU(s) (e.g., processor(s)). Memory, or alternatively the non-volatile memory device(s) within the memory, comprises a non-transitory computer readable storage medium.

Stored on any one of the machine readable medium (media), features of the present disclosure can be incorporated in software and/or firmware for controlling the hardware of a processing system (such as the components associated with the transmitters 100 and/or receivers 104), and for enabling a processing system to interact with other mechanisms utilizing the results of the present disclosure. Such software or firmware may include, but is not limited to, application code, device drivers, operating systems, and execution environments/containers.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A wireless-power-transmission system, comprising:
a power amplifier that includes at least one measurement point for measuring an impedance measurement at the measurement point, the power amplifier configured to amplify a wireless-power-transmission signal;
a power amplifier controller integrated circuit (IC) configured to:
receive the impedance measurement; and
upon determining, based on the impedance measurement, that damage to the power amplifier is likely to occur in conjunction with transmission of the wireless-power-transmission signal:
cause the power amplifier to shut down.

2. The wireless-power-transmission system of claim 1, wherein the power amplifier controller IC is further configured to:
upon determining, based on the impedance measurement, that damage to the power amplifier is not likely to occur in conjunction with transmission of the wireless-power-transmission signal:
instruct the power amplifier to amplify the wireless-power-transmission signal before the wireless-power-transmission signal is provided to an antenna for transmission.

3. The wireless-power-transmission system of claim 1, wherein causing the power amplifier to shut down includes synchronizing respective shut-down operations for each of a plurality of components of the power amplifier.

4. The wireless-power-transmission system of claim 3, wherein the plurality of components of the power amplifier includes one or more power amplifier bias circuits and a power amplifier power supply network.

5. The wireless-power-transmission system of claim 1, wherein determining, based on the impedance measurement, that damage to the power amplifier is likely to occur includes:
receiving the impedance measurement as one of a plurality of impedance measurements measured from a plurality of measurement points of the power amplifier; and
determining a combined performance metric based on each of the plurality of impedance measurements from the plurality of measurement points, wherein the combined performance metric is determined in part using data based on a Smith chart.

6. The wireless-power-transmission system of claim 1, wherein:
the power amplifier controller integrated circuit (IC) is further configured to:
receive an updated impedance measurement measured at the measurement point; and,
upon determining, based on the updated impedance measurement, that damage to the power amplifier is not likely to occur in conjunction with transmission of the wireless-power-transmission signal:
cause the power amplifier to amplify the wireless-power-transmission signal before the wireless-power-transmission signal is provided to an antenna for transmission.

7. The wireless-power-transmission system of claim 1, wherein the at least one measurement point includes one or more of:
voltage at an output of the power amplifier,
voltages at points inside a matching network,
voltage at a drain of transistors of the power amplifier,
a DC current and voltage consumed by each stage of the power amplifier, and
thermistors at different stages of the power amplifier.

8. The wireless-power-transmission system of claim 6, wherein:
when the impedance measurement was observed at the measurement point, a foreign object was present near the wireless-power-transmission system, and
when the updated impedance measurement was observed at the measurement point, the foreign object was not present near the wireless-power-transmission system.

9. The wireless-power-transmission system of claim 1, wherein the power amplifier is a GaN (Gallium Nitride) power amplifier.

10. The wireless-power-transmission system of claim 1, wherein the impedance measurement is measured at the measurement point while an antenna of the wireless-power-transmission system is transmitting another wireless-power-transmission signal to a wireless-power-receiving device.

11. The wireless-power-transmission system of claim 10, wherein the wireless-power-receiving device is configured to communicate with the wireless-power-transmission system without use of a handshaking protocol.

12. The wireless-power-transmission system of claim 1, wherein a directional coupler is not used to protect the power amplifier.

13. A non-transitory, computer-readable storage medium including instructions that, when executed by a wireless-power-transmission system, cause the wireless-power-transmission system to:
receive an impedance measurement from a power amplifier that includes at least one measurement point for measuring the impedance measurement at the measurement point, the power amplifier configured to amplify a wireless-power-transmission signal; and
upon determining, based on the impedance measurement, that damage to the power amplifier is likely to occur in conjunction with transmission of the wireless-power-transmission signal:
cause the power amplifier to shut down.

14. A wireless-power-transmission system, comprising:
a power amplifier controller integrated circuit (IC) configured to:
receive an impedance measurement from a power amplifier that includes at least one measurement point for measuring the impedance measurement at the measurement point, the power amplifier configured to amplify a wireless-power-transmission signal; and upon determining, based on the impedance measurement, that damage to the power amplifier is likely to occur in conjunction with transmission of the wireless-power-transmission signal:

cause the power amplifier to shut down.

15. The non-transitory computer readable storage medium of claim 13, wherein the instructions the cause the power amplifier to shut down include instructions that, when executed by the wireless-power-transmission system, cause the wireless-power-transmission system to synchronize respective shut-down operations for each of a plurality of components of the power amplifier.

16. The non-transitory computer readable storage medium of claim 13, wherein the instructions for determining that damage to the power amplifier is likely to occur include instructions that, when executed by the wireless-power-transmission system, cause the wireless-power-transmission system to:

receive the impedance measurement as one of a plurality of impedance measurements measured from a plurality of measurement points of the power amplifier; and determine a combined performance metric based on each of the plurality of impedance measurements from the plurality of measurement points, wherein the combined performance metric is determined in part using data based on a Smith chart.

17. The non-transitory computer readable storage medium of claim 13, wherein the power amplifier is a GaN (Gallium Nitride) power amplifier.

18. The non-transitory computer readable storage medium of claim 13, further including instructions that, cause the wireless-power-transmission system to measure the impedance measurement at the measurement point while an antenna of the wireless-power-transmission system is configured to be transmitting another wireless-power-transmission signal to a wireless-power-receiving device.

19. The non-transitory computer readable storage medium of claim 18, wherein the instructions are further configured to cause the wireless-power-receiving device to communicate with the wireless-power-transmission system without use of a handshaking protocol.

20. The non-transitory computer readable storage medium of claim 13, wherein a directional coupler is not used to protect the power amplifier.

21. The wireless-power-transmission system of claim 14, wherein the power amplifier controller IC is configured to shut down the power amplifier by synchronizing respective shut-down operations for each of a plurality of components of the power amplifier.

22. The wireless-power-transmission system of claim 14, wherein the power amplified controller IC is configured to determine that damage to the power amplifier is likely to occur in conjunction:

receiving the impedance measurement as one of a plurality of impedance measurements measured from a plurality of measurement points of the power amplifier; and determining a combined performance metric based on each of the plurality of impedance measurements from the plurality of measurement points, wherein the combined performance metric is determined in part using data based on a Smith chart.

23. The wireless-power-transmission system of claim 14, wherein the power amplifier is a GaN (Gallium Nitride) power amplifier.

24. The wireless-power-transmission system of claim 14, wherein the power amplifier controller IC is configured to cause the impedance measurement to be measured at the measurement point while an antenna of the wireless-power-transmission system is configured to be transmitting another wireless-power-transmission signal to a wireless-power-receiving device.

25. The wireless-power-transmission system of claim 24, wherein the wireless-power-receiving device is configured to communicate with the wireless-power-transmission system without use of a handshaking protocol.

26. The wireless-power-transmission system of claim 14, wherein a directional coupler is not used to protect the power amplifier.

* * * * *